(12) United States Patent
Gorbachov

(10) Patent No.: US 8,135,355 B2
(45) Date of Patent: *Mar. 13, 2012

(54) RADIO FREQUENCY TRANSCEIVER FRONT END CIRCUIT WITH PARALLEL RESONANT CIRCUIT

(75) Inventor: Oleksandr Gorbachov, Kiev (UA)

(73) Assignee: Rfaxis, Inc., Irvine, CA (US)

( * ) Notice: Subject to any disclaimer, the term of this patent is extended or adjusted under 35 U.S.C. 154(b) by 463 days.

This patent is subject to a terminal disclaimer.

(21) Appl. No.: 12/412,741

(22) Filed: Mar. 27, 2009

(65) Prior Publication Data

US 2010/0203846 A1 Aug. 12, 2010

Related U.S. Application Data

(63) Continuation of application No. 12/412,226, filed on Mar. 26, 2009.

(60) Provisional application No. 61/150,419, filed on Feb. 6, 2009.

(51) Int. Cl.
*H04B 1/38* (2006.01)

(52) U.S. Cl. ............................... 455/73; 455/78; 455/83

(58) Field of Classification Search .................. 455/73, 455/78, 83, 84, 552.1, 553.1
See application file for complete search history.

(56) References Cited

U.S. PATENT DOCUMENTS

| | | | |
|---|---|---|---|
| 5,962,880 A | 10/1999 | Oda et al. | |
| 6,043,714 A * | 3/2000 | Yamamoto et al. | 330/296 |
| 6,108,313 A | 8/2000 | Lee et al. | |
| 6,308,047 B1 | 10/2001 | Yamamoto et al. | |
| 6,498,535 B1 | 12/2002 | Allen et al. | |
| 6,529,080 B1 | 3/2003 | Seymour et al. | |
| 6,556,075 B1 | 4/2003 | Jordan | |
| 6,735,418 B1 | 5/2004 | MacNally et al. | |
| 6,771,475 B2 | 8/2004 | Leete | |
| 6,977,552 B2 * | 12/2005 | Macedo | 330/283 |
| 6,998,709 B2 | 2/2006 | Khorram | |
| 7,120,427 B1 | 10/2006 | Adams et al. | |
| 7,315,730 B2 | 1/2008 | Galan | |
| 2003/0228848 A1 | 12/2003 | Escoffier et al. | |
| 2004/0251960 A1 | 12/2004 | Macedo | |
| 2006/0035601 A1 | 2/2006 | Seo | |

(Continued)

FOREIGN PATENT DOCUMENTS

WO 2008/002697 3/2008

OTHER PUBLICATIONS

International Search Report PCT/US2009/038621; Jul. 20, 2009.

(Continued)

*Primary Examiner* — Tuan H Nguyen
(74) *Attorney, Agent, or Firm* — Stetina Brunda Garred & Brucker

(57) ABSTRACT

A front end circuit for coupling an antenna to a radio frequency (RF) transceiver for time domain duplex systems is disclosed. The front end circuit includes an antenna port, a power amplifier, a low noise amplifier, and a matching network. The output of the power amplifier and the input of the low noise amplifier are coupled to the matching network and connected in common to the antenna. The power amplifier and the low noise amplifier are activated and deactivated in sequence corresponding to the transmit and receive modes of the transceiver, and the matching network minimizes the effect that one has on the other at the designated operating frequency.

27 Claims, 29 Drawing Sheets

U.S. PATENT DOCUMENTS

| | | | |
|---|---|---|---|
| 2006/0068837 A1 | 3/2006 | Malone |
| 2006/0270367 A1 | 11/2006 | Burgener et al. |
| 2006/0290421 A1 | 12/2006 | Ichitsubo et al. |
| 2007/0194859 A1 | 8/2007 | Brobston et al. |
| 2007/0232241 A1 | 10/2007 | Carley et al. |
| 2008/0089252 A1 | 4/2008 | Choi |
| 2008/0182526 A1 | 7/2008 | Moloudi et al. |
| 2008/0279262 A1 | 11/2008 | Shanjani |
| 2009/0036065 A1 | 2/2009 | Siu |

OTHER PUBLICATIONS

International Search Report PCT/US2009/041834; Jun. 17, 2009.
WLAN WiMAX PA & FEM Market, Feb. 12, 2009; 158 page presentation.
Cirronet ZigBee High Power Module ZMN2405HP; Oct. 28, 2007; 6 pages.
Cirronet ZigBee High Power Module ZMN2430HP; Oct. 28, 2007; 6 pages.
Cirronet ZigBee Matching RF power performance to ZigBee apps—Electronic Products; 4 pages; http://www2.electronicproducts.com/PrintArticle.aspx?ArticleURL=cirronet.feb2006.html.
Design of a Dual Band Wireless LAN SiGe-Bipolar Power Amplifier; from Sep. 2004 High Frequency Electronics; 8 pages.
EPCOS WLAN Modules Preliminary Datasheet R041_M01; Jun. 20, 2006; 14 pages.
EMBER Datasheet; EM2420 2.4 GHz IEEE 802.15.4 / ZigBee RF Transceiver; Copyright 2003, 2004 by Ember Corporation; 89 pages.
Free2Move Class 1 Bluetooth Module—F2M03C1 Datasheet; Rev. 13 Sep. 2005; 46 pages.
Freescale Semiconductor Technical Data Document No. MC13191/D; Rev. 1.2 Apr. 2005; MC13191: 2.4 GHz ISM Band Low Power Transceiver; 24 pages.
Freescale Semiconductor Technical Data Document No. MC13192; Rev. 3.2 May 2007; MC13192: 2.4 GHz Low Power Transceiver for the IEEE 802.15.4 Standard; 24 pages.
Freescale Semiconductor; MC13191: 2.4 GHz Low Power Transceiver for the IEEE 802.15.4 Standard; Reference Manual; Document No. MC13191RM; Rev. 1.2; Apr. 2005; 92 pages.
Freescale Semiconductor Technical Data; Document No. MC13192; Rev. 2.8, Apr. 2005; MC13192/MC13193: 2.4 GHz Low Power Transceiver for the IEEE 802.15.4 Standard; 23 pages.
Freescale Semiconductor MC13192/MC13193: 2.4 GHz Low Power Transceiver for the IEEE 802.15.4 Standard; Reference Manual; Rev. 1.3 Apr. 2005; 111 pages.
California Eastern Laboratories: FreeStar ZFSM-100 Series ZigBee-Ready Modules; May 2008; 1 page.
California Eastern Laboratories; Apex ZAXM-201 Series ZigBee Pro-Ready Modules; CL596C.5.08; 1 page.
California Eastern Laboratories; Apex LT ZALM-301 Series ZigBee Pro-Ready Modules; CL596.LT.5.08; 1 page.
California Eastern Laboratories; ZIC2410 Datasheet; Rev. A; Document No. 0005-05-07-00-000; 119 pages.
CEL Preliminary Data Sheet; APEX & APEX LT Series Transceiver Modules; ZAXM-201-1, ZALM-301-1; May 7, 2008; 17 pages.
CEL Preliminary Data Sheet; Freestar Series Transceiver Module; ZFSM-101-1; May 7, 2008; 10 pages.
CEL Preliminary Data Sheet; Matrix Transceiver Modules; ZMXM-400 Series; May 7, 2008; 12.
J. Trachewsky, et al.; Broadcom WLAN Chipset for 802.11a/b/g; Broadcom Corporation, CA, USA; Aug. 17, 2003; 42 pages.
Anadigics; AWL6254; 1.4 GHz 802.11b/g/n; WLAN PA, LNA, and RF Switch Data Sheet—Rev 2.0; Feb. 2008; 16 pages.
Anadigics; AWM6430; 3.3-3.6 GHz Power Amplifier Module; Preliminary Data Sheet; Rev 1.0; Jan. 2006; 12 pages.
Hickman, Robert; Anadigics; A New Technology for WLAN Power Amplifiers; Warren NJ; 28 pages.
Zhang, Weimin; A Low Voltage Fully-Integrated 0.18um CMOS Power Amplifier for 5GHz WLAN; Institute of Microelectronics, Singapore; 2002; 4 pages.
Copeland, Miles A.; 5-GHz SiGe HBT Monolithic Radio Transceiver with Tunable Filtering; IEEE Transactions on Microwave Theory and Techniques, vol. 48 No. 2, Feb. 1000, 12 pages.
Atheros AR3011—ROCm Solutions for Bluetooth; Radio-On-Chip for Mobile (ROCm) Products; Jan. 22, 2008; 2 pages.
Atheros AR3000—ROCm Solutions for Bluetooth Radio-On-Chip for Mobile (ROCm) Products; Jan. 22, 2008; AR3031; 2 pages.
Atheros ROCm Platform; Radio-On-Chip for Mobile (ROCm; AR6001GL; Embedded 802.11b/g Solution for Mobile and Battery-Operated Devices; 2006; 2 pages.
AR6002 Breaking the Power Barrier in Mobile WiFi; Aug. 28, 2008; 2 pages.
AR6001GL; Embedded 802.11b/g Solution for Mobile and Battery-Operated Devices; 2006; 2 pages.
AR6001XL; Embedded 802.11a/b/g Solution for Mobile and Battery-Operated Devices; 2006; 2 pages.
AR6101G; World's Most Integrated, Cost-Effective Single-Chip WLAN Handset Design Brings Voice-Over-WiFi to the Mainstream; 2006; 2 pages.
AR9285 Single-chip PCIe based on 802.11n 1-stream specification; Oct. 28, 2008; 2 pages.
AR9002AP-1S; AP/Router solution based on 802.11n 1-stream specification; Oct. 28, 2008; 2 pages.
Fully-Integrated RF Transceiver System-on-Chip for ZigBee/IEEE 802.15.4 Applications Announced; California Eastern Laboratories, 2 pages.
Bluetooth RF Module RB06 Series for QUALCOMM Based Handsets, Kyocera, 4 pages.
How MLO Works the Power of Passive Components; JMD RF Made Simple: Jacket Micro Devices: Modules; copyright 2006 Jacket Micro Devices, Inc., 2 pages.
SiGe PA Enables Smallest System Footprint for Embedded WLAN; Semiconductor Online; Dec. 15, 2008; 3 pages.
WLAN & WiMAX from Sirenza: Sirenza Microdevices SZA Series Linear PAs for WiFi / WiBRO / WiMAX; 14 pages.
Skyworks: SKY65336: 2.4 GHz Transmit/Receive Front-End Module with Integrated LNA; Skyworks Solutions, Inc.; Aug. 20, 2008; 2 pages.
Skyworks; SKY65337: 2.4 GHz Transmit/Receive Front-End Module; Skyworks Solutions, Inc.; Aug. 20, 2008; 2 pages.
Skyworks; SKY65241-12: WLAN 802.11a, b, g, n Dual-Band Intera Front-End Module Single Antenna; Skyworks Solutions, Inc.; Mar. 12, 2008; 9 pages.
Skyworks; SKY65243-11: WLAN 802.11a, b, g, n Dual-Band Intera Front-End Module Dual Antennas; Skyworks Solutions, Inc.; Mar. 12, 2008; 8 pages.
Skyworks; SKY65256-11: WLAN 802.11a, b, g, n Dual-Band Front-End Module Single Antenna; Skyworks Solutions, Inc.; Sep. 28, 2007; 10 pages.
Skyworks; SKY65228-11: WLAN 802.11n Single Band 4.9-5.85 GHz MIMO Intera Front-End Module; Skyworks Solutions, Inc.; Oct. 9, 2007; 9 pages.
Skyworks; SKY65206-13: WLAN 802.11b/g Intera Front-End Module; Skyworks Solutions, Inc.; Aug. 21, 2007; 7 pages.
Skyworks; SKY65249-11: WLAN 802.11b, g, n Intera Front-End Module; Skyworks Solutions, Inc.; Nov. 30, 2007; 9 pages.
Skyworks; SKY65227-11: WLAN 802.11n Single Band Intera 2.4 GHz MIMO Intera Front-End Module; Skyworks Solutions, Inc.; Oct. 9, 2007; 9 pages.
Skyworks; SKY65230-11: WLAN 802.11 n 2 x 2 MIMO Intera Front-End Module with 3 Antenna Ports; Skyworks Solutions, Inc.; Oct. 9, 2007; 13 pages.
Skyworks; SKY65225-11: WLAN 802.11n 2 x 2 MIMO Intera Front-End Module; Skyworks Solutions, Inc.; May 7, 2007; 11 pages.
Skyworks; SKY65135: WLAN Power Amplifier; Skyworks Solutions, Inc.; Mar. 26, 2007; 13 pages.
Skyworks; SKY65209: WLAN 802.11b/g Front-End Module ; Skyworks Solutions, Inc.; Jan. 18, 2006; 8 pages.
4.9-5.8 GHz High-Linearity Power Amplifier SST11LP11; SST Communications Corp; 2005, 14 pages.
4.9-5.8 GHz High-Linearity Power Amplifier SST11LP12; SST Communications Corp; 2005, 14 pages.

2.4 GHz Power Amplifier SST12LP00; SST Communications Corp; 2005, 9 pages.
2.4 GHz High-Linearity Power Amplifier SST12LP10; SST Communications Corp; 2005, 12 pages.
2.4 GHz Power Amplifier SST12LP14; SST Communications Corp; 2005, 12 pages.
2.4 GHz High-Power, High-Gain Amplifier SST12LP15; SST Communications Corp; 2005, 12 pages.
2.4 GHz High-Power, High-Gain Amplifier SST12LP15A; SST Communications Corp; 2005, 12 pages.
STLC2500C: Bluetooth EDR Single Chip Data Brief; STMicroelectronics; Jan. 2006, 4 pages.
STLC4550: Single Chip 802.11b/g WLAN radio Data Brief; STMicroelectronics; Feb. 2006, 5 pages.
ZigBee—compliant wireless control and sensoring network solutions; STMicroelectronics; Jun. 2006; 8 pages.
Amin, Yasar, et al; Integration of Passives for Receiver Front-End for 5GHz Wireless LAN Applications; Royal Institute of Technology, Sweden & U of Engineering & Tech, Taxila, Pakistan; p. 24-29.
Texas Instruments: CC2591; 2.4-GHz RF Front End, data sheet, Jun. 2008, Texas Instruments, Inc. 18 pages.
Texas Instruments: CC2436; High-Power Dual-Band (2.4-GHz and 4.9-GHz to 5.9-GHz) RF Front End, data sheet, May 2007; Texas Instruments, Inc. 15 pages.
Hoppenstein, Russell; High-Performance WiMAX RF Chipset Enable CPE and BTS Applications; Texas Instruments Inc.
Texas Instruments: Technology for Innovators: WiLink 4.0 single-chip mobile WLAN solutons Product Bulletin; 2006 Texas Instruments Inc., 2 pages.
Chipcon Products from Texas Instruments: CC2420; 2.4 GHz IEEE 802.15.4/ ZigBee-ready RF Transceiver; 2008, Texas Instruments Inc., 89 pages.
Chipcon Products from Texas Instruments: CC2430; A True System-on-Chip solution for 2.4 GHz IEEE 802.15.4 / ZigBee; 2007, Texas Instruments Inc., 212 pages.
Texas Instruments: CC2520 Datasheet; 2.4 GHz IEEE 802.15.4/ SIZBEE RF Transceiver; Dec. 2007; Texas Instruments Inc.; 2007; 128 pages.
Zheng, Shaoyong, et al.; Distributed Power Amplifier/Feedback Low Noise Amplifier Switch-Less Front-End; Dept. Electronic Engineering, City University of Hong Kong, Feb. 8, 2006, p. 1659-1662.
Masse, Cecile; Analog/RF Front End; A direct-conversion transmitter for WiMAX and WiBro applications; www.rfdesign.com ; Jan. 2006, 3 pages.
XBEE OEM RF Modules; ZigBee / 802.15.4 OEM RF Modules by MaxStream, Inc. Specifications; MaxStream, Inc., 2005, 2 pages.
Fanucci, L, et al.; A Novel Fully Integrated Antenna Switch for Wireless Systems; Pisa, Italy, 4 pages.
RFMD: Mobile Computing: Front End Module Portfolio; rfmd.com; 2009, 2 pages.
MAXIM: Application Note 686; QPSK Modulation Demystified; May 1, 2002, 7 pages.
An Introduction to Orthogonal Frequency Division Multiplex Technology; Keithley, 17 pages.
ATMEL: Bluetooth Front-end IC T7024 Design Guide; Jun. 2004; 18 pages.
ATMEL: Integrated SiGe Front-end RF ICs;2003, 2 pages.
ATMEL: 5-GHz WLAN Power Amplifier for 802.11a, ATR3515 Preliminary; 2004, 7 pages.
ATMEL: High Gain Power Amplifier for 802.11b/g WLAN Systems, ATR7032 Preliminary; 2006, 15 pages.
ATMEL: ZigBee IEEE 802.15.4 Radio Transceiver; AT86RF230, Preliminary; 2007, 82 pages.
ANADIGICS: AWM6430; 3.5 GHz WiMAX Power Amplifier Module, Advanced Product Information—Rev. 0.1; Jan. 2005; 12 pages.
Broadcom; BCM4328 Product Brief; Air Force One Single-Chip IEEE 802.11a/b/g Mac/Baseband/Radio With Integrated CPU; Dec. 5, 2006; 2 pages.
Broadcom; BCM4326 Product Brief; Air Force One Single-Chip IEEE 802.11b/g Mac/Baseband/Radio With Integrated CPU; Dec. 5, 2006; 2 pages.
Broadcom: BCM94318 Product Brief: Airforce One Chip 802.11 Reference Design; Oct. 7, 2004; 2 pages.

Xin He, Fully Integrated Transceiver Design in SOI Processes, a Dissertation, Kansas State University, 2004, 129 pages.
Schlegel, Gunther, Sr.; Improving Sensitivity of RF-Based AMI Front-End Systems; 16 pages.
Maxim: Industry's First Ultra-Low-Power, 802.11g/b RF Transceiver to Integrate PA, Rx/Tx/Antenna Diversity Switches, and Crystal Oscillator Circuitry; Apr. 30, 2008; 2 pages.
Maxim: MAX2830 Industry's First802.11G/B RF Transceiver with Integrated PA, Rx/Tx and Antenna Switches; Apr. 30, 2008; 3 pages.
Meshnetics: ZigBit Amp OEM Modules; ZDM-A1281-PN/PNO (MNZG-A24-UFL/UO) Revision 2.2; Ultra-Compact 2.4GHz 8021 5.4/ZigBee Modules with Power Amplifier for Wireless Networking Applications; Oct. 2008, 18 pages.
Meshnetics M2M-100-2008: ZigBit Amp Module; 2.4 GHz Amplified Modules for IEEE 802.15.4/ZigBee Wireless Mesh Networking Applications; 2 pages.
Meshnetics: ZigBit Amp OEM Modules ZDM-A1281-PN/PNO Revision 2.1; Ultra-Compact 2.4GHz 802.15.4/ZigBee Modules with Power Amplifier for Wireless Networking Applications; Dec. 2007, 15 pages.
Murata MF2400PJ-SF0702; PA MMIC for 2.4GHz Wireless Communication; Jan. 18, 2003; 11 pages.
CEL California Eastern Laboratories: Class 1 Power Amplifiers for Bluetooth; 1 page.
CEL; GaAs Integrated Circuit PG2250T5N; 1.8 V, Power Amplifier for Bluetooth Class 1; NEC Electronics Corp.; 2006, 12 pages.
CEL NEC's Power Amplifier for Bluetooth Class 1: UPG2301TQ Data Sheet; Feb. 4, 2004; 7 pages.
CEL: GaAs HBT Integrated Circuit PG2314T5N: Power Amplifier for Bluetooth Class 1; Jul. 2006, 10 pages.
CEL Application Note: AN1048 UPG2150T5L Switch; Sep. 29, 2005, 1 page.
CEL California Eastern Laboratories: AN1049 UPG2314T5N HBT PA IC for Bluetooth and ZigBee; Oct. 17, 2006; 5 pages.
RT2501 Wireless Chipset 802.11 b/g solution featuring Packet-Overdirve Technology; Ralink Technology Corp; 2006, 1 page.
RT2501U; USB2.0 Wireless Chipset 802.11 b/g solution featuring Packet-Overdirve Technology; Ralink Technology Corp., 2006, 1 page.
RT2600 MIMO XR Wirless Chipset 802.11b/g solution featuring Packet-Overdrive and Range-Overdirve Technologies; Ralink Technology Corp; 2006, 1 page.
RT2700 MIMO Wireless Chipset Family; 802.11n Solution featuring MIMObility Technology; Ralink Technology Corp; 2006, 2 pages.
RT2800 MIMO Wireless Chipset Family 802.11n Solution featuring MIMObility Technology; Ralink Technology Corp; 2006, 2 pages.
RT5201 Wireless Chipset 802.11 a/b/g solution featuring Packet-Overdirve Technology; Ralink Technology Corp; 2006, 1 page.
RT5201U USB 2.0 Wireless Chipset 802.11 a/b/g solution featuring Packet-Overdirve Technology; Ralink Technology Corp; 2006, 1 page.
RT5600 MIMO XR Wireless Chipset 802.11 a/b/g solution featuring Packet-Overdirve and Range-Overdirve Technologies; Ralink Technology Corp; 2006, 1 page.
Agnelli, Federico, et al; Wireless Multi-Standard Terminals: System Analysis and Design of a Reconfigurable RF Front-end; IEEE Circuits and Systems Magazine; First Quarter 2006; p. 38-59.
Cutler, Tim; ZigBee: RF power options in ZigBee solutions; Emerging Wireless Technology/A Supplement to RF Design; www.rfdesign.com; Mar. 2006; p. 18-21.
RFMD Preliminary: RF5263: 3.3V to 5.0V, 2.5GHz Linear Power Amplifier; pp. 7-31 to 7-32.
RFMD: RF5300: 3V, 5GHz Linear Power Amplifier pp. 2-655 to 2-660.
RFMD: RF5163: 3V-5V, 2.5 GHZ Linear Power Amplifier; pp. 2-627 to 2-638.
RFMD SiW1722B: Bluetooth Transceiver Solution for CDMA and WCDMA Mobile Phones; rfmd.com; 10-06; 2 pages.
RFMD RF5924 3.7V, Single-Band Front-End Module pp. 8-1 to 8-2.
RFMD RF5122 3V to 4.5V, 2.4GHz to 2.5GHz Linear Power Amplifier; 12 pages.
Richwave RTC6682 VO.3 Data Sheet Aug. 2006; www.richwave.com.tw; 7 pages.

* cited by examiner

RADIO FREQUENCY TRANSCEIVER FRONT END CIRCUIT WITH PARALLEL RESONANT CIRCUIT

CROSS-REFERENCE TO RELATED APPLICATIONS

This application is a continuation of U.S. application Ser. No. 12/412,226 filed Mar. 26, 2009, which relates to and claims the benefit of U.S. Provisional Application No. 61/150,419 filed Feb. 6, 2009 and entitled SINGLE-BAND TRANSMIT-RECEIVE FRONT-END INTEGRATED CIRCUITS FOR TIME-DOMAIN DUPLEX APPLICATIONS, which are wholly incorporated by reference herein.

STATEMENT RE: FEDERALLY SPONSORED RESEARCH/DEVELOPMENT

Not Applicable

BACKGROUND

1. Technical Field

The present invention relates generally to radio frequency (RF) signal circuitry, and more particularly, to single band transmit-receive front-end integrated circuits for time domain duplex communications.

2. Related Art

Wireless communications systems find application in numerous contexts involving information transfer over long and short distances alike, and there exists a wide range of modalities suited to meet the particular needs of each. These systems include cellular telephones and two-way radios for distant voice communications, as well as shorter-range data networks for computer systems, among many others. Generally, wireless communications involve a radio frequency (RF) carrier signal that is variously modulated to represent data, and the modulation, transmission, receipt, and demodulation of the signal conform to a set of standards for coordination of the same. For wireless data networks, such standards include Wireless LAN (IEEE 802.11x), Bluetooth (IEEE 802.15.1), and ZigBee (IEEE 802.15.4), which are understood to be time domain duplex systems where a bi-directional link is emulated on a time-divided single communications channel.

A fundamental component of any wireless communications system is the transceiver, that is, the combined transmitter and receiver circuitry. The transceiver, with its digital baseband subsystem, encodes the digital data to a baseband signal and modulates the baseband signal with an RF carrier signal. The modulation utilized for WLAN, Bluetooth and ZigBee include orthogonal frequency division multiplexing (OFDM), quadrature phase shift keying (QPSK), and quadrature amplitude modulation (16 QAM, 64 QAM). Upon receipt, the transceiver down-converts the RF signal, demodulates the baseband signal, and decodes the digital data represented by the baseband signal. An antenna connected to the transceiver converts the electrical signal to electromagnetic waves, and vice versa. Depending upon its particular configuration, the transceiver may include a dedicated transmit (TX) line and a dedicated receive (RX) line, or the transceiver may have a combined transmit/receive line. The transmit line and the receive line are tied to a single antenna, particularly for low-cost and/or small-size applications.

RF circuitry such as the transceiver is produced as integrated circuits, typically with complementary metal-oxide semiconductor (CMOS) technology, due in part to the successes in miniaturization and cost reduction efforts. Small geometry CMOS devices have reduced current draw and require lower battery voltages, thus being suitable for portable applications that have substantial power consumption limitations. Wireless communication links must be reliable and have high data throughput over wide distances, necessitating higher power levels at the antenna stage. For instance, the aforementioned Wireless LAN and Bluetooth typically require power levels of up to and above 20 dBm.

Higher power output, in turn, requires higher current and voltage levels in the RF circuitry. Many CMOS devices are currently produced with a 0.18-micron process, with advanced systems utilizing 130 nm, 90 nm, 65 nm, and 45 nm processes. The resulting integrated circuits have operating voltages in the range of 1.8 v to lower than 1.2 v because of the reduced break down voltages of the semiconductor devices therein. Although current draw is typically not an issue because of the existence of simple solutions involving multiple active devices connected in parallel, +20 dBm power levels at 1.8 v have been difficult to achieve, particularly for signals having envelope variations, as is the case with OFDM, QPSK, QAM, and the like. Increasing current draw introduces several new issues including decreased efficiency because of a greater proportion of power being lost as heat, and decreased battery life. Furthermore, the impedance is lowered for the same power level with increased current. Considering that most RF circuits have a 50-Ohm impedance, the design of matching circuits for decreased impedance also becomes an issue, typically due to increased power losses.

Conventional transceivers for WLAN, Bluetooth, ZigBee, and the like typically do not generate sufficient power or have sufficient sensitivity necessary for reliable communications. Current integrated circuit transceiver devices have transmit power levels of below 0 dBm, though there are some devices that have power levels of about 10 dBm, which is still significantly less than the desired 20 dBm noted above. Accordingly, additional conditioning of the RF signal is necessary.

The circuitry between the transceiver and the antenna is also referred to as the front-end module, which includes a power amplifier for increased transmission power, and/or a low noise amplifier for increased reception sensitivity. Various filter circuits such as band pass filters may also be included to provide a clean transmission signal at the antenna, and/or to protect the reception circuitry from external blocking signals reaching the antenna. In order to rapidly switch between receive and transmit functions, and in order to prevent interference during the transitions between transmission and reception, the front-end module also typically includes an RF switch that is controlled by a general-purpose input/output line of the transceiver. The RF switch is understood to be a single-pole, double-throw switch connecting a single antenna to either the input of the low noise amplifier or the output of the power amplifier. Transceivers with a shared transmit and receive line such as those used in connection with Bluetooth and ZigBee systems, generally include a second RF switch at the input of the power amplifier and the output of the low noise amplifier for the proper control of transmit and receive lines at the transceiver end. The second RF switch is controlled by the same general-purpose input/output line of the transceiver that controls the first RF switch. The power amplifier may also be turned on or off by an enable output from the transceiver. The enable line may have varying voltages to control gain or setting the power amplifier bias current.

Interrelated performance, fabrication, and cost issues have necessitated the fabrication of the RF switch on a different substrate than the substrate of the power amplifier and the low noise amplifier. Power amplifiers are typically fabricated on a gallium arsenide (GaAs) substrate, which is understood to provide high breakdown voltages and reliability. Other substrates such as silicon germanium (SiGe) may also be utilized. Furthermore, the power amplifier can utilize hetero-junction bipolar transistors (HBT), metal-semiconductor field effect transistors (MESFET) or high electron mobility transistors (HEMT), with the HBT being the least costly to fabricate. Along these lines, the low noise amplifier may also be fabricated on a GaAs substrate with HBT transistors. However, because of high insertion loss or low isolation, an RF switch using HBT transistors suffers from poor performance characteristics.

Various solutions to the forgoing issues have been proposed. One involves a multi-die configuration in which the power amplifier and the low noise amplifier are fabricated on one die using HBT transistors, and the RF switch is fabricated on another die using, for example, HEMT transistors. Both of the dies are then encapsulated in a single package. The added costs associated with the GaAs substrate as compared to conventional silicon substrates, and the complex packaging process further elevates the cost of the front-end module fabricated in accordance therewith. Another proposal is directed to a composite GaAs substrate having both HBT and HEMT transistors for the power amplifier and the low noise amplifier, and the RF switch, respectively. Again, however, such integrated circuits are costly to manufacture. Yet another proposal is the use of a silicon substrate for the low noise amplifier, the power amplifier, and the RF switch. Because of poor isolation associated with silicon substrates, however, higher cost solutions such as silicon on insulator (SOI) may be used. These integrated circuits typically require a negative voltage generator, which results in a larger die for its bias circuitry. Additionally, spurious signals over a wide frequency range emitted by a charge pump for the negative voltage generator necessitates a physical separation thereof that further increases die size.

The RF switch thus represents a significant constraint on the design of transceiver front-ends. Accordingly, there is a need in the art for RF transmit/receive front-end circuits without conventional RF switches with sufficient transmitter output and receiver sensitivity for time-domain duplex applications.

BRIEF SUMMARY

In accordance with various embodiments of the present invention, a front end circuit for coupling an antenna to a radio frequency (RF) transceiver is contemplated. The transceiver may include a transmit line, a receive line, a first enable line, and a second enable line. The front end circuit may include an antenna port, as well as a power amplifier and a low noise amplifier. The power amplifier may include a signal output and a signal input that can be coupled to the transmit line of the transceiver. The power amplifier may also include a first control circuit that is coupled to the first enable line of the transceiver. A first voltage that is applied to the first control circuit may activate and set a bias point of the power amplifier. Furthermore, the low noise amplifer may include a signal input and a signal output that is coupled to the receive line of the transceiver. The low noise amplifier may also include a second control circuit that is coupled to the second enable line of the transceiver. A second voltage applied to the second control circuit may activate and set a bias point of the low noise amplifier. The front end circuit may also include a matching network that is connected to the antenna port, as well as the signal output of the power amplifier and the signal input of the low noise amplifier. The signal output of the power amplifier and the signal input of the low noise amplifier may be common. The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

Figure 1A:
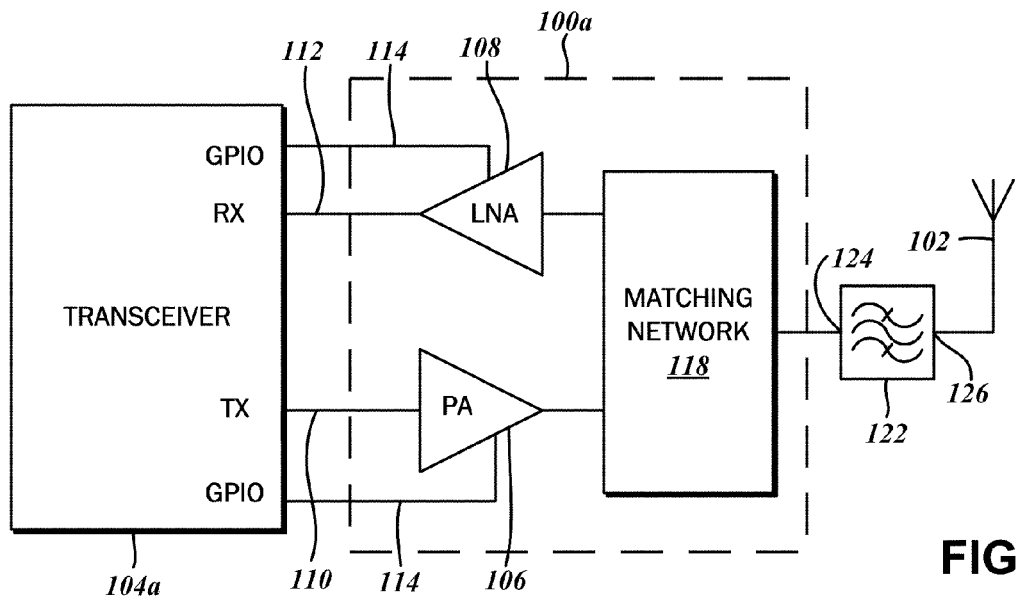
FIG. 1A is a block diagram of an exemplary front end circuit for a radio frequency transceiver with separate transmit and receive lines and a band pass filter in one configuration.
Figure 1B:
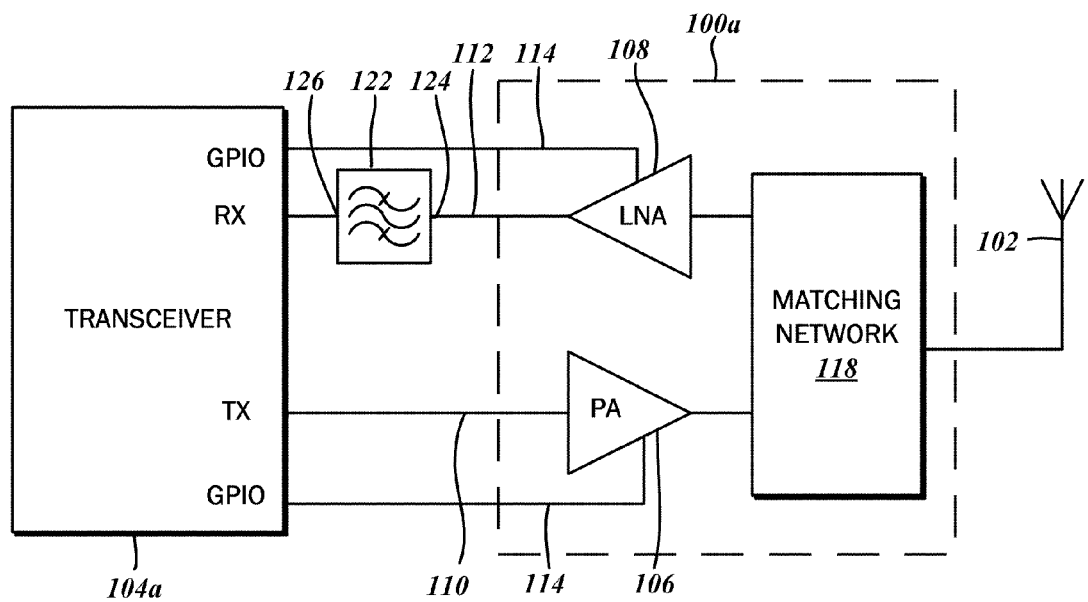
FIG. 1B is a block diagram of the front end circuit with the separate transmit and receive lines and the band pass filter in another configuration.

The detailed description set forth below in connection with the appended drawings is intended as a description of the presently preferred embodiment of the invention, and is not intended to represent the only form in which the present invention may be developed or utilized. The description sets forth the functions of the invention in connection with the illustrated embodiment. It is to be understood, however, that the same or equivalent functions may be accomplished by different embodiments that are also intended to be encompassed within the scope of the invention. It is further understood that the use of relational terms such as first and second and the like are used solely to distinguish one from another entity without necessarily requiring or implying any actual such relationship or order between such entities.

With reference to the block diagrams of FIGS. 1A, 1B, 2A, and 2B, various embodiments contemplate a front end circuit 100 that couples an antenna 102 to a radio frequency (RF) transceiver 104. As will be described in further detail below, two variants of the front end circuit 100a and 100b are contemplated. When considering features applicable to both variants, reference will be made generally to the front end circuit 100. The transceiver 104 generates and receives an RF signal that is compliant with a particular communications system or standard such as, for example, Wireless LAN (802.11x), Bluetooth (802.15.1), or ZigBee (IEEE 802.15.4). The predefined operating frequencies of these systems vary from 2.4 GHz to 6 GHz. It is noted that while the present disclosure sets forth a variety of configurations optimized for these communications systems, those having ordinary skill in the art will recognize that the front end circuit 100 may be optimized for other systems, particularly those that utilize time domain duplexing.

The RF signal generated by the transceiver 104, which has a typical power level of 0 dBM, is insufficient for transmission over anything but the shortest distances. Accordingly, the front end circuit 100 includes a power amplifier 106 to amplify the RF signal to an appropriate level for establishing a reliable communications link. As will be detailed below, various embodiments contemplate a +20 dBm power level at the antenna 102. Additionally, the transceiver 104 receives an RF signal at the antenna 102 from a transmitting node of the communications system. In order for the transceiver 104 to properly demodulate and extract data being carried on the very weak and noisy RF signal at the antenna 102, it is amplified by a low noise amplifier 108.

Figure 2A:
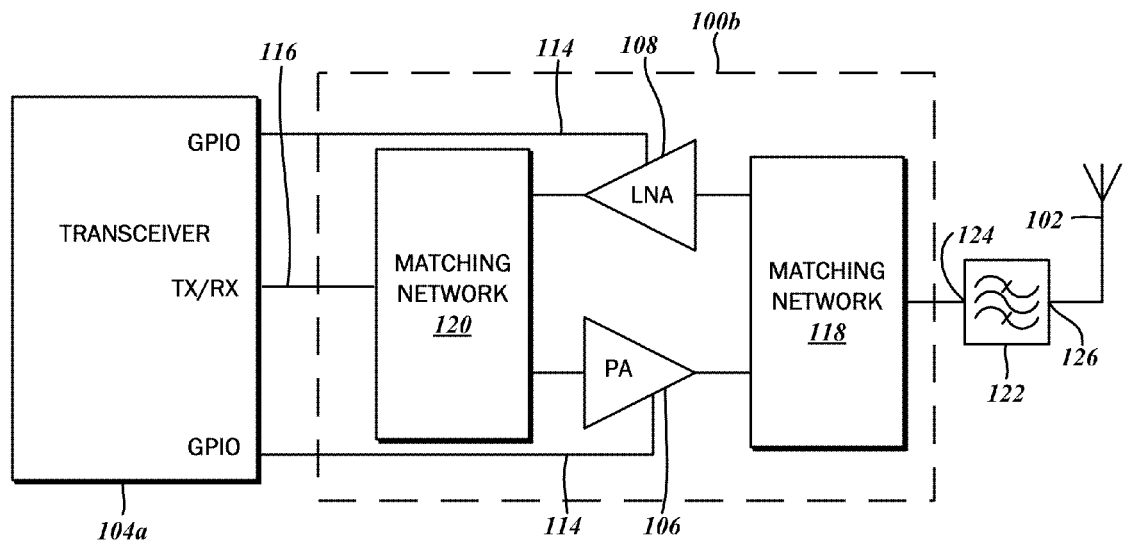
FIG. 2A is a block diagram of another exemplary front end circuit for a radio frequency transceiver with a common transmit and receive line and a band pass filter in one configuration.
Figure 2B:
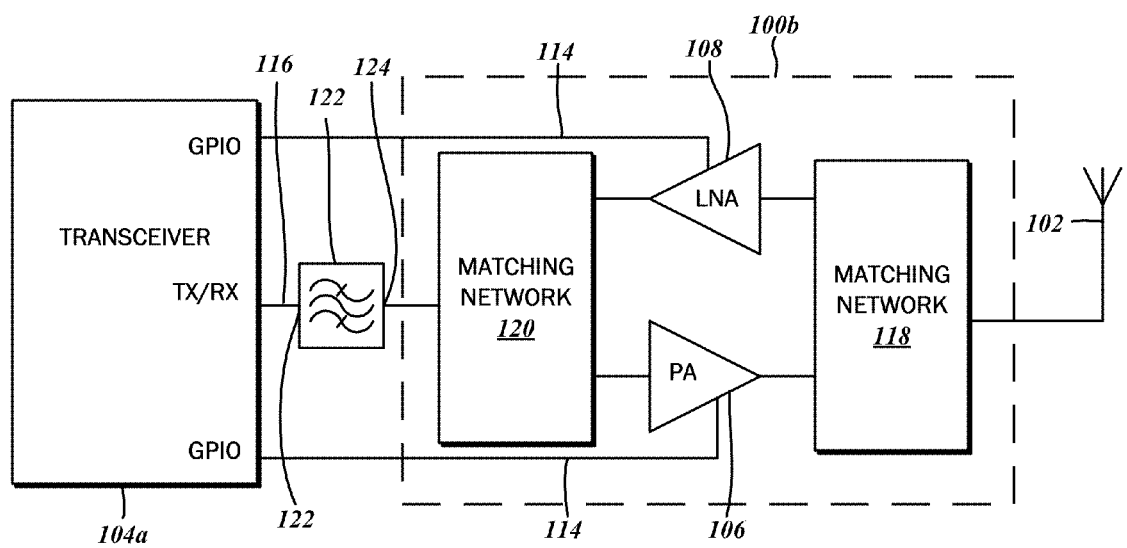
FIG. 2B is a block diagram of the front end circuit with common transmit and receive lines and a band pass filter in another configuration.

A variety of configurations of the transceiver 104 are known in the art, and front end circuits 100 specific therefor are envisioned. As best illustrated in the block diagrams of FIGS. 1A and 1B, a first exemplary variant of the transceiver 104a includes a separate transmit line 110 and a receive line 112. The transceiver 104a further includes one or more general-purpose input/output lines 114 that are utilized to control the power amplifier 106 and the low noise amplifier 108, as will be considered in further detail below. The general-purpose input/output lines 114 are understood to supply digital signals that are at predefined voltages for high and low states, though some transceivers 104 provide variable or analog voltages. Referring now to FIGS. 2A and 2B, a second variation of the transceiver 104b includes a common transmit and receive line 116, in which the generated RF signals from the transceiver 104 and the received RF signals from the antenna 102 share the connection between the transceiver 104 and the front end circuit 100. Typically, low cost applications such as Bluetooth and ZigBee are understood to utilize transceivers 104b having this configuration. The transceiver 104b is also understood to include one or more of the general-purpose input/output lines 114 for controlling the power amplifier 106 and the low noise amplifier 108.

In accordance with various embodiments, the elimination of the conventional RF switch from the front end circuit 100 is generally contemplated. Consequently, all or substantially all of the components of the front end circuit 100 are envisioned to be fabricated on a single die with common transistors structures, though some embodiments are not necessarily limited thereto, in which the components may be discretely fabricated. Suitable transistor structures include bipolar junction (BJT), heterojunction bipolar (HBT), metal semiconductor field effect (MESFET), metal-oxide semiconductor field effect (MOSFET), and high electron mobility (HEMT). The single-die fabrication is understood to greatly reduce the footprint of the die for the front end circuit 100. The die may be fabricated from a silicon substrate, a gallium arsenide (GaAs) substrate, or any other suitable semiconductor material, and may be packaged in a conventional, low-cost quad frame no lead (QFN) plastic package. Any other appropriate transistor structure, semiconductor substrate, fabrication techniques, and packaging techniques may also be utilized in accordance with various teachings in the art in light of the performance parameters of the front end circuit 100.

As briefly noted above, time domain duplex communications systems require rapidly switching between transmit and receive modes, and instead of an RF switch, the inherent switching characteristics of the power amplifier 106 and the low noise amplifier 108 are utilized. Thus, the front end circuit 100 in accordance with the various embodiments have similar functional features as conventional front end modules with RF switches, with the benefit of reduced control lines. In particular, the low noise amplifier 108 and the power amplifier 106 are selectively activated in a substantially exclusive relation to the other. When the transmit line 110 is active, the power amplifier 106 is activated, while the low noise amplifier 108 is deactivated. The RF signal generated by the transceiver 104 is amplified and transmitted over the antenna 102. When the receive line 112 is active, the low noise amplifier 108 is activated, while the power amplifier 106 is deactivated.

Thus, the RF signal received through the antenna 102 is amplified and conveyed to the transceiver 104 for further processing.

Since both the transmit chain and the receive chain share a single connection to the antenna 102 via the front end circuit 100, in an optimal configuration, the amplified RF signal at the output of the power amplifier 106 is minimized at the receive line 112, and the received RF signal at the input low noise amplifier 108 is non-existent at the transmit line 110. Furthermore, in relation to the second variation of the transceiver 104b, because the transmit chain and the receive chain also share a single connection to the transceiver 104b, similar considerations are applicable. As utilized herein, the terms transmit chain and receive chain are understood to refer to the interconnected components of the front end circuit 100 and the transceiver 104 that relate to the transmission or broadcast, and reception, respectively, of the RF signal. Some components, such as the antenna, are understood to be part of both the transmit chain and the receive chain, while other components such as the power amplifier 106 or the low noise amplifier 108 are understood to be exclusive to the transmit chain and the receive chain, respectively. Without suitable isolation between the transmit chain and the receive chain of the front end circuit 100, particularly with high output power levels from the power amplifier 106, leakage of the transmitted RF signal into the receive chain may cause distortion of the same. Furthermore, a reverse voltage at the low noise amplifier 108 with a high power RF signal may exceed reliable operation parameters, potentially leading to permanent breakdown. Along these lines, the deactivated power amplifier 106 and the deactivated low noise amplifier 108 is understood to exert a minimal influence on the remainder of the front end circuit 100.

In addition to such isolation considerations of the transmit chain and the receive chain, the front end circuit 100, and in particular, the power amplifier 106 and the low noise amplifier 108, have a number of optimal performance characteristics. These include high linear power and high efficiency of the power amplifier 106 without transmitting excessive noise and spurious signals such as harmonics through the antenna 102. Additionally, the noise figure, or the amount of noise introduced into the RF signal by the low noise amplifier 108, is minimized, while having sufficient gain to offset any transmission losses and maximize sensitivity. The input mismatch loss between the antenna 102 and the low noise amplifier 108 is reduced to an acceptable level, nominally less than −10 dB.

Accordingly, the front end circuit 100 includes a matching network 118 that is coupled to the power amplifier 106 and the low noise amplifier 108. The output from the power amplifier 106 and the input to the low noise amplifier 108 are tied together in the matching network 118 and are common. Additionally, the matching network 118 is coupled to the antenna 102. As shown in the block diagrams of FIGS. 1A, 1B, 2A, and 2B, the front end circuits 100 for either of the variations of the transceiver 104 (separate transmit line 110 and receive line 112, or common transmit/receive line 116) includes the antenna-side matching network 118. Referring to FIGS. 2A and 2B specifically, the front end circuit 100b for the transceiver 104b includes a second matching network 120 that couples the input of the power amplifier 106 and the output of the low noise amplifier 108 to the common transmit/receive line 116. It is understood that in the front end circuit 100a, the power amplifier 106 and the low noise amplifier 108 are both independently matched to the transceiver 104a.

The specificities regarding the configuration of the power amplifier 106, the low noise amplifier 108, and the matching network 118 in relation to the aforementioned considerations will be described in greater detail below. It will be appreciated by those having ordinary skill in the art that such considerations are by way of example only and not of limitation. Furthermore, various performance trade-offs may be made in relation to the configuration of the front end circuit 100 while still being within the scope of the present invention.

The quality of the transmitted RF signal can be improved, and the receive chain can be protected from external blocking signals reaching the antenna 102 by the addition of a band pass filter 122. As best illustrated in FIGS. 1A and 2A, the band pass filter 122 is disposed between the matching network 118 and the antenna 102. In particular, the band pass filter 122 includes a first port 124 coupled to the matching network 118, and a second port 126 coupled to the antenna 102. This configuration is understood to be appropriate for power amplifiers with flexible out-of-band noise and spur containment, though transmit efficiency and receive sensitivity is reduced. In the embodiments shown in FIGS. 1B and 2B, the band pass filter 122 is disposed between the transceiver 104 and the front end circuit 100. In relation to the first variation of the transceiver 104a, as particularly illustrated in FIG. 1B, the first port 124 is connected to the output of the low noise amplifier 108, and the second port 126 is connected to the receive line 112. With the second variation of the transceiver 104 shown in FIG. 2B, the first port 124 is connected to the second matching network 120, and the second port 126 is connected to the common transmit and receive line 116. This configuration is understood to have improved signal transmission efficiency and overall receive chain sensitivity.

Figure 3:
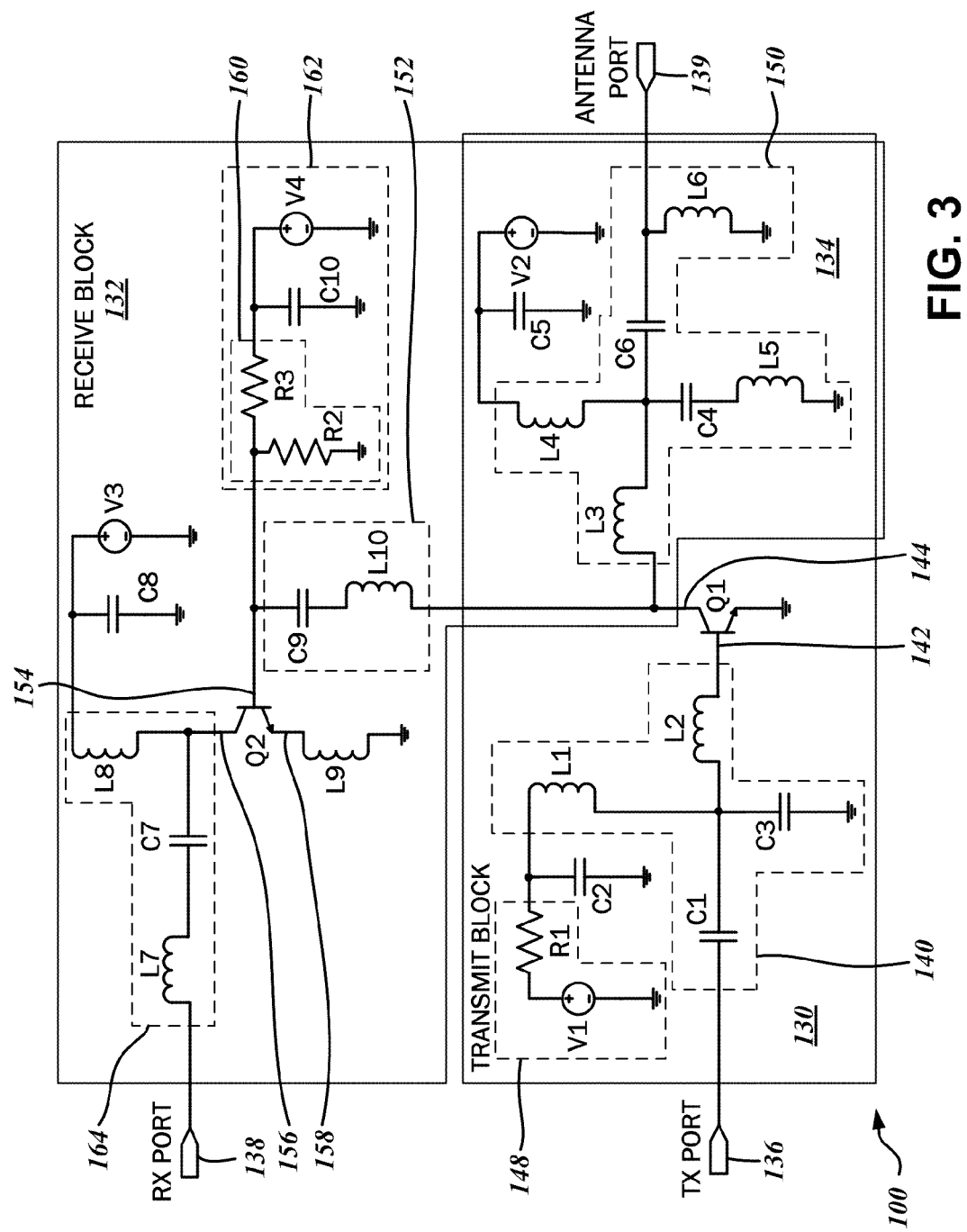
FIG. 3 is a schematic diagram of a first embodiment of the front end circuit.

With reference to the circuit schematic shown in FIG. 3, a first embodiment of the front end circuit 100 defines a transmit block 130, a receive block 132, and a shared transmit/receive block 134 that generally corresponds to the matching network 118. The transmit block 130 includes a TX (transmit) port 136 that is connected to the transmit line 110 from the transceiver 104, and the receive block 132 includes an RX (receive) port 138 that is connected to the receive line 112 to the transceiver 104. Additionally, the shared transmit/receive block 134 has an antenna port 139, over which the front end circuit 100 is coupled to the antenna 102.

By way of example only and not of limitation, the transmit block 130 has a single-stage power amplifier with a transistor Q1 in a common emitter configuration, and the receive block 132 has a single-stage low noise amplifier with a transistor Q2 also in a common emitter configuration. It is understood that multi-stage amplifiers may also be utilized for higher gain applications, and those having ordinary skill in the art will recognize the appropriate modifications to the basic configuration presented herein for such multi-stage amplifiers. In some embodiments, it is contemplated that the transistors Q1 and Q2 have a bipolar junction structure, though in some embodiments, they may have a field-effect structure (MOSFET, MESFET, and the like). In this regard, while the present disclosure variously references bases, collectors, and emitters of bipolar junction transistors, it is to be understood that such elements directly correspond to the gates, drains, and sources of field effect transistors.

As briefly noted above, the power amplifier 106 includes circuitry for matching the input of the front end circuit 100 to the 50-Ohm output impedance of the transceiver 104, as is common in most RF systems. The components of a power amplifier input matching network 140 include capacitors C1 and C3, as well as inductors L1 and L2, which match the transmit port 136 to a base 142 of the transistor Q1 while it is being turned on and off in the predefined operating frequency range. In further detail, the capacitor C1 is tied to the transmit port 136, the capacitor C3, and the inductors L1 and L2. The inductor L2 is tied to the base 142, and the capacitor C3 is tied to ground. The power amplifier input matching network 140 may be variously configured according to different gain, linearity, and wideband operation requirements.

Tied to the inductor L1 is an adjustable voltage source V1 that sets the bias point of the transistor Q1 of the power amplifier 106 through a resistor R1. The bias conditions, in conjunction with the size or geometry of the transistor Q1, are chosen to maximize the operating power level at the antenna 102 during transmission. Additionally, an RF decoupling capacitor C2 having a sufficiently high capacitance is connected to the voltage source V1. These components are understood to comprise one embodiment of a first control circuit 148 that is coupled to the general-purpose input/output line 114 of the transceiver 104. As indicated above, a variable voltage may be generated intermittently by the transceiver 104 on the general-purpose input/output line 114 and thus the transistor Q1, that is, the power amplifier 106 is activated and deactivated. The first control circuit 148 is not intended to be limited to voltage supply circuits as considered above, and any other suitable supply such as a current mirror architecture may be readily substituted.

The transmit block 130, and specifically the collector 144 of the transistor Q1, is connected to the shared transmit and receive block 134 that generally corresponds to the matching network 118. The matching network 118 is defined by a power amplifier output matching segment 150 that includes inductors L3, L4, L5 and L6, as well as capacitors C4 and C6. The power amplifier output matching segment 150 impedance matches the transistor Q1 to the antenna 102 at the predefined operating frequency when active. The collector 144 of the transistor Q1 is connected to the inductor L3, which in turn is connected to capacitors C4, C6, and the inductor L4. The values of the capacitor C4 and the inductor L5 connected in series thereto and to ground are selected to provide a series resonance at the second harmonic of the predefined operating frequency. A voltage source V2 is connected to the inductor L4, and provides biasing to the collector 144 of the transistor Q1. Similar to the voltage source V1, an RF decoupling capacitor C5 is connected between the voltage source V2 and ground.

The power amplifier output matching segment 150 is configured in a way that the resistive part of the impedance at the collector 144 of the transistor Q1 is equal or below the resistive component of an output impedance or transistor load impedance required for the activated transistor Q1 that corresponds to a predetermined 1 dB compression point (P1 dB) at a specific bias voltage. In this regard, the power amplifier output matching segment 150 is loaded at the antenna side by a predefined load (typically 50 Ohms) while the receive block 132, including a low noise amplifier input matching segment 152 of the matching network 118, is disconnected.

A number of parameters of the RF signal, which are particular to a given communications system, dictated the configuration of the matching network 118. In WLAN systems that utilize the 802.11b standard, for example, based upon the complementary cumulative distribution function (CCDF) of various data rates ranging from 1 Mbps to 11 Mbps, it is understood that he maximum power level exceeds the average power level by about 4.0 to 4.5 dB. In 802.11a and 802.11g transmissions, the maximum power level exceeds the average power level by about 7.5 to 8.0 dB for data rates up to 54 Mbps. Any given data rate has a corresponding error vector magnitude (EVM), which has an inverse relation thereto. EVM, in turn, is understood to be related to ρ, which quantitatively defines the distortion of a signal relative to an ideal one. In the present exemplary embodiment, a peak to average power of about 7 dB is selected.

Figure 4:
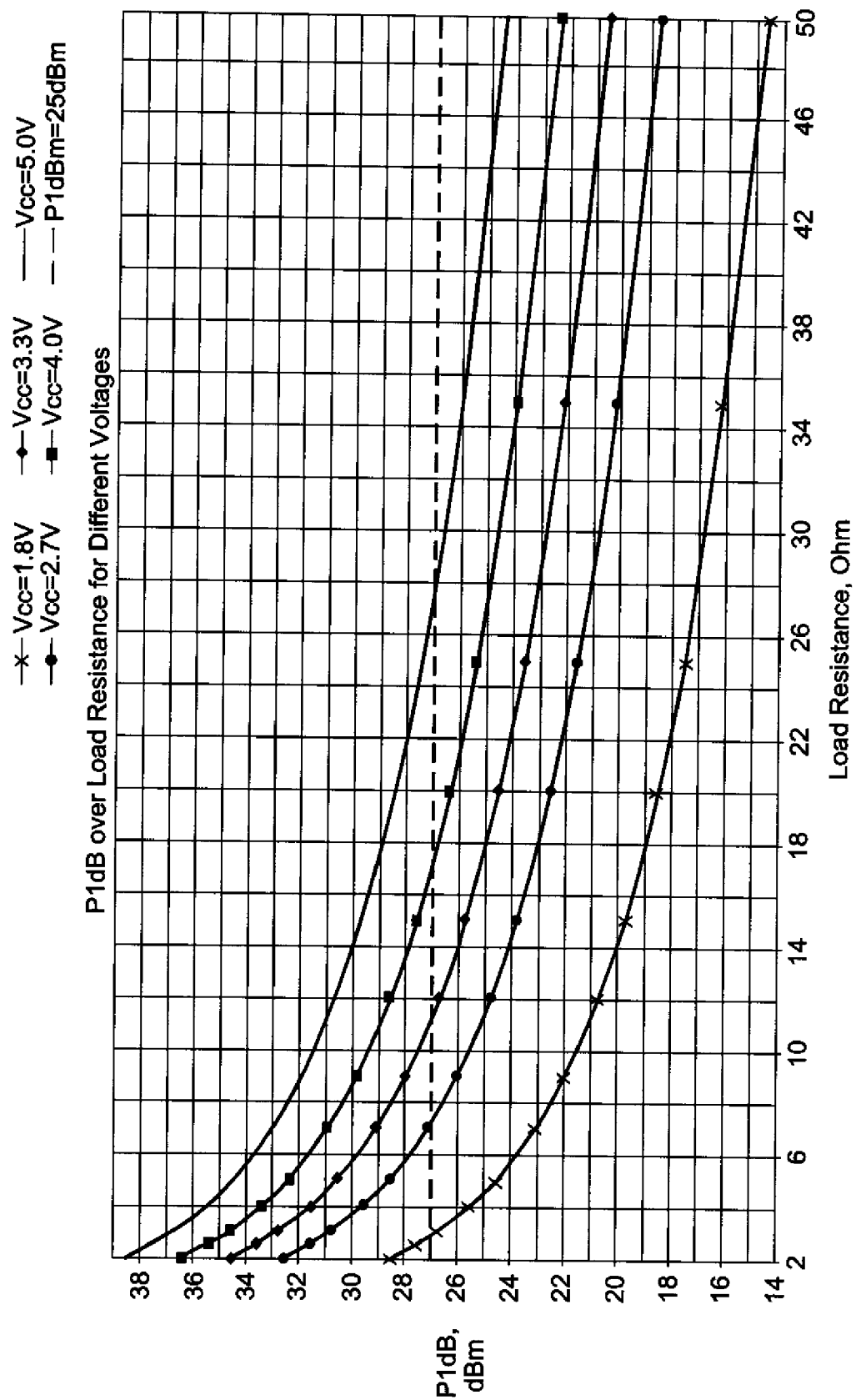
FIG. 4 is a graph illustrating 1 dB compression point over load resistance for a variety of bias voltage utilized for determining an appropriate configuration of a matching network.

Referring to the graph of FIG. 4, assuming a 7 dB back-off for WLAN signals with sufficiently low EVM and the selected 1 dB compression point (P1 dB) is 25 dBm, then 18 dBm maximum linear power may be achieved at the output of the power amplifier 106. With a 25 dBm P1 dB, an appropriate transistor load resistance is understood to be 18 Ohms or less for a bias voltage applied to the collector 144 of the Q1 less than 3.3V, which is the typical bias voltage for portable applications.

As indicated above, the shared transmit and receive block 134 is connected to the receive block 132, which includes the low noise amplifier 108 and other associated circuitry. The transistor Q2 is that of the low noise amplifier 108, and is also in a common-emitter configuration. Additionally connected to the emitter 158 of the transistor Q2 is an optional degeneration inductor L9 that is tied to ground. In some cases, the base-emitter impedance of the transistor Q2 may be better matched to the antenna 102.

The matching network 118 includes the low noise amplifier input matching segment 152, which is comprised of a capacitor C9 and an inductor L10 that are exclusive thereto. The low noise amplifier input matching segment 152 is combined with the inductors L3, L4, L5, and L6 and capacitors C4 and C6, which are shared with the power amplifier output matching segment 150, to impedance match the low noise amplifier 108 to the antenna 102 while active. The capacitor C9 and the inductor L10 are connected in series to the collector of the transistor Q1 and a base 154 of the transistor Q2.

Figure 5:
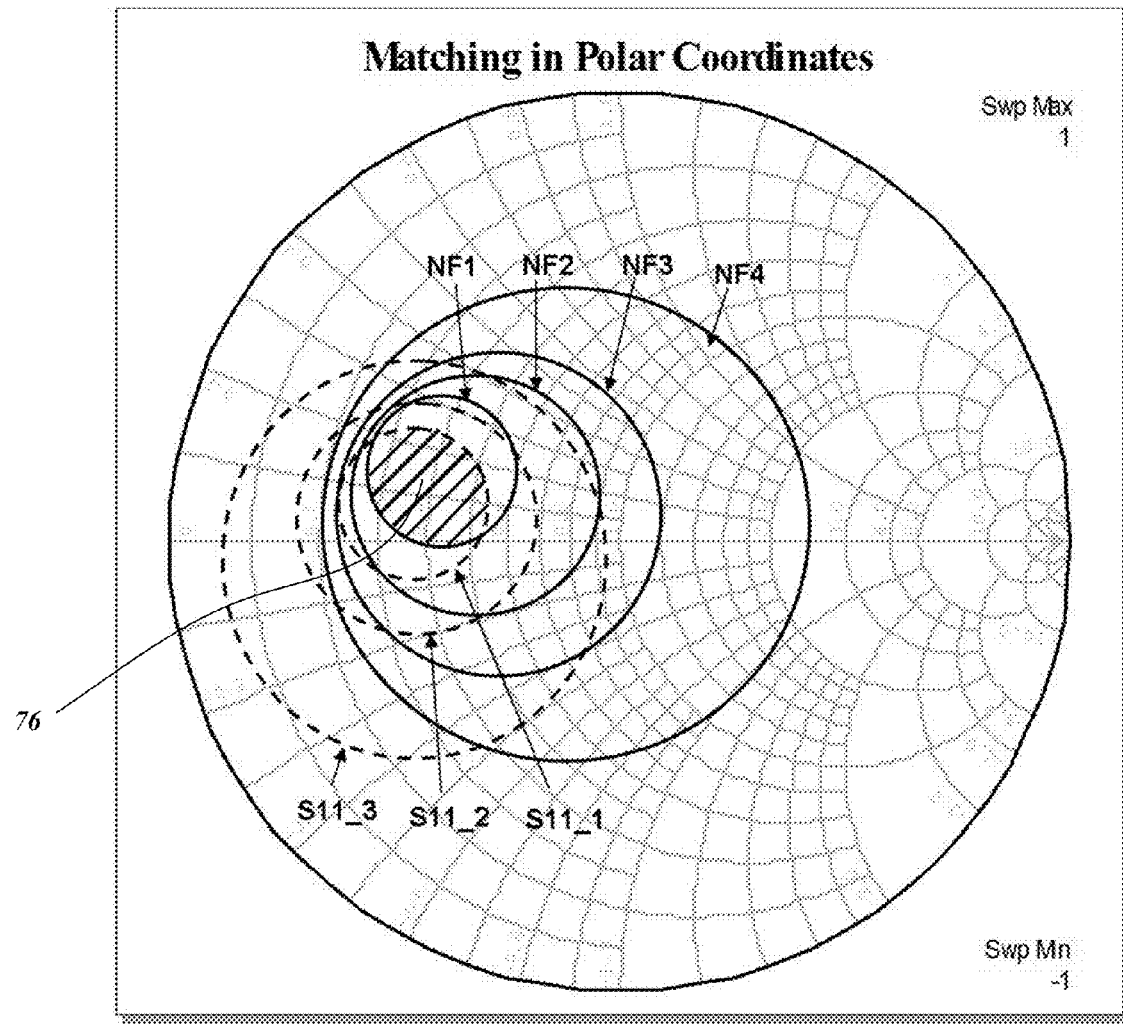
FIG. 5 is a Smith chart with constant noise figure (NF) and input return loss (S11) circles at a fixed frequency in 50 Ohm polar coordinates.

A number of factors are applicable to the optimal configuration of the low noise amplifier 108 and the low noise amplifier input matching segment 152. In particular, the size or geometry of the transistor Q2 is selected such that the resistive component of an input impedance of an activated transistor Q2 is substantially similar to the resistive component of an output impedance required for the activated transistor Q1 of the power amplifier 106. The values of the capacitor C9 and the inductor L10 are selected to reach a minimal noise figure (NF) between the antenna 102 and the output of the low noise amplifier 108, as well as a minimal input return loss for an activated transistor Q2 and a deactivated transistor Q1 of the power amplifier 106. A suitable NF, according to one embodiment, may be less than 3 dB. The input return loss is understood to be measured from the antenna 102, and includes the receive chain of the matching network 118, i.e., the shared power amplifier output matching segment 150 and the low noise amplifier input matching segment 152. One embodiment contemplates an input return loss of less than −10 dB. The Smith chart of FIG. 5 shows constant NF and input return loss (S11) circles at a fixed frequency in 50 Ohm polar coordinates. An overlapping section 76 corresponds to appropriate NF and S11 matching to a 50 Ohm impedance value.

The capacitor C9 and the inductor L10 are selected to correspond to a substantially minimized voltage swing at the base of the transistor Q2. As mentioned previously, when the power amplifier 106 is on, an optimized configuration minimizes the voltage being applied to the low noise amplifier 108 to prevent the transistor Q2 from conducting while the base-emitter resistance decreases, thereby degrading the transmitted RF signal.

Figure 8:
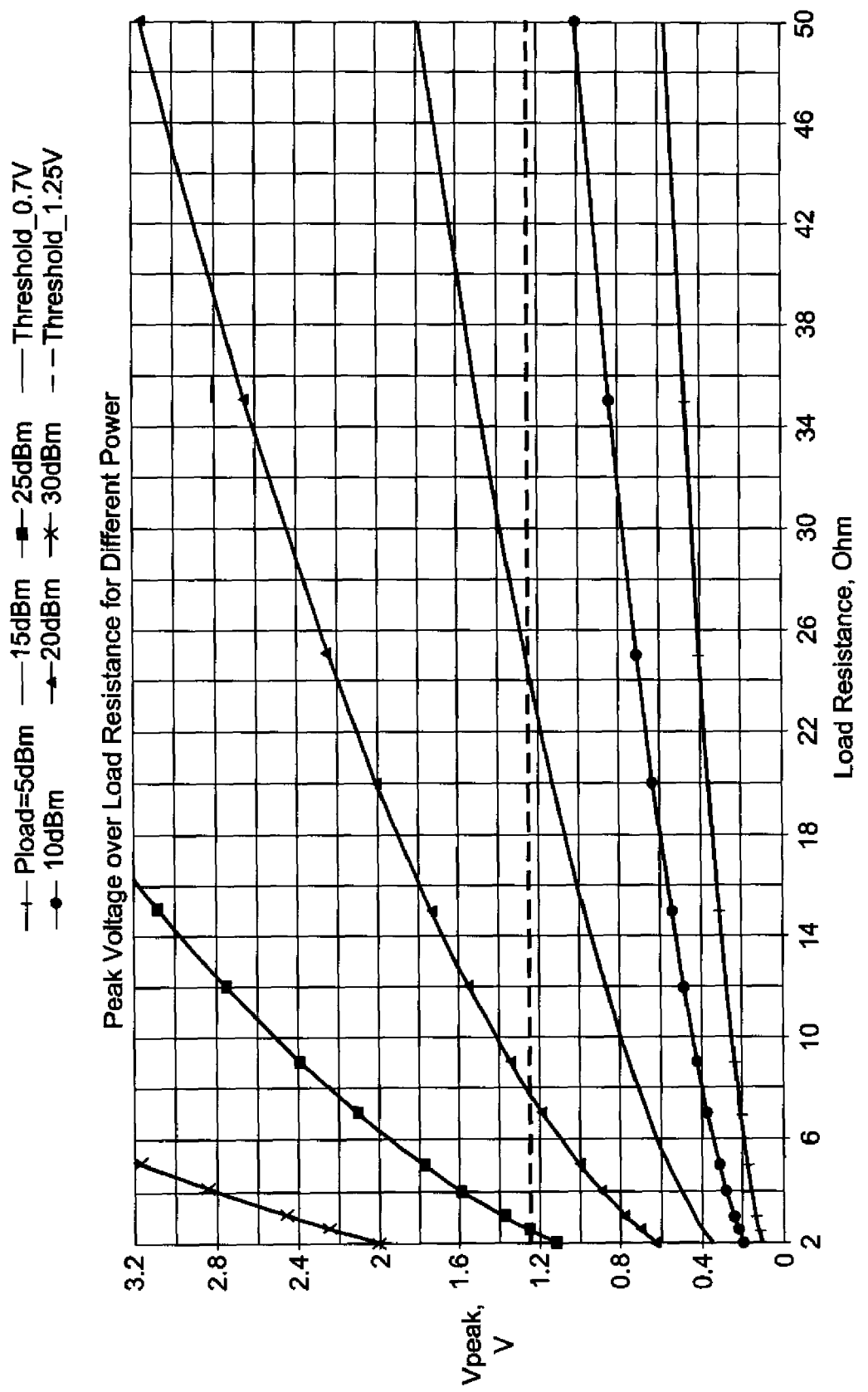
FIG. 8 is a graph illustrating peak voltage over load resistance at different power levels.

The graph of FIG. 8 illustrates the theoretical peak voltages over a given load resistance for a variety of power levels, that is, which voltage levels could be at the transistor Q2 base-emitter junction when deactivated if full transmit power is applied to the same. For example, an 18-Ohm load resistance at 25 dBm output, the peak voltage is approximately 3.3 Volts.

Figure 9:
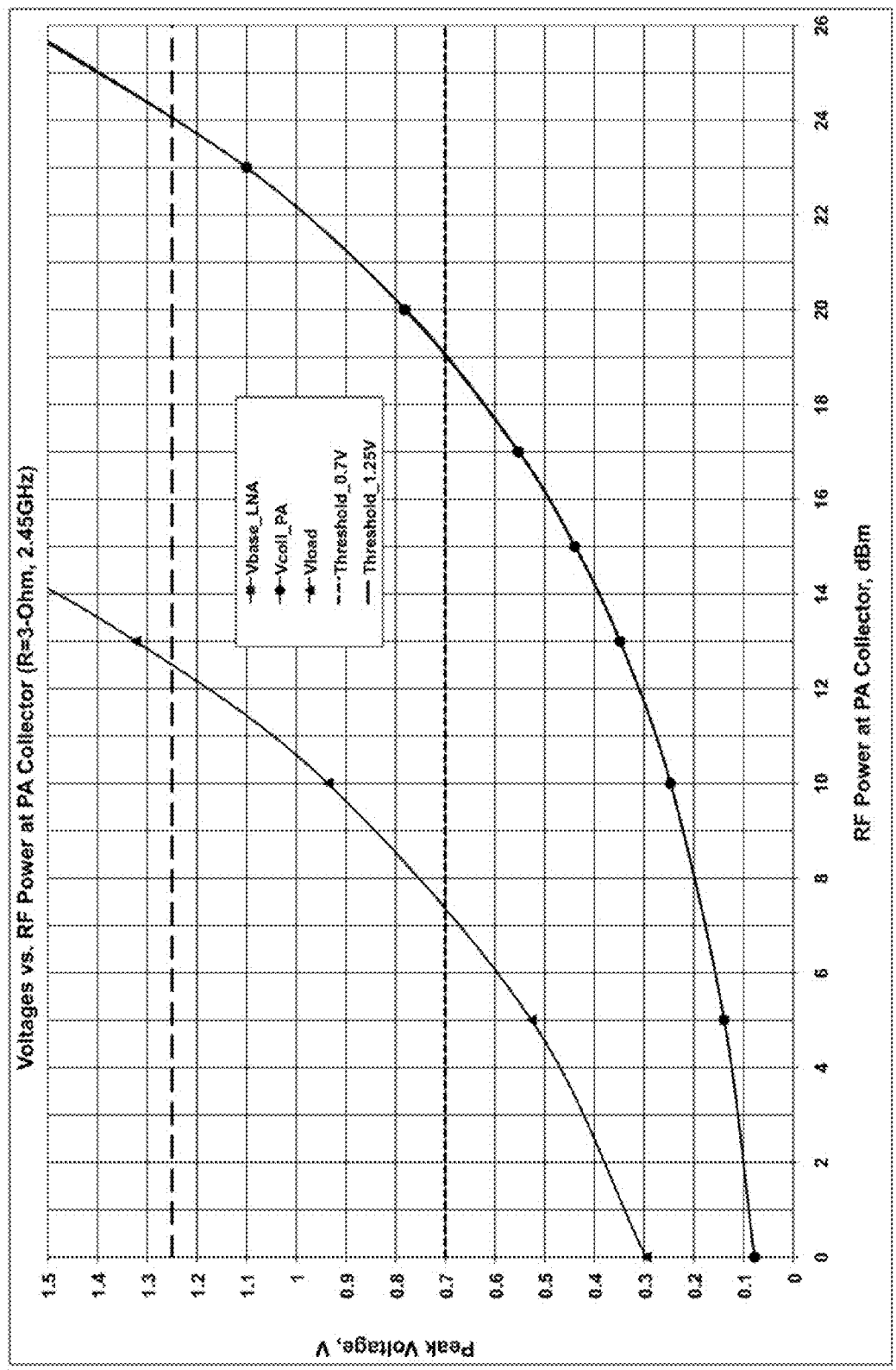
FIG. 9 is a graph showing peak voltages versus RF power at a power amplifier collector.

The 0.7 Volt and 1.25 Volt thresholds are representative of the silicon germanium hetero-junction bipolar transistor turn-on voltage and the gallium arsenide hetero-junction bipolar transistor turn-on voltage, respectively. In further detail, FIG. 9 illustrate the peak voltages over a given RF power at the collector 144 of the transistor Q1, where R=3 Ohm, at the predefined operating frequency of 2.45 Ghz.

Figure 10:
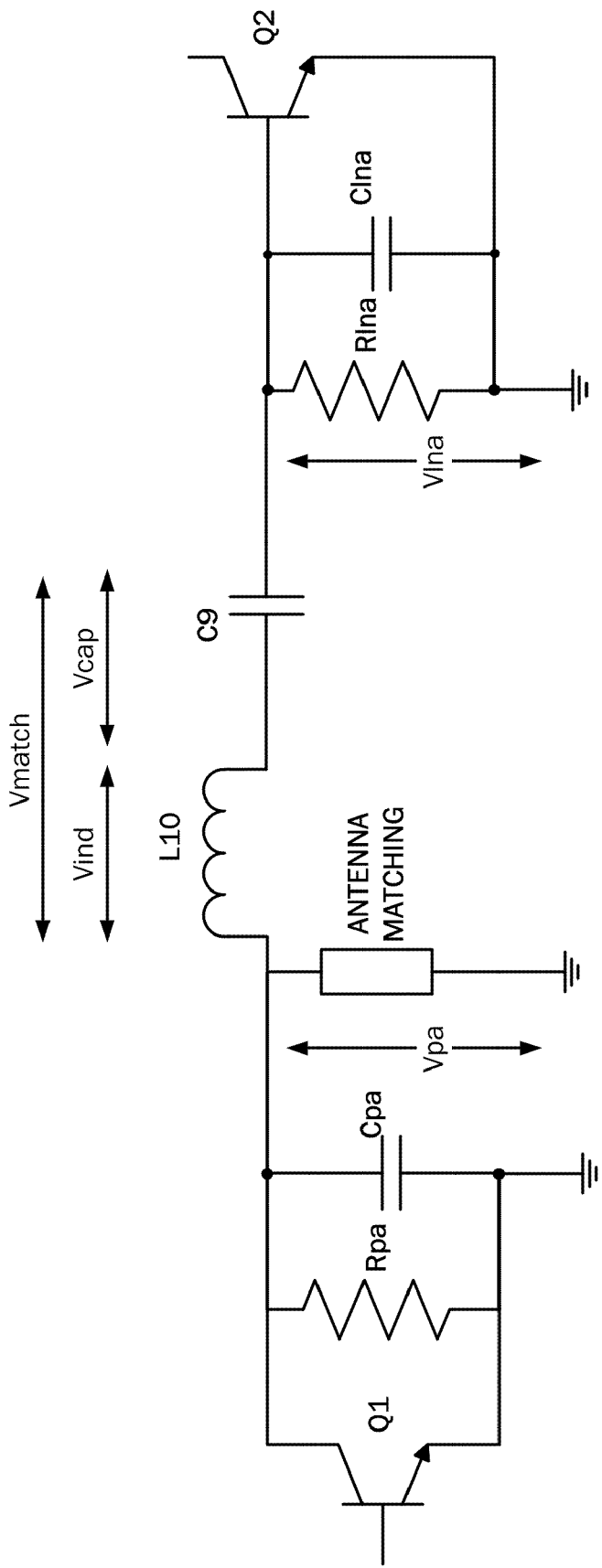
FIG. 10 is a schematic diagram of an equivalent circuit of the matching network.

With reference to the schematic diagram of FIG. 10, there is illustrated a simplified equivalent circuit of the power amplifier 106, the low noise amplifier 108, and the matching network 11. In particular, it is understood that Rpa and Cpa represent the power amplifier output impedance while providing power to the antenna 102. The antenna matching circuit represents an impedance de-embedded from the antenna 102 to the collector of the last stage of the power amplifier 106. Furthermore, Rlna and Clna represent a base-emitter impedance of the low noise amplifier transistor Q2 when deactivated, at which state has a high impedance compared to the impedance at the collector of the power amplifier transistor Q1. Accordingly, the transistor Q2 is not influencing the signal. The capacitor C9 and the inductor L10 is an additional matching network of the low noise amplifier input, along with the antenna matching circuit that provides an appropriate impedance for sufficient NF and input return loss figures while the transistor Q2 is activated. The Vpa voltage generated at the transistor Q1 is eventually delivered to the base of the transistor Q2, but if Vlna voltage exceeds the turn on voltage of the transistor Q2, it starts conducting while the base-emitter resistance decreases. In a forward-biased diode, capacitance is increasing due to the influence of diffusion capacitance. Accordingly, as indicated above, the signal from the power amplifier transistor Q1 may deteriorate.

Generally, the smallest value of the capacitor C9 is understood to result in the minimum voltage amplitude at the base-emitter junction of the transistor Q2 when the transistor Q1 (the power amplifier 106) is on and the transistor Q2 (the low noise amplifier 108) is off, thus increasing its reliability. Additionally, linearity of the power amplifier 106 is achieved at higher transmit power levels. Avoiding a resonance frequency of the low noise amplifier input matching segment 152 close to the predefined operating frequency also decreases voltage swing at the base-emitter junction of the deactivated transistor Q2, so in one exemplary configuration, the resonance frequency is set to be at least a few hundred MHz higher.

An adjustable voltage source V4 is also connected to the base 154 of the transistor Q2 for activating and setting the bias point of the low noise amplifier 108. As previously noted, a variable voltage may be generated intermittently by the transceiver 104 on the general-purpose input/output line 114 and so the low noise amplifier 108 is activated and deactivated thereby. The voltage is provided through a resistive divider 160 that includes a resistor R3 connected to the adjustable voltage source V4 and a resistor R2 connected to ground and the resistor R3. The junction between the resistor R2 and the resistor R3 is tied to the base 154 of the transistor Q2. The resistive divider 160 is configured to have a sufficient resistance to prevent shunting of the impedance at the base 154 of the transistor Q2, that is, the base-emitter resistance of the activated transistor Q2 is less than that of the resistive divider 160. An RF decoupling capacitor C10 is also connected to the voltage source V4. These components are understood to comprise one embodiment of a second control circuit 162. As with the first control circuit 148, the second control circuit 162 is not intended to be limited to a voltage supply as above, and other configurations such as a current mirror are also suitable.

The aforementioned first control circuit 148 and the second control circuit 162 thus directs the functionality of the front end circuit 100 to switch between a transmit mode and a receive mode. When the power amplifier 106 is on, there is a voltage being applied to the first control circuit 148 at a predefined level to bias on the transistor Q1, and no voltage is applied to the second control circuit 162. When the low noise amplifier 108 is on, there is a voltage being applied to the second control circuit 162 to bias on the transistor Q2, while no voltage is applied to the first control circuit 148. Although in conventional operation the activation of the first control circuit 148 and the second control circuit 162 are exclusive, in some embodiments, the simultaneous activation of both may be appropriate for a diagnostic or calibration mode. In such mode, it is contemplated that the transceiver 104 may be calibrated for such parameters as receiver gain, DC offset cancellation, and so forth. The mode may also be utilized during a manufacturing test procedure.

A voltage source V3 biases the transistor Q2, and is connected to a collector 156 of the transistor Q2 over the inductor L8. As with the other voltage sources in the front end circuit 100, an RF decoupling capacitor C8 is connected to the voltage source V3.

The collector 156 of the transistor Q2 is also connected to a low noise amplifier output matching network 164, which in turn is connected to the receive port 138. The low noise amplifier output matching network 164 includes inductors L7 and L8, and capacitor C7, and a variety of configurations are possible depending upon the gain, noise figure, linearity, and wide-band operation requirements. The transceiver 104 is thus impedance matched to the low noise amplifier 108.

In accordance with various embodiments, a component of the matching network 118, specifically the inductor L6, has an electrostatic discharge function. The resistive component of the inductor L6 is contemplated to have a value less than 5 Ohm to provide a direct current (DC) pass from the antenna port 139 to ground in case a high voltage is accidentally applied. Accordingly, the need for electronic discharge clamp circuitry that degrades signal transmission performance, as is typical in silicon substrate-based semiconductor devices, is eliminated.

Figure 13:
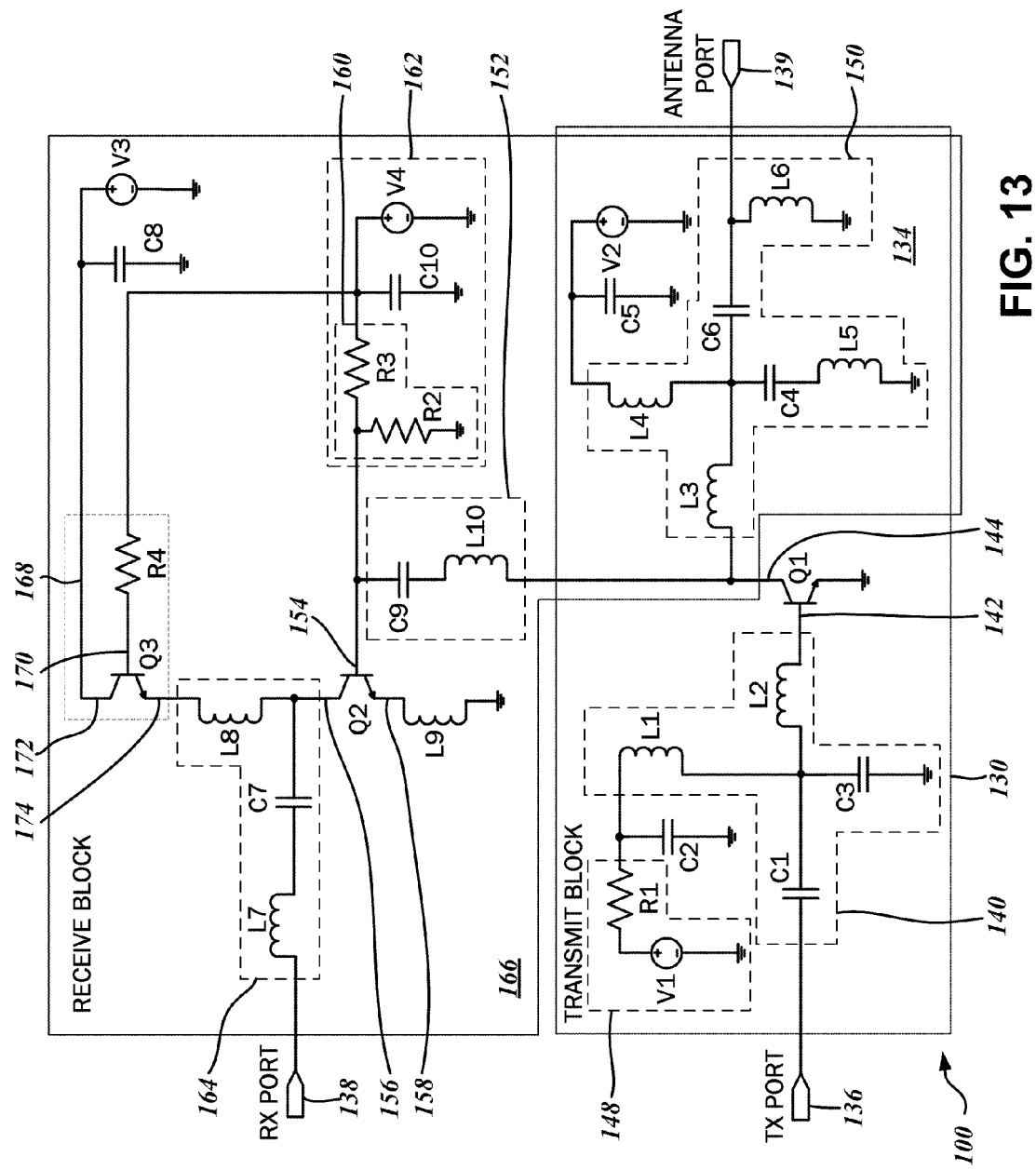
FIG. 13 is a schematic diagram of a second embodiment of the front end circuit including a direct current bias switch.

FIG. 13 is a circuit schematic of a second embodiment of the front end circuit 100 that is generally defined by the transmit block 130, a receive block 166, and the shared transmit/receive block 134 that corresponds in part to the matching network 118. The transmit block 130 includes the TX (transmit) port 136 that is connected to the transmit line 110 from the transceiver 104, and the receive block 166 includes the RX (receive) port 138 that is connected to the receive line 112 to the transceiver 104. The shared transmit/receive block 134 has an antenna port 139 for coupling the front end circuit 100 to the antenna 102.

The features of the transmit block 130 are common with that of the first embodiment of the front end circuit 100, and includes the single-stage power amplifier 106 with the transistor Q1 in a common emitter configuration. It is understood that multi-stage amplifiers may also be utilized for higher gain applications.

The power amplifier 106 includes the power amplifier input matching network 140, which is understood to match the transmit port 136 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1. As noted above, other suitable supply architectures besides the voltage supply circuit, such as a current mirror, may be substituted.

The transmit block 130, via the collector 144 of the transistor Q1, is connected to the shared transmit and receive block 134 that generally corresponds to the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 166, including the low noise amplifier input matching segment 152 of the matching network 118, is disconnected.

The shared transmit and receive block 134 is also connected to the receive block 166, which includes the low noise amplifier 108 and other associated circuitry. The matching network 118 includes the low noise amplifier input matching segment 152 that is combined with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

The adjustable voltage source V4, which is connected to the base 154 of the transistor Q2, is also connected to a direct current bias switch 168. As described above, the variable voltage generated intermittently by the transceiver 104 on the general-purpose input/output line 114 is understood to activate and deactivate the transistor Q2. The present embodiment contemplates activating and deactivating the direct current bias switch 168 with the low noise amplifier 108 via the second control circuit 162 as in the illustrated embodiment, or independently.

Specifically, the voltage from the adjustable voltage source V4 is applied to a base 170 of the transistor Q3 through a resistor R4, and the bias supply voltage source V3 is connected to a collector 172 of the transistor Q3. The resistor R4 is selected to have a minimal voltage drop through the emitter-collector chain of the transistor Q3 when turned on, as well as settling the bias point of the transistor Q2. This is understood to keep the linearity of the low noise amplifier 108 high, as a greater voltage may be applied to the collector 156 of the transistor Q2. An RF decoupling capacitor C8 is also connected to the voltage source V3. An emitter 174 of the transistor Q3 is connected to the inductor L8, which is turn connected to the collector 156 of the transistor Q2. Due to the bias supply voltage source V3 being disconnected from the low noise amplifier 108, and specifically the transistor Q2 thereof, there is a higher degree of isolation between the receive port 138 and the transmit port 136. Essentially, the transistor Q3 operates as a DC voltage switch.

The collector 156 of the transistor Q2 is connected to the low noise amplifier output matching network 164, which in turn is connected to the receive port 138. The transceiver 104 is impedance matched to the low noise amplifier 108. The low noise amplifier output matching network 164 may have a variety of different configurations depending upon the gain, noise figure, linearity, and wide-band operation requirements.

Figure 14:
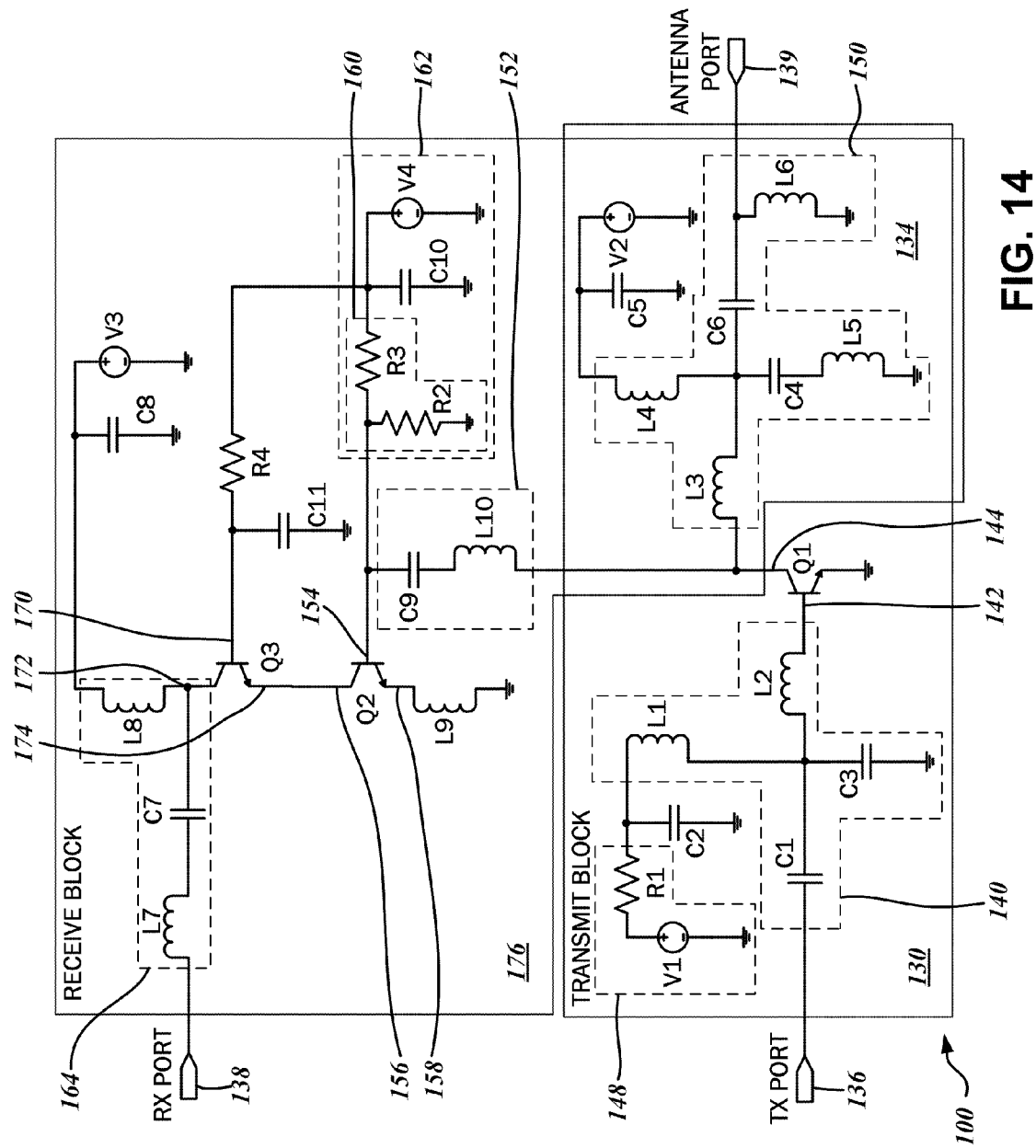
FIG. 14 is a schematic diagram of a third embodiment of the front end circuit including a cascode transistor.

Referring to the circuit schematic of FIG. 14, a third embodiment of the front end circuit 100 is generally defined by the transmit block 130, a receive block 176, and the shared transmit/receive block 134 corresponding in part to the matching network 118. The transmit block 130 includes the TX (transmit) port 136 that is connected to the transmit line 110 from the transceiver 104, and the receive block 166 includes the RX (receive) port 138 that is connected to the receive line 112 to the transceiver 104. The shared transmit/receive block 134 includes the antenna port 139 for coupling the front end circuit 100 to the antenna 102.

The features of the transmit block 130 are common with that of the first and second embodiments of the front end circuit 100 above, and includes the single-stage power amplifier 106 with the transistor Q1 in a common emitter configuration. It is understood that multi-stage amplifiers may also be utilized for higher gain applications.

The power amplifier 106 includes the power amplifier input matching network 140, which is understood to match the transmit port 136 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1. As noted above, other suitable supply architectures besides the voltage supply circuit, such as a current mirror, may be substituted.

The transmit block 130, via the collector 144 of the transistor Q1, is connected to the shared transmit and receive block 134 that generally corresponds to the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 166, including the low noise amplifier input matching segment 152 of the matching network 118, is disconnected.

The shared transmit and receive block 134 is also connected to the receive block 176, which includes the low noise amplifier 108 and other associated circuitry. The matching network 118 includes the low noise amplifier input matching segment 152 that is combined with the power amplifier output matching segment 150 to impedance match the low noise amplifier 108 to the antenna 102 when active. The receive block 176 includes the transistor Q2, likewise in a common-emitter configuration. The various optimizations relating to the low noise amplifier 108 and the low noise amplifier input matching segment 152 previously discussed are applicable to this embodiment.

The adjustable voltage source V4, which is connected to the base 154 of the transistor Q2, is also connected to the transistor Q3, which is in a cascode configuration. The cascode transistor Q3 is inserted between the bias supply voltage source V3 and the transistor Q2. In further detail, the emitter 174 of the transistor Q3 is tied directly to the collector 156 of the transistor Q2, and the collector 172 of the transistor Q3 is connected to the inductor L8. The voltage source V3, in turn, is connected to the inductor L8. As with the other embodiments, the RF decoupling capacitor C8 is connected to the voltage source V3. Optionally, the emitter 174 of the transistor Q3 may be connected to the collector 156 through an additional inductor to minimize the overall noise figure.

The variable voltage generated intermittently by the transceiver 104 on the general-purpose input/output line 114 is understood to activate and deactivate the transistor Q2. The present embodiment further envisions activating and deactivating the cascode transistor Q3 synchronously therewith, either via the second control circuit 162 as shown or independently.

As discussed above, the adjustable voltage source V4 activates and sets the bias point of the transistor Q2. Additionally, in the present third embodiment, the adjustable voltage source V4 is connected to the base 170 of the transistor Q3 through the resistor R4. The resistor R4 is selected to settle the bias point of the transistor Q2. In addition, a capacitor C11 is connected to the base 170 of the transistor Q3 and ground. The value selected for the capacitor C11 is based upon the circuit stability requirements while the low noise amplifier 108 is activated, as well as the overall gain shape of the same.

The collector 172 of the transistor Q3 is connected to the low noise amplifier output matching network 164, which in turn is connected to the receive port 138. The transceiver 104 is thus impedance matched to the low noise amplifier 108. It is understood that the cascode configuration of the low noise amplifier 108 above results in a higher gain from the antenna port 139 to the receive port 138, as well as a higher reverse isolation between the transmit port 136 and the receive port 138, and between the receive port 136 and the antenna port 139. The low noise amplifier output matching network 164, along with the size or geometry of the transistor Q3, may have a variety of different configurations depending upon the gain, noise figure, linearity, and wide-band operation requirements.

Figure 15:
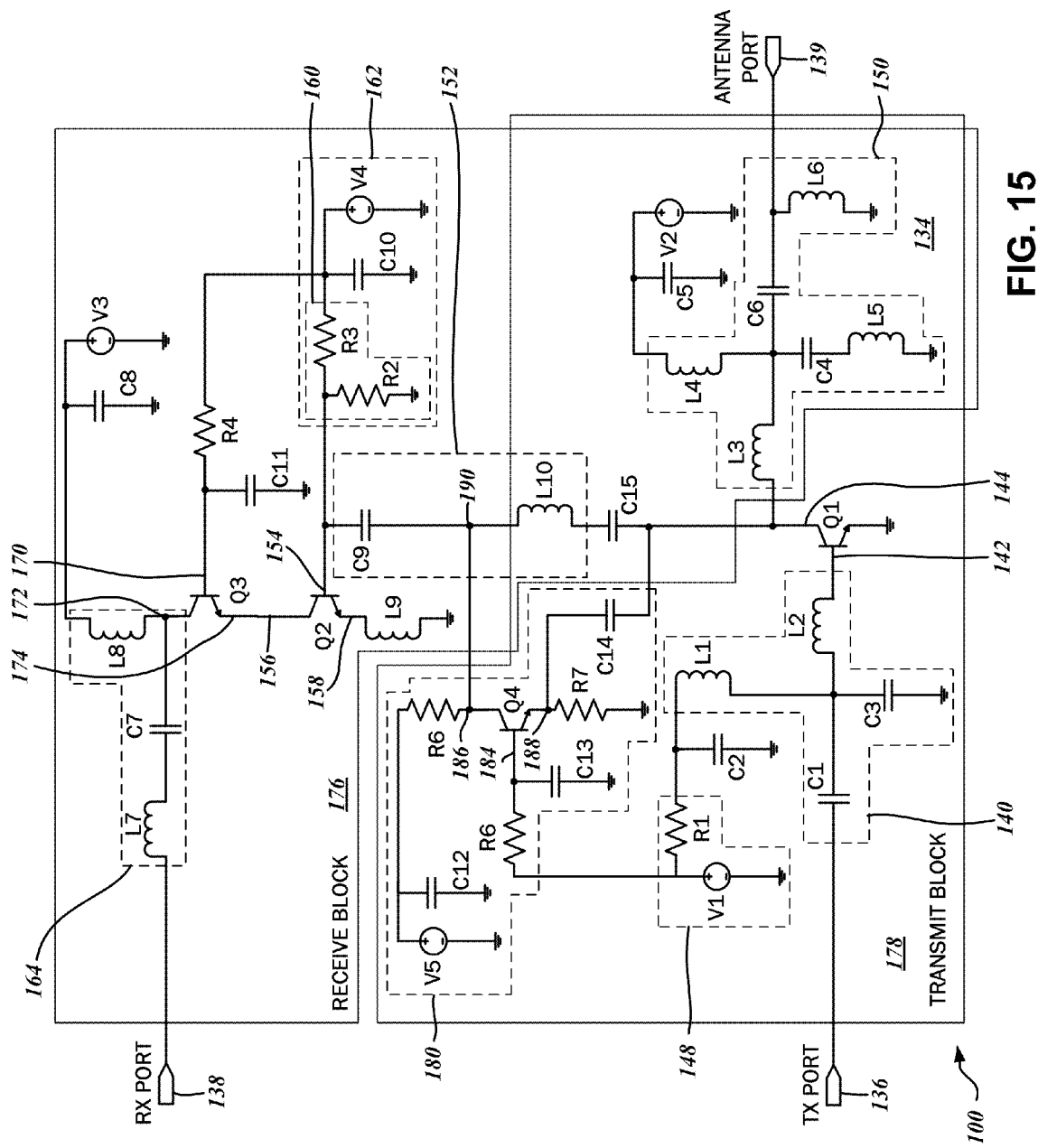
FIG. 15 is a schematic diagram of a fourth embodiment of the front end circuit with a parallel resonant circuit in a first configuration.

As shown in the schematic diagram of FIG. 15, a fourth embodiment of the front end circuit 100 includes a transmit block 178, the receive block 176, and the shared transmit/receive block 134 that generally corresponds to the matching network 118. The transmit block 130 includes the TX (transmit) port 136 that is connected to the transmit line 110 from the transceiver 104, and the receive block 176 includes the RX (receive) port 138 that is connected to the receive line 112 to the transceiver 104. The shared transmit/receive block 134 includes the antenna port 139 for coupling the front end circuit 100 to the antenna 102.

The features of the transmit block 178 are substantially similar to the embodiments of the front end circuit 100 previously described, and includes the single-stage power amplifier 106 with the transistor Q1 in a common emitter configuration. However, there are a number of variations as will be detailed more fully below. It is understood that multi-stage amplifiers may also be utilized for higher gain applications.

The power amplifier 106 includes the power amplifier input matching network 140, which is understood to match the transmit port 136 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1. Other suitable supply architectures besides the voltage supply circuit, such as a current mirror, may be substituted.

The transmit block 130, via the collector 144 of the transistor Q1, is connected to the shared transmit and receive block 134 that generally corresponds to the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 166, including the low noise amplifier input matching segment 152 of the matching network 118, is disconnected.

The shared transmit and receive block 134 is also connected to the receive block 176, which includes the low noise amplifier 108 and other associated circuitry. The receive block 176 includes the transistor Q2, likewise in a common-emitter configuration. The matching network 118 includes the low noise amplifier input matching segment 152 that is combined with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

The low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3. The collector 172 of the transistor Q3 is connected to the low noise amplifier output matching network 164, which in turn is connected to the receive port 138. The transceiver 104 is thus impedance matched to the low noise amplifier 108. Further details relating to the receive block 176 having the cascode configuration are considered above.

As previously indicated, an optimal configuration of the front end circuit reduces the voltage swing at the input of the low noise amplifier 108 to a minimum while the power amplifier 106 is activated in order to minimize leakage to the receive port 138 and signal distortion. The fourth embodiment of the front end circuit 100 accordingly contemplates the addition of a parallel resonant circuit 180 inserted between the collector 144 of the transistor Q1 and the base 154 of the transistor Q2. The parallel resonant circuit 180, with its low impedance during activation of the transistor Q3, is understood to decrease voltage swing at the base 154 of the transistor Q2. This allows higher linear transmit power levels, particularly where the resistive part of the transistor Q2 input impedance cannot be further decreased. As will be detailed below, the parallel resonant circuit 180 is essentially comprised of the inductor L10 and the capacitor C14, with the collector-emitter impedance of the activated transistor Q4 represents loss of the circuit.

In further detail, the parallel resonant circuit 180 includes a transistor Q4 with a collector 186 connected to an intermediate junction 190 between the capacitor C9 and the inductor L10 of the low noise amplifier input matching segment 152, and an emitter 188 connected to the collector 144 of the transistor Q1 through a series capacitor C14. The value of the capacitor C14 is selected to achieve resonance between the collector 144 of Q1 and the intermediate junction 190 at the predefined operating frequency. Furthermore, the size or geometry of the transistor Q4 is based upon the minimal resistance parameters between the collector 186 and the emitter 188 while activated in the predefined operating frequency.

A bias supply voltage source V5 is connected to the collector 186 of the transistor Q4 through a series resistor R6, with a RF decoupling capacitor C12 connected to the voltage source V5 and ground. Additionally, a resistor R7 is connected between an emitter 188 of the transistor Q4 and ground. The resistors R6 and R7 are understood to settle the bias current of the transistor Q4, and sufficiently high to prevent influencing RF performance, that is, higher than the resistance between the collector 144 of the transistor Q1 and ground, as well between the intermediate junction 190 and ground. Connected in series with the capacitor C9 and the inductor L10 is a capacitor C15 that has a sufficiently large value for bias de-coupling and preventing the voltage supply V2 to be shorted to the voltage supply V5, also referred to as a direct current blocking element. According to one embodiment, the reactive impedance of the capacitor C15 is approximately 5 to 10 times lower than the reactive impedance of the inductor L10 at the predefined operating frequency. The value of the inductor L10 may also be adjusted such that the impedance at the collector 144 of the transistor Q1 is substantially the same as the impedance at the base 154 of the transistor Q2 at the predefined operating frequency.

The transistor Q4 is activated and deactivated by the first control circuit 148, which includes the adjustable voltage source V1 that is tied to the general-purpose input/output line 114 of the transceiver 104. In particular, the voltage source V1 is connected to the base 184 of the transistor Q4 through a resistor R5. The resistor R5 is also understood to settle the bias current of the transistor Q4 when activated. Independent control of the transistor Q4, however, is also contemplated. Accordingly, the parallel resonant circuit 180 is understood to be active when the power amplifier 106 is active. An RF decoupling capacitor C13 is connected to the base of the transistor Q4, though RF performance may also be fine-tuned therewith, including the overall gain shape of the low noise amplifier 108 when it is active.

When the transistor Q4 is off, it is understood that the equivalent resistance is greater than 1 k Ohm. Therefore, the series impedance for the chain including capacitor C9 and the inductor L10 provides sufficient Noise Figure and matching of the low noise amplifier 108 to the antenna 102.

When the transistor Q4 is on, it is in an inverse mode, that is, the voltage at the base 184 is higher than the voltage at the collector 186. Although other configurations contemplate the use of field effect transistors in a normal, linear operation, several such transistors may be connected in series to overcome the issue of the lower breakdown voltages associated therewith. As indicated above, the inductor L10 and the capacitor C14 chain resonates at the predefined operating frequency with the transistor Q4 being on. In other words, a resonant resistance between the intermediate junction 190 and the collector 144 of the transistor Q1 is inserted in series with the capacitor C9, effectively becoming a voltage divider with the voltage being applied to the base 154 of the transistor Q3 being significantly reduced for the same power level. Along these lines, it is understood that the lower the collector-emitter resistance value of the activated transistor Q4 in series with the resonating capacitor C14, the higher the resistance between the intermediate junction 190 and the collector 144 of the transistor Q1. As such, a higher power level may be applied for the same voltage and distortion level.

Figure 16:
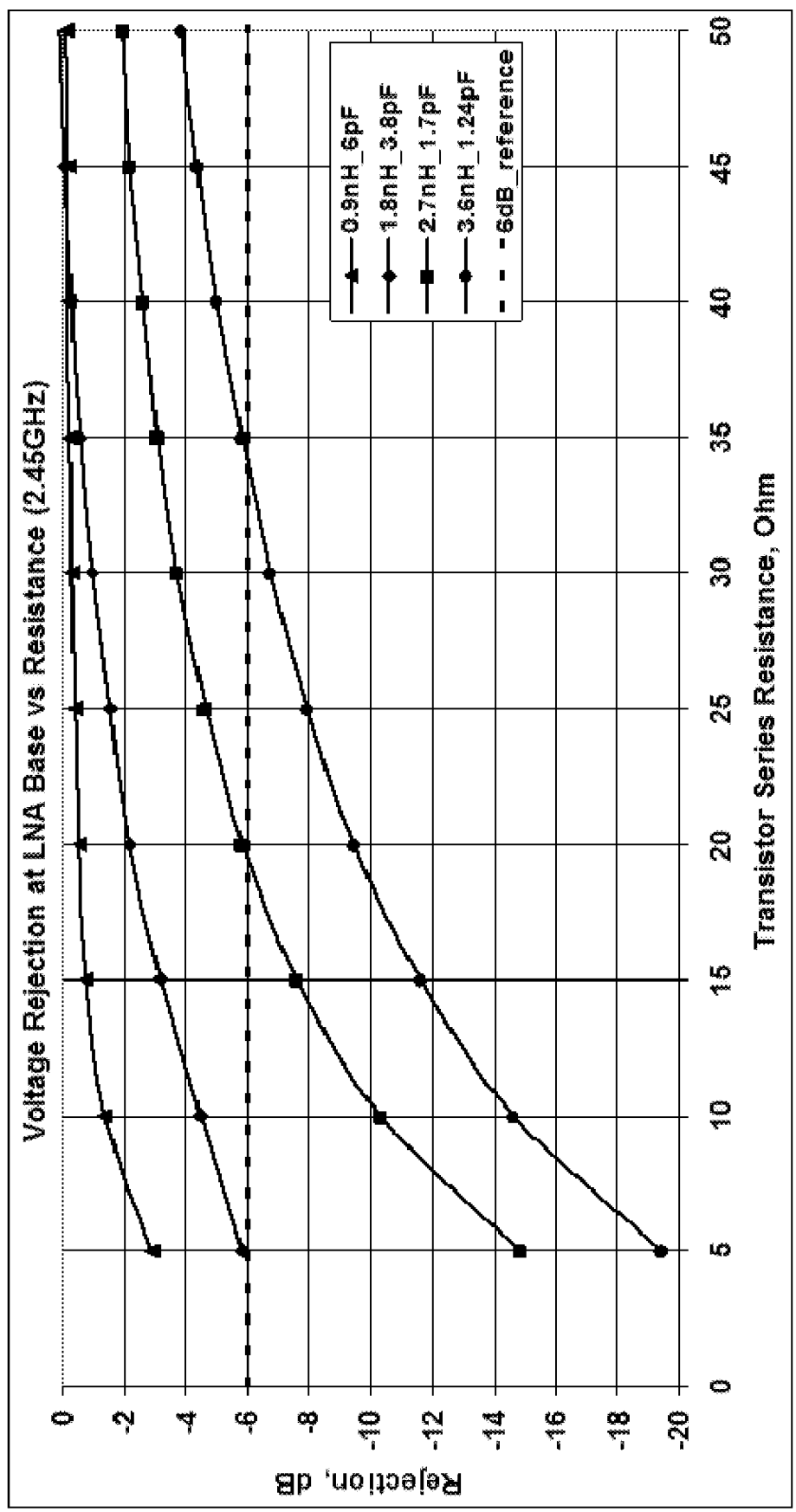
FIG. 16 is a graph plotting voltage reduction at the base of the low noise amplifier of the fourth embodiment of the front end circuit.

The graph of FIG. 16 illustrates the simulated decrease in the voltage level at the base 154 of the transistor Q2 for different values of the capacitor C9 and inductor L10 chain. As will be appreciated, the voltage rejection in dB corresponds to the output power level increase.

Figure 17:
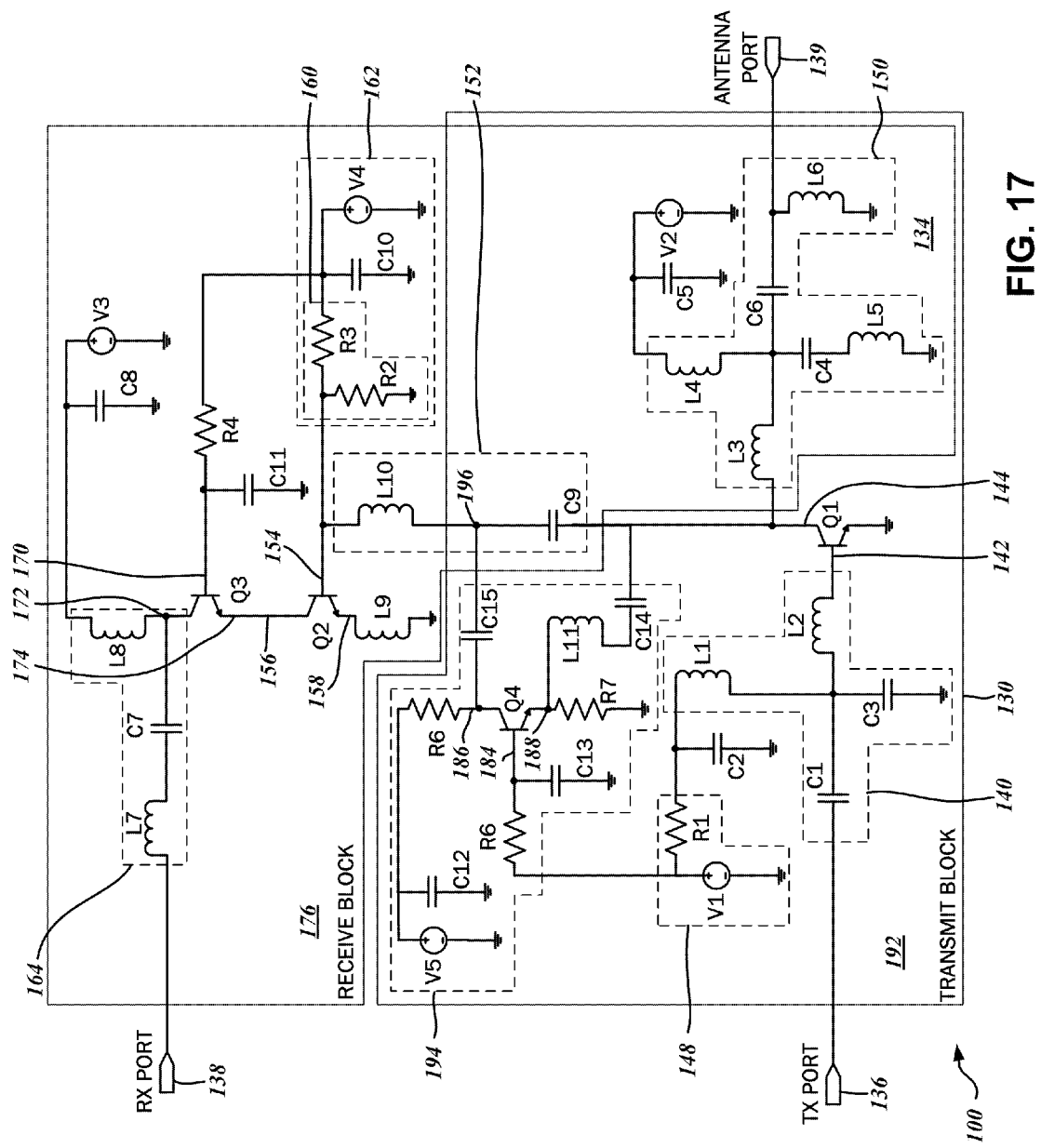
FIG. 17 is a schematic diagram of a fifth embodiment of the front end circuit with the parallel resonant circuit in a second configuration.

With reference to the schematic diagram of FIG. 17, a fifth embodiment of the front end circuit 100 includes a transmit block 192, the receive block 176, and the shared transmit/receive block 134 that generally corresponds to the matching network 118. The transmit block 192 includes the TX (transmit) port 136 that is connected to the transmit line 110 from the transceiver 104, and the receive block 176 includes the RX (receive) port 138 that is connected to the receive line 112 to the transceiver 104. The shared transmit/receive block 134 includes the antenna port 139 for coupling the front end circuit 100 to the antenna 102.

The features of the transmit block 192 are substantially similar to the embodiments of the front end circuit 100 previously described, and includes the single-stage power amplifier 106 with the transistor Q1 in a common emitter configuration. However, there are a number of variations as will be detailed more fully below. It is understood that multi-stage amplifiers may also be utilized for higher gain applications.

The power amplifier 106 includes the power amplifier input matching network 140, which is understood to match the transmit port 136 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1. Other suitable supply architectures besides the voltage supply circuit, such as a current mirror, may be substituted.

The transmit block 192, via the collector 144 of the transistor Q1, is connected to the shared transmit and receive block 176 that generally corresponds to the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 176, including the low noise amplifier input matching segment 152 of the matching network 118, is disconnected.

The shared transmit and receive block 134 is also connected to the receive block 176, which includes the low noise amplifier 108 and other associated circuitry. The receive block 176 includes the transistor Q2, likewise in a common-emitter configuration. The matching network 118 includes the low noise amplifier input matching segment 152 that is combined with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

The low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3. The collector 172 of the transistor Q3 is connected to the low noise amplifier output matching network 164, which in turn is connected to the receive port 138. The transceiver 104 is thus impedance matched to the low noise amplifier 108. Further details relating to the receive block 176 having the cascode configuration are considered above.

The fifth embodiment of the front end circuit 100, like the fourth embodiment, contemplates the reduction of voltage swing at the input of the low noise amplifier 108 when the power amplifier 106 is on and transmitting. In this regard, another parallel resonant circuit 194 is inserted between the collector 144 of the transistor Q1 and the base 154 of the transistor Q2. The parallel resonant circuit 194, with its low impedance during activation of the transistor Q4, is understood to decrease voltage swing at the base 154 of the transistor Q2. This allows higher linear transmit power levels, particularly where the resistive part of the transistor Q2 input impedance cannot be further decreased. As will be detailed below, the parallel resonant circuit 180 is essentially comprised of the inductor L11 and the capacitor C9, with the collector-emitter impedance of the activated transistor Q4 represents loss of the circuit.

In further detail, the parallel resonant circuit 194 includes the transistor Q4 with the collector 186 connected over a capacitor C15 to an intermediate junction 196 between the capacitor C9 and the inductor L10 of the low noise amplifier input matching segment 152, and the emitter 188 connected to the collector 144 of the transistor Q1 through the series capacitor C14 and an inductor L11. The size or geometry of the transistor Q4 is based upon the minimal resistance parameters between the collector 186 and the emitter 188 while activated in the predefined operating frequency. The capacitor C15 has a sufficiently large value for bias de-coupling and preventing the voltage supply V4 to be shorted to the voltage supply V5, also referred to as a direct current blocking element. The reactive impedance of the capacitor C15 is contemplated to be approximately 5 to 10 times lower than the reactive impedance of the inductor L11 at the predefined operating frequency. The reactive impedance of the capacitor C14 is also contemplated to be approximately 5 to 10 times lower than the reactive impedance of the inductor L11 at the predefined operating frequency. The capacitor C14 is understood to be the direct current blocking element that prevents the voltage source V2 from shorting to ground. The value of the capacitor C9 may also be adjusted such that the impedance at the collector 144 of the transistor Q1 is substantially the same as the impedance at the base 154 of the transistor Q2 at the predefined operating frequency.

The bias supply voltage source V5 is connected to the collector 186 of the transistor Q4 through the series resistor R6, with the RF decoupling capacitor C12 connected to the voltage source V5 and ground. Additionally, the resistor R7 is connected between an emitter 188 of the transistor Q4 and ground. The resistors R6 and R7 are understood to settle the bias current of the transistor Q4, and sufficiently high to prevent influencing RF performance, that is, higher than the resistance between the collector 144 of the transistor Q1 and ground, as well between the intermediate junction 196 and ground.

The transistor Q4 is activated and deactivated by the first control circuit 148, which includes the adjustable voltage source V1 that is tied to the general-purpose input/output line 114 of the transceiver 104. In particular, the voltage source V1 is connected to the base 184 of the transistor Q4 through a resistor R5. The resistor R5 is also understood to settle the bias current of the transistor Q4 when activated. Independent control of the transistor Q4, however, is also contemplated. Accordingly, the parallel resonant circuit 194 is understood to be active when the power amplifier 106 is active. An RF decoupling capacitor C13 is connected to the base of the transistor Q4, though RF performance may also be fine-tuned therewith, including the overall gain shape of the low noise amplifier 108 during receive mode.

When the transistor Q4 is off, it is understood that the equivalent resistance is greater than 1 k Ohm. Therefore, the series impedance for the chain including capacitor C9 and the inductor L10 provides sufficient Noise Figure and matching to the antenna 102.

When the transistor Q4 is on, it is in an inverse mode, that is, the voltage at the base 184 is higher than the voltage at the collector 186. Although other configurations contemplate the use of field effect transistors in a normal, linear operation, several such transistors may be connected in series to overcome the issue of the lower breakdown voltages associated therewith. The inductor L11 resonates with the capacitor C9 at the predefined operating frequency with the transistor Q4 being on. In other words, a resonant resistance between the intermediate junction 190 and the collector 144 of the transistor Q1 is inserted in series with the inductor L10, effectively becoming a voltage divider with the voltage being applied to the base 154 of the transistor Q3 being significantly reduced for the same power level. It is also understood that the lower the collector-emitter resistance value of the activated transistor Q4 in series with the resonating inductor L11, the higher the resistance between the intermediate junction 190 and the collector 144 of the transistor Q1. As such, a higher power level may be applied for the same voltage and distortion level.

Figure 18:
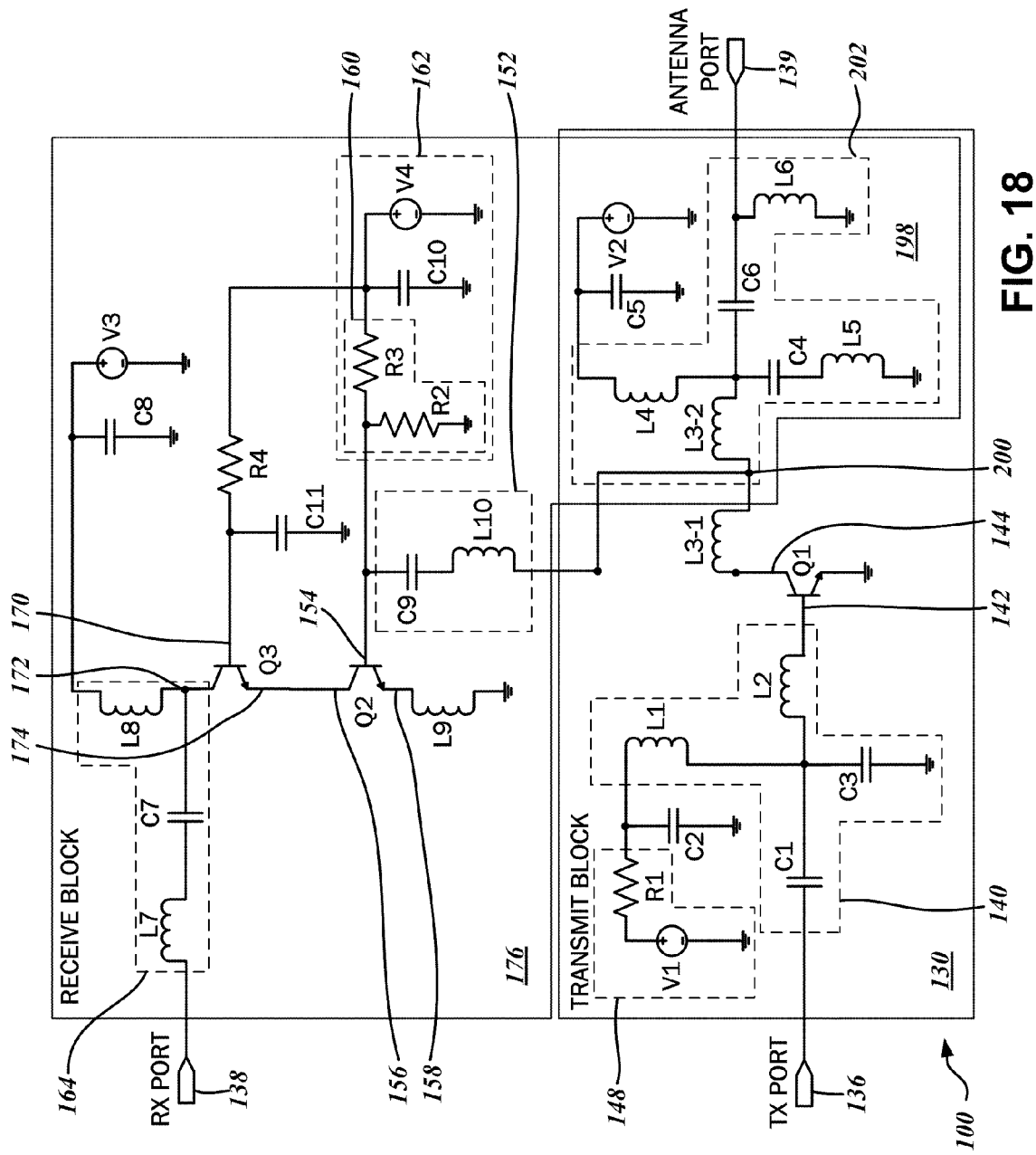
FIG. 18 is a schematic diagram of a sixth embodiment of the front end circuit with a matching circuit voltage divider in a first configuration.

Referring to the schematic diagram of FIG. 18, a sixth embodiment of the front end circuit 100 includes the transmit block 130, the receive block 176, and a shared transmit/receive block 198 that generally corresponds to the matching network 118. The transmit block 130 includes the TX (transmit) port 136 that is connected to the transmit line 110 from the transceiver 104, and the receive block 176 includes the RX (receive) port 138 that is connected to the receive line 112 to the transceiver 104. The shared transmit/receive block 198 includes the antenna port 139 for coupling the front end circuit 100 to the antenna 102.

The power amplifier 106 includes the power amplifier input matching network 140, which is understood to match the transmit port 136 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 130, via the collector 144 of the transistor Q1, is connected to the shared transmit and receive block 198 that generally corresponds to the matching network 118. The matching network 118 is defined at least in part by another embodiment of a power amplifier output matching segment 202 that includes additional components as will be described below, which impedance matches the transistor Q1 to the antenna 102 at the predefined operating frequency when active. The power amplifier output matching segment 202 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 202 is loaded at the antenna side by a predefined load while the receive block 166, including the low noise amplifier input matching segment 152 of the matching network 118, is disconnected.

The shared transmit and receive block 198 is also connected to the receive block 176, which includes the low noise amplifier 108 and other associated circuitry. The receive block 176 includes the transistor Q2, likewise in a common-emitter configuration. The matching network 118 includes the low noise amplifier input matching segment 152 that is combined in part with the power amplifier output matching segment 202 to impedance match the low noise amplifier 108 to the antenna 102 when active. The various optimizations relating to the low noise amplifier 108 and the low noise amplifier input matching segment 152 previously discussed are applicable to this embodiment.

The sixth embodiment of the front end circuit 100 contemplates an intermediate junction 200 that couples the low noise amplifier input matching segment 152 and the power amplifier output matching segment 202 and includes a voltage divider network. This is understood to decrease voltage swing at the base-emitter junction of the transistor Q2 when a large signal is applied thereto. More particularly, an inductor L3-1 is connected to the collector 144 of the transistor Q1, and an inductor L3-2 is, in turn, connected to the inductor L3-1. The point between the inductor L3-1 and the inductor L3-2 is understood to define the intermediate junction 200, to which the low noise amplifier input matching segment 152 is connected.

The inductor L3-2 is connected to the inductors L4, L5, and L6, and capacitors C4 and C6, which are the parts of the power amplifier output matching segment 202 that, together with the low noise amplifier input matching segment 152, impedance match the low noise amplifier 108 to the antenna 102. In other words, the inductor L3-1 is excluded from the receive chain. The inductor L3-1 completes the power amplifier matching segment 202. The inductors L3-1 and L3-2 define a voltage divider that delivers a lower voltage to the base 154 of the transistor Q2 when the power amplifier 106 is activated. The values of the inductors L3-1 and L3-2 are selected to satisfy the power amplifier linearity parameters as set forth above, and the total inductance value for purposes of the power amplifier output matching segment 202 is understood to be a combination of the two. The values of the capacitor C9 and the inductors L10, L3-1, and L3-2 are selected to reach a minimal noise figure (NF) between the antenna 102 and the output of the low noise amplifier 108, as well as a minimal input return loss for an activated transistor Q2 and a deactivated transistor Q1.

Figure 6A:
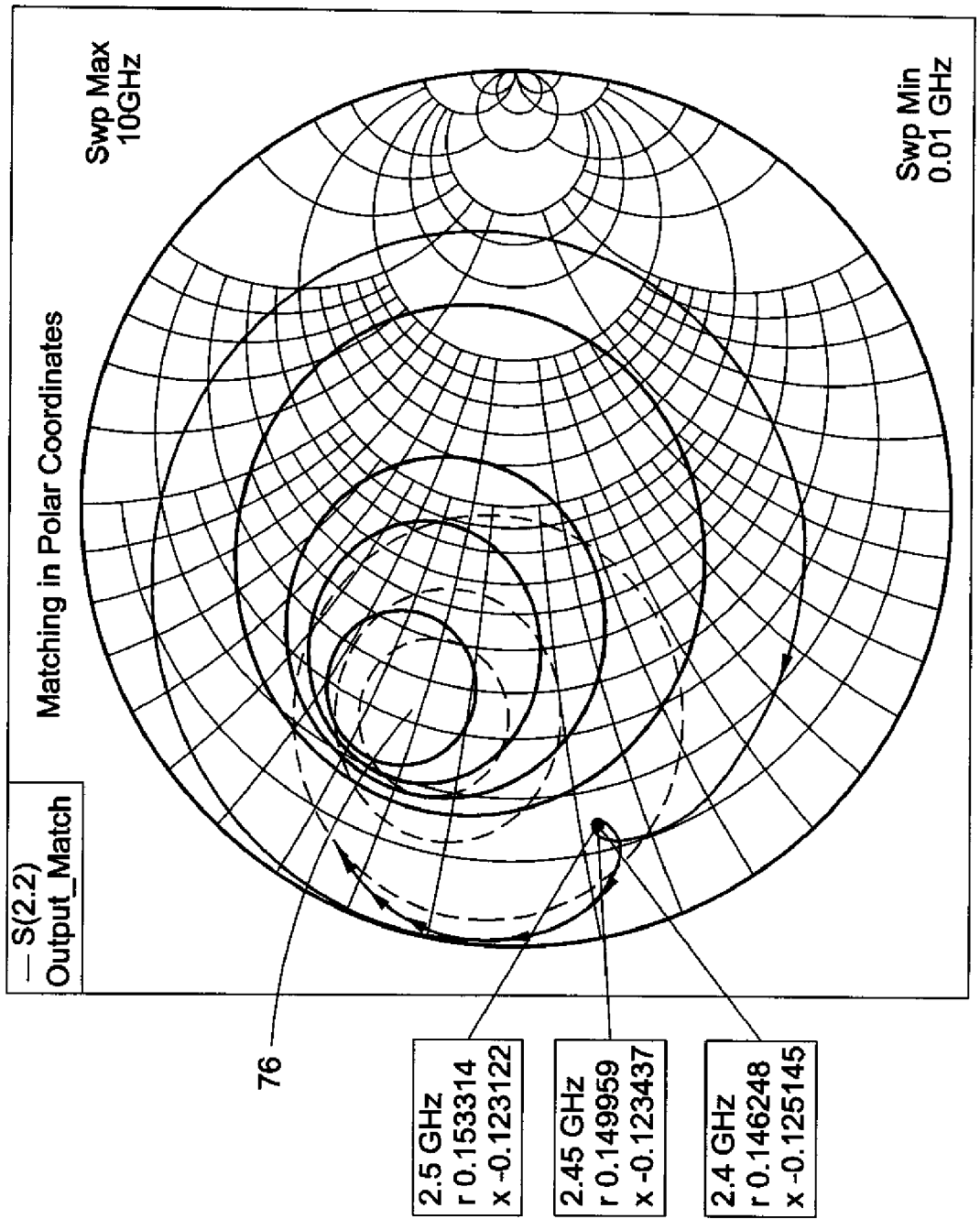
FIGS. 6A-6D are Smith Charts of an exemplary matching of the transistor Q1.
Figure 6B:
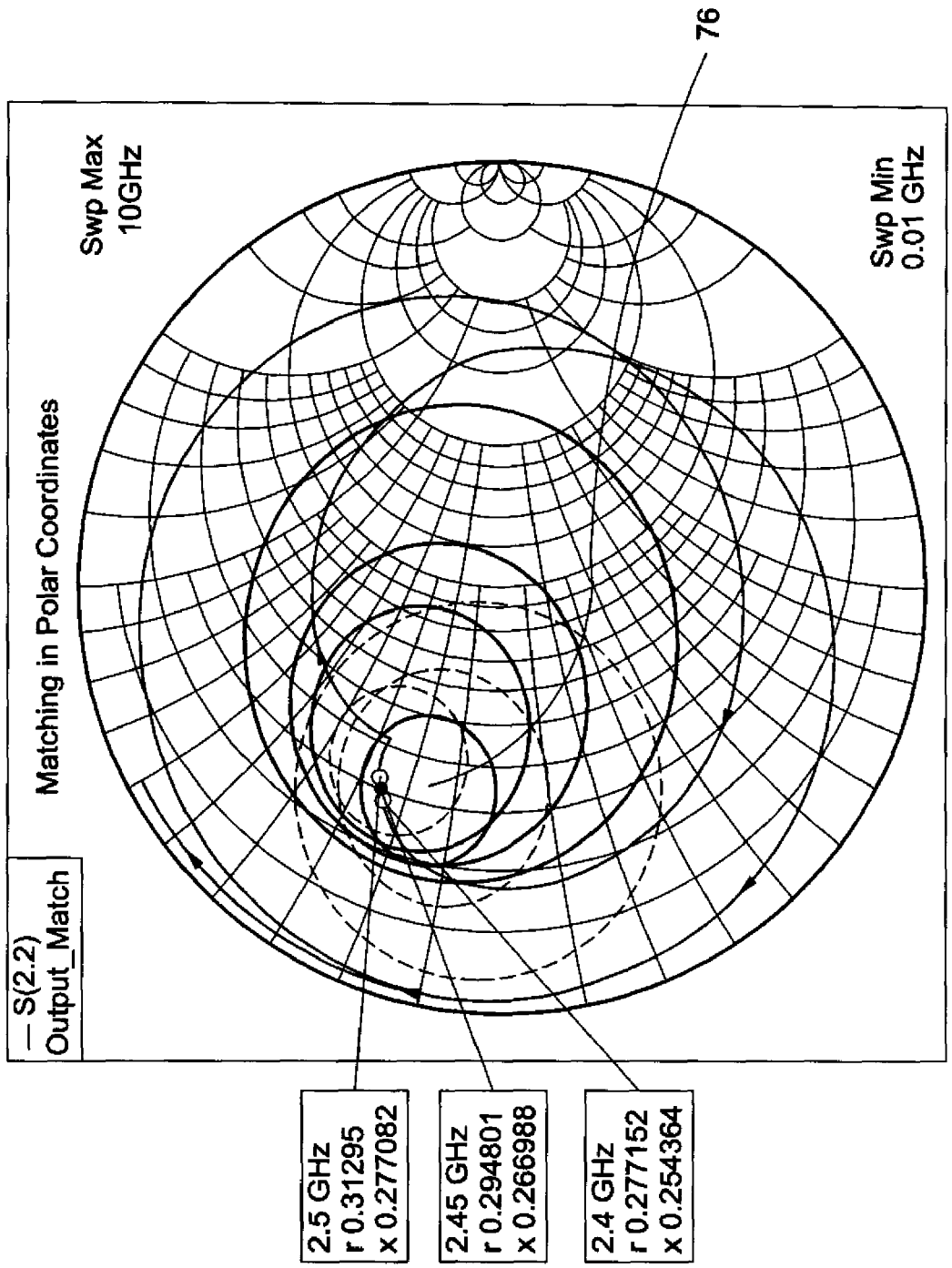
Figure 6C:
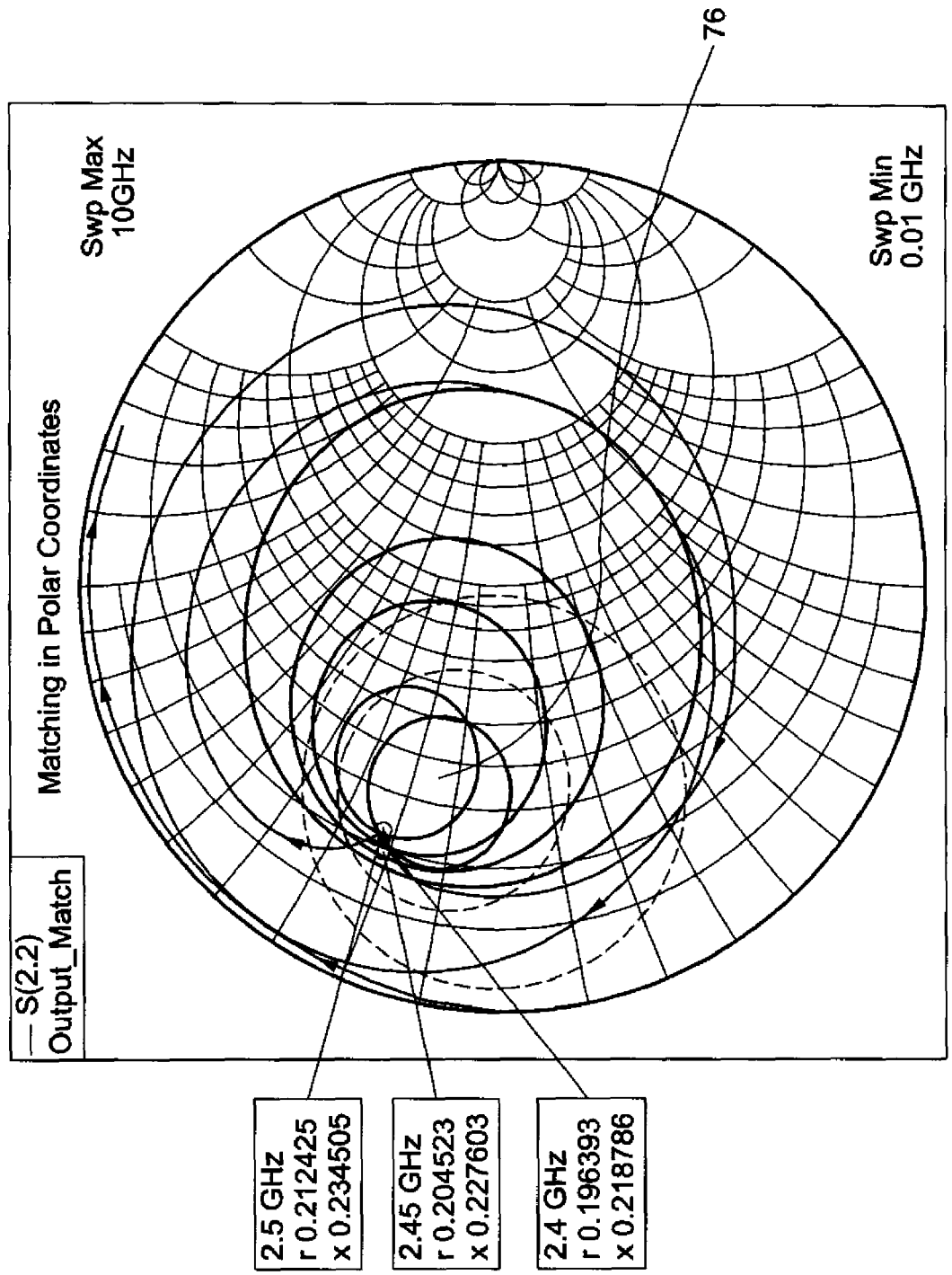
Figure 6D:
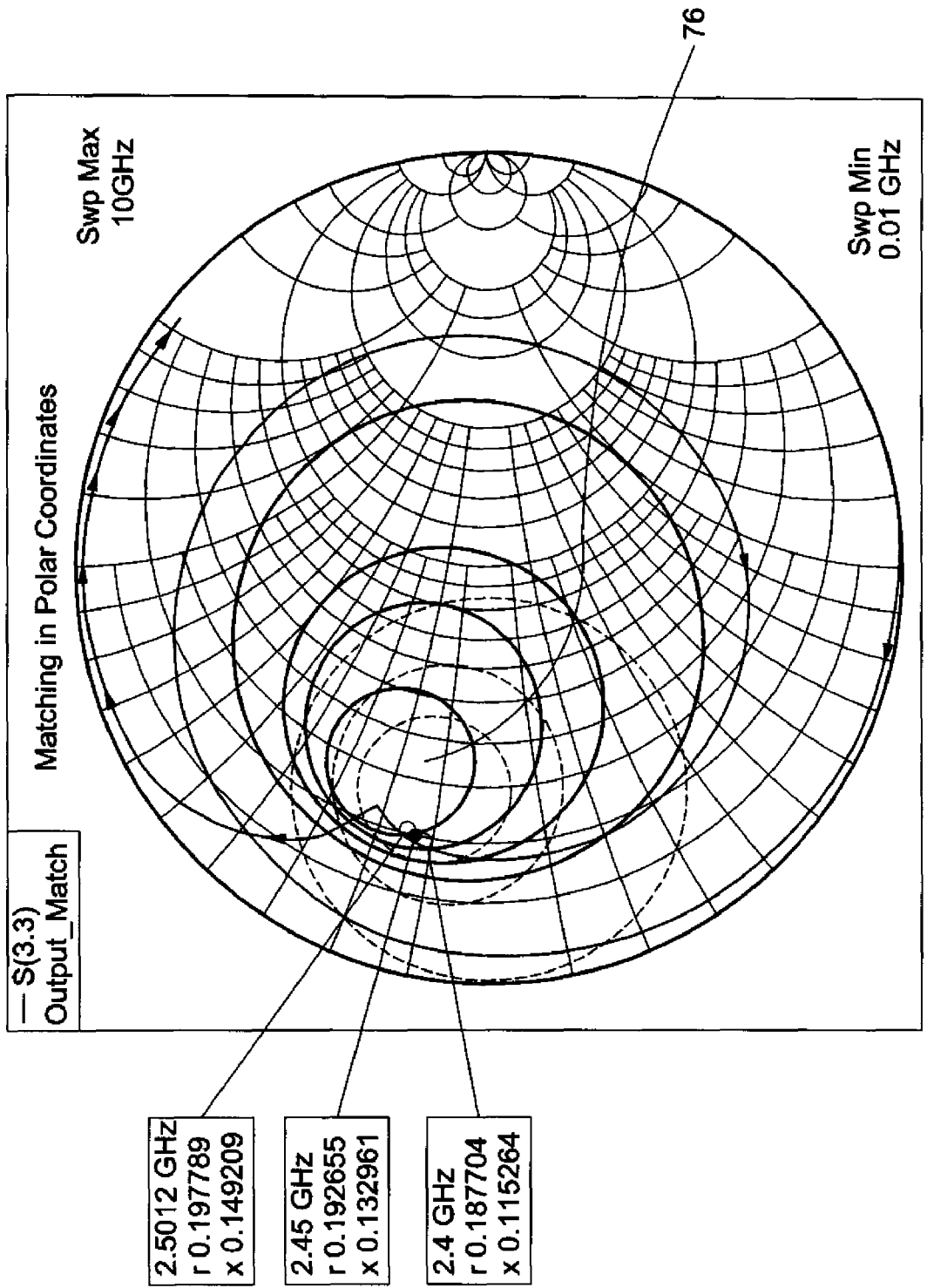

FIGS. 6A-6D are Smith charts illustrating an exemplary matching of the transistor Q1, with each having the aforementioned NF and input return loss circles overlaid thereon for reference. In the particular example of FIG. 6A, the impedance at the collector 144 of the transistor Q1 is charted, and shows that the circuit is capacitive at the predefined operating frequency of 2.4 to 2.5 GHz. In this example, the inductors L1 and L2 both have a zero value. Accordingly, a series inductor may be added to bring the impedance to the overlapping section 76 where NF and input return loss values for the low noise amplifier 108 are sufficient as noted above. Referring to FIG. 6B, the introduction of the inductor L2 having a value of 1.2 nH results in the impedance at the collector 144 of the transistor Q1 falling inside the overlapping section 76, which corresponds to sufficient NF and input return loss figures. The Smith chart of FIG. 6C illustrates an example where splitting the inductor L3 to L1(L3-1) and L2(L3-2), with each having equal values of 06 nH, results in the impedance at the collector 144 of the transistor Q1 falling inside the overlapping section 76. With the attendant reduction in resistance at the collector 144 of the transistor Q1, a higher power output may be possible, as well as a reduction in voltage swing. The same matching parameters from the base 142 of the transistor Q1 is charted in FIG. 6D. In further detail, the resulting matching has the same resistive part of as for the collector 144, though there are some differences with respect to the reactive part.

Figure 7A:
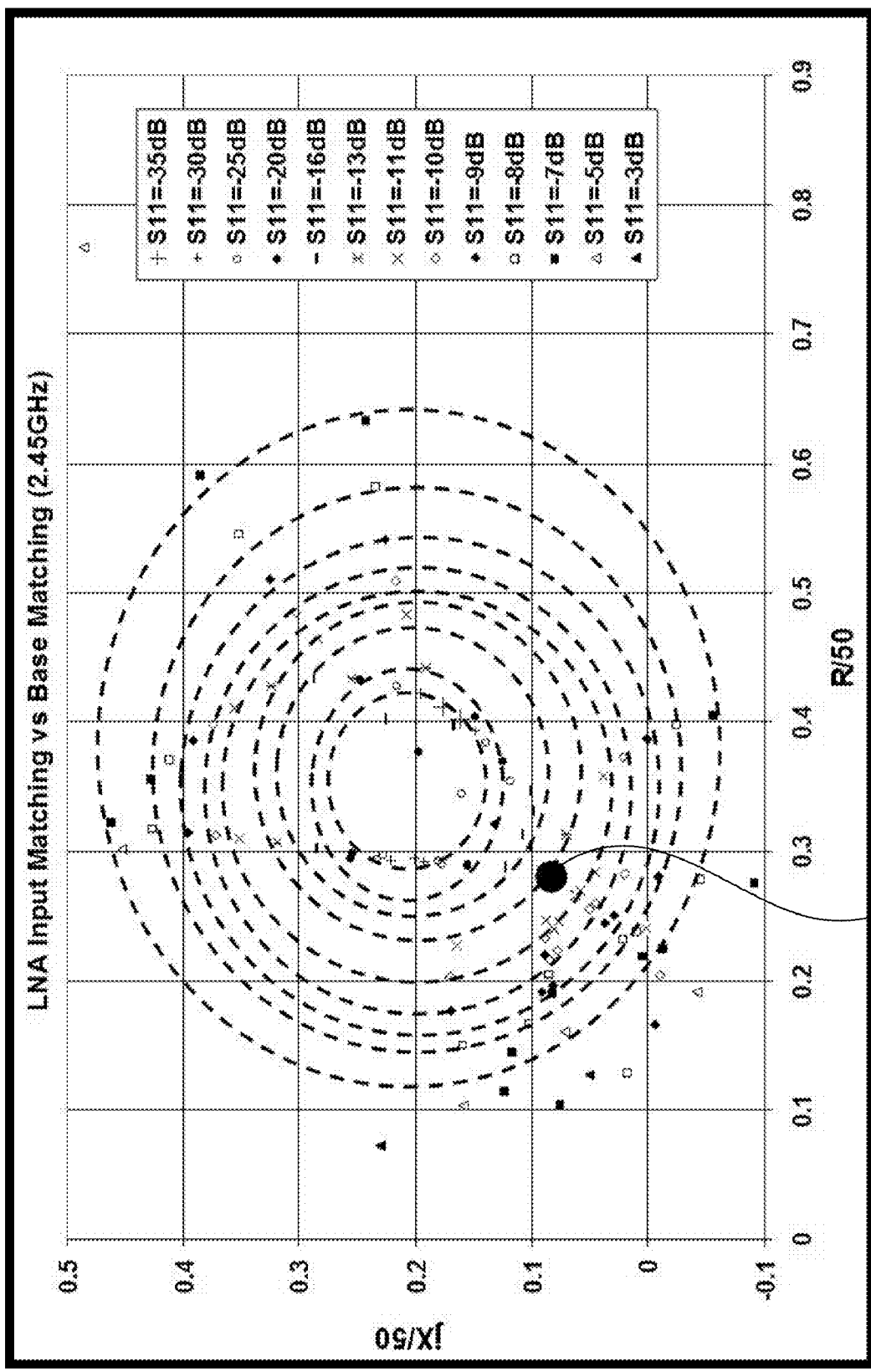
FIG. 7A shows simulated results for a tuned matching circuit variously plotting the base impedance matching against the low noise amplifier input matching.
Figure 7B:
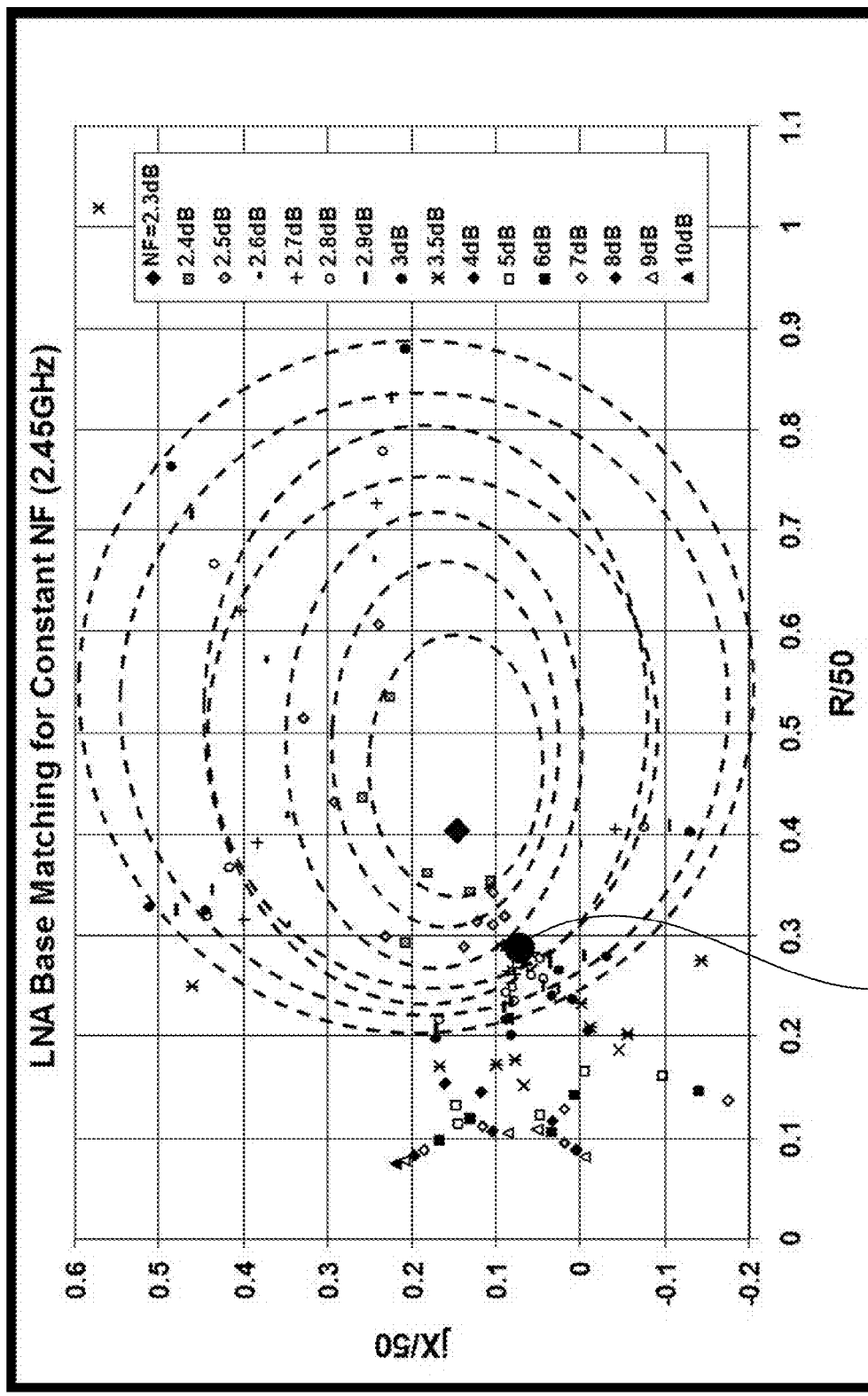
FIG. 7B shows simulated results for the low noise amplifier base matching for constant NF.
Figure 7C:
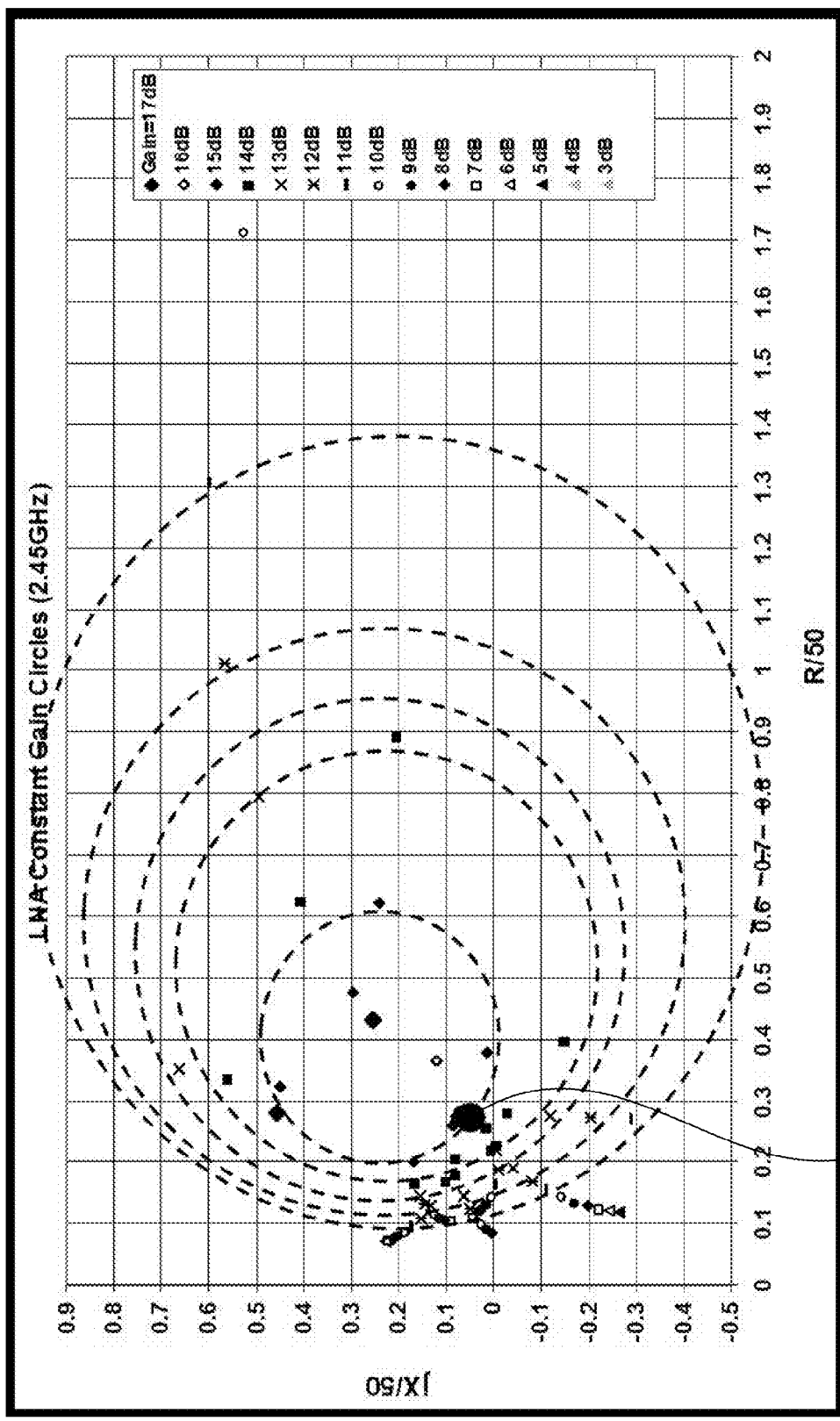
FIG. 7C shows simulated results for the low noise amplifier base matching with constant gain circles.

FIG. 7A is a graph illustrating a simulated result of low noise amplifier 108 input matching versus base matching in a dual stage power amplifier architecture and matching circuit as configured above. The rectangular coordinates are referenced to 50 Ohms, and the appropriate matching points at the antenna port 139 are measured. The marked location 78 represents a matching point chosen for 1 dB compression point of 24.3 dBm. Furthermore, FIG. 7B is a graph showing the simulated results to noise figure circles. The marked location 78 also represents the selection of matching parameters having sufficient input return loss and noise figure values for a particular transmit performance. FIG. 7C is a graph showing the simulated results to constant gain circles.

Figure 11:
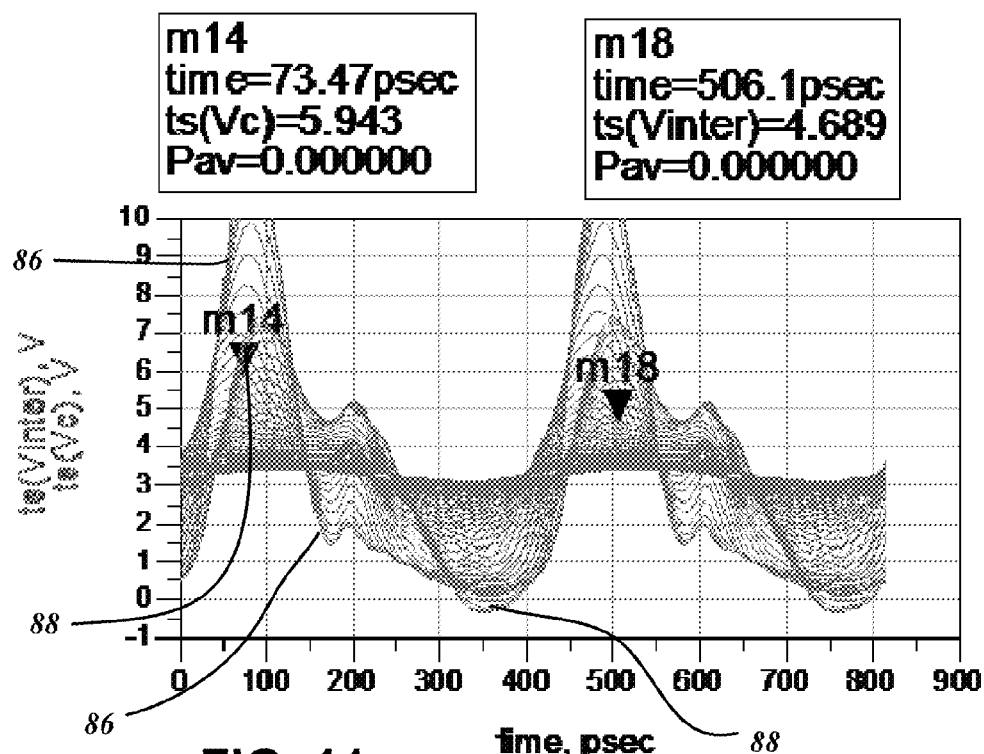
FIG. 11 is a graph of voltage swing at different power levels.
Figure 12:
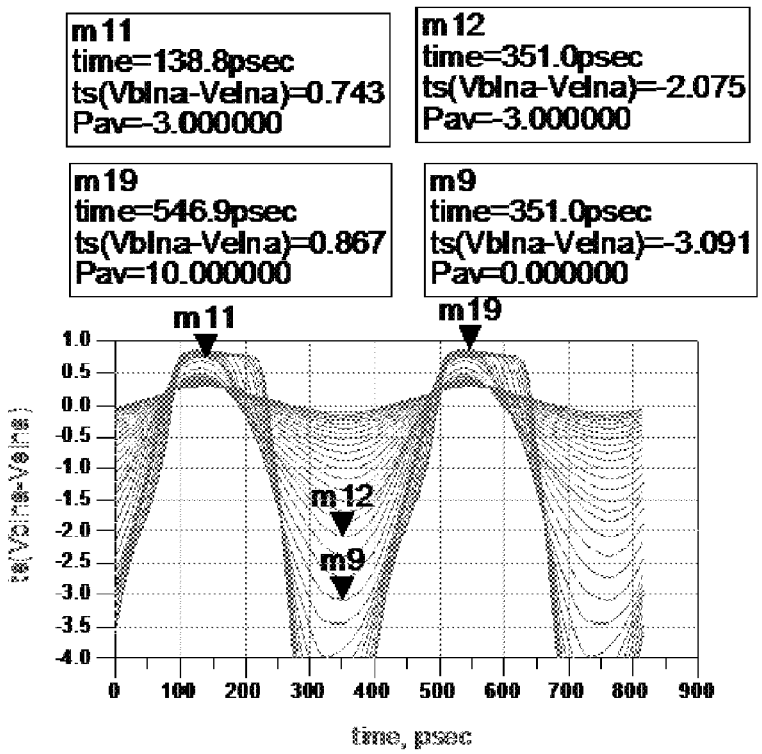
FIG. 12 is a graph of the low noise amplifier transistor base-emitter voltage at different power levels.

The graph of FIG. 11 is a simulated result showing voltages from the power amplifier 106 in accordance with one embodiment for different output power levels at 3.3V bias. Plot 86 represents the voltage at the collector 144 of the transistor Q1, while plot 88 represents a node between the inductors L1 and L2. These plots show that the voltage at the collector 144 typically exceeds the turn-on voltage of the low noise amplifier transistor Q2. The graph of FIG. 12, on the other hand, illustrates that when the voltage swing from the power amplifier transistor Q1 is in the forward direction at the base-emitter diode of the transistor Q2, its peak level could be much less than in the reverse direction.

The low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3. The collector 172 of the transistor Q3 is connected to the low noise amplifier output matching network 164, which in turn is connected to the receive port 138. The transceiver 104 is thus impedance matched to the low noise amplifier 108. Further details relating to the receive block 176 having the cascode configuration are considered above.

Figure 19:
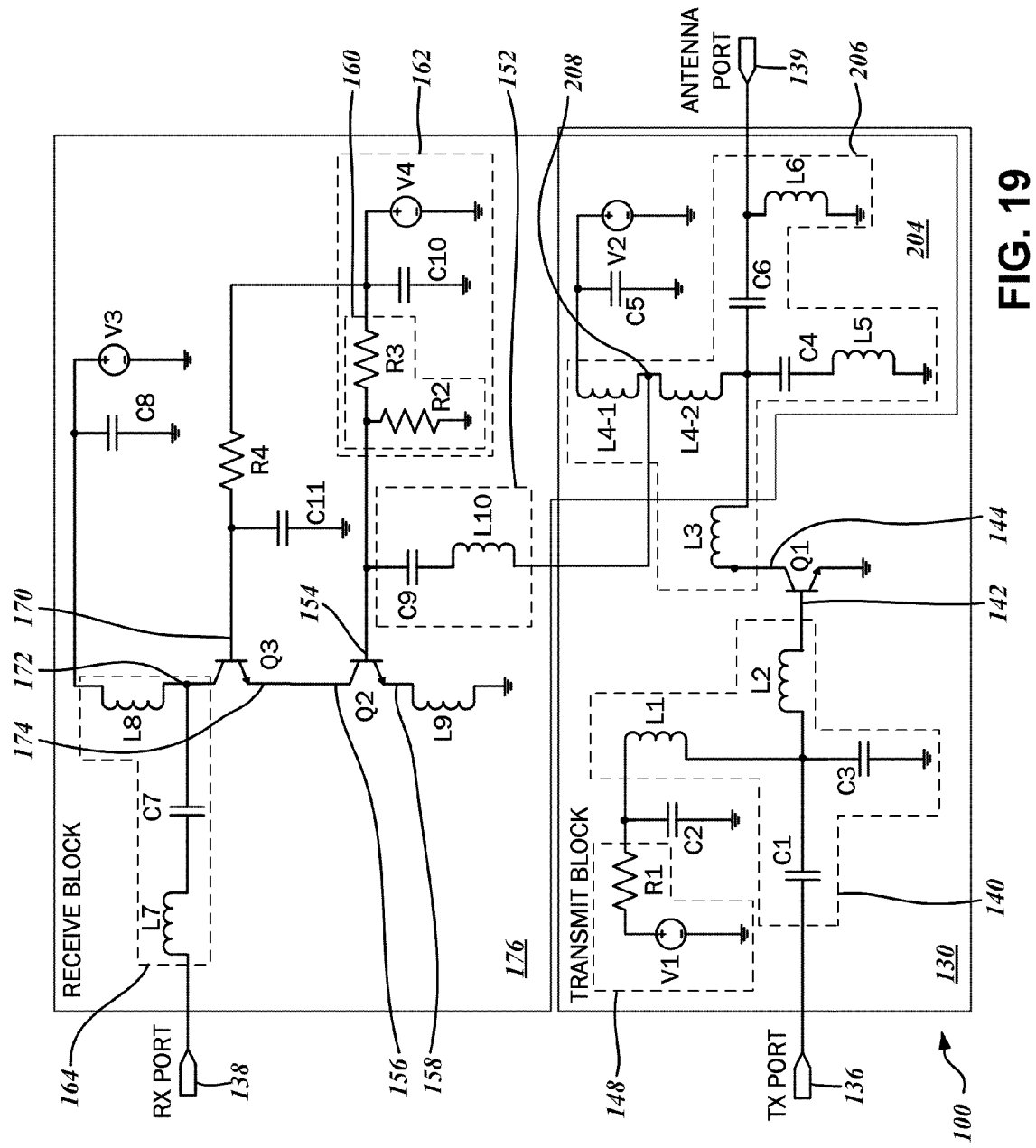
FIG. 19 is a schematic diagram of a seventh embodiment of the front end circuit with the matching circuit voltage divider in a second configuration.

As shown in the schematic diagram of FIG. 19, a seventh embodiment of the front end circuit 100 includes the transmit block 130, the receive block 176, and a shared transmit/receive block 204 that generally corresponds to the matching network 118. The transmit block 130 includes the TX (transmit) port 136 that is connected to the transmit line 110 from the transceiver 104, and the receive block 176 includes the RX (receive) port 138 that is connected to the receive line 112 to the transceiver 104. The shared transmit/receive block 204 includes the antenna port 139 for coupling the front end circuit 100 to the antenna 102.

The power amplifier 106 includes the power amplifier input matching network 140, which is understood to match the transmit port 136 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 130, via the collector 144 of the transistor Q1, is connected to the shared transmit and receive block 204 that generally corresponds to the matching network 118. The matching network 118 is defined at least in part by yet another embodiment of a power amplifier output matching segment 206, which impedance matches the transistor Q1 to the antenna 102 at the predefined operating frequency when active. The power amplifier output matching segment 206 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 206 is loaded at the antenna side by a predefined load while the receive block 166, including the low noise amplifier input matching segment 152 of the matching network 118, is disconnected.

The shared transmit and receive block 204 is also connected to the receive block 176, which includes the low noise amplifier 108 and other associated circuitry. The receive block 176 includes the transistor Q2, likewise in a common-emitter configuration. The matching network 118 includes the low noise amplifier input matching segment 152 that is combined in part with the power amplifier output matching segment 202 to impedance match the low noise amplifier 108 to the antenna 102 when active. The various optimizations relating to the low noise amplifier 108 and the low noise amplifier input matching segment 152 previously discussed are applicable to this embodiment.

The seventh embodiment of the front end circuit 100 contemplates an intermediate junction 208 that couples the low noise amplifier input matching segment 152 and the power amplifier output matching segment 150 and includes a voltage divider network. This is understood to decrease voltage swing at the base-emitter junction of the transistor Q2 when a large signal is applied thereto. As an initial matter, the inductor L3 is connected to the collector 144 of the transistor Q1, which in turn is connected to the capacitors C4 and C6, as well as to an inductor L4-2. The low noise amplifier input matching segment 152 is connected to an intermediate junction 208 defined by the inductor L4-2 and an inductor L4-1. It is understood that the inductors L4-1 and L4-2 is a voltage divider that delivers a lower RF voltage to the base 154 of the transistor Q2.

The parts of the power amplifier output matching segment 206, including the inductors L4-1, L4-2, L5, and L6, and capacitors C4 and C6, in conjunction with the low noise amplifier input matching segment 152, are understood to impedance match the low noise amplifier 108 to the antenna 102. The values of the inductors L4-1 and L4-2 are selected to satisfy the power amplifier linearity parameters as set forth above, and the total inductance value for purposes of the power amplifier output matching segment 206 is understood to be a combination of the two. Furthermore, the values of the capacitor C9 and the inductors L10, L4-1, and L4-2 are selected to reach a minimal noise figure (NF) between the antenna 102 and the output of the low noise amplifier 108, as well as a minimal input return loss for an activated transistor Q2 and a deactivated transistor Q1.

The low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3. The collector 172 of the transistor Q3 is connected to the low noise amplifier output matching network 164, which in turn is connected to the receive port 138. The transceiver 104 is thus impedance matched to the low noise amplifier 108. Further details relating to the receive block 176 having the cascode configuration are considered above.

Figure 20:
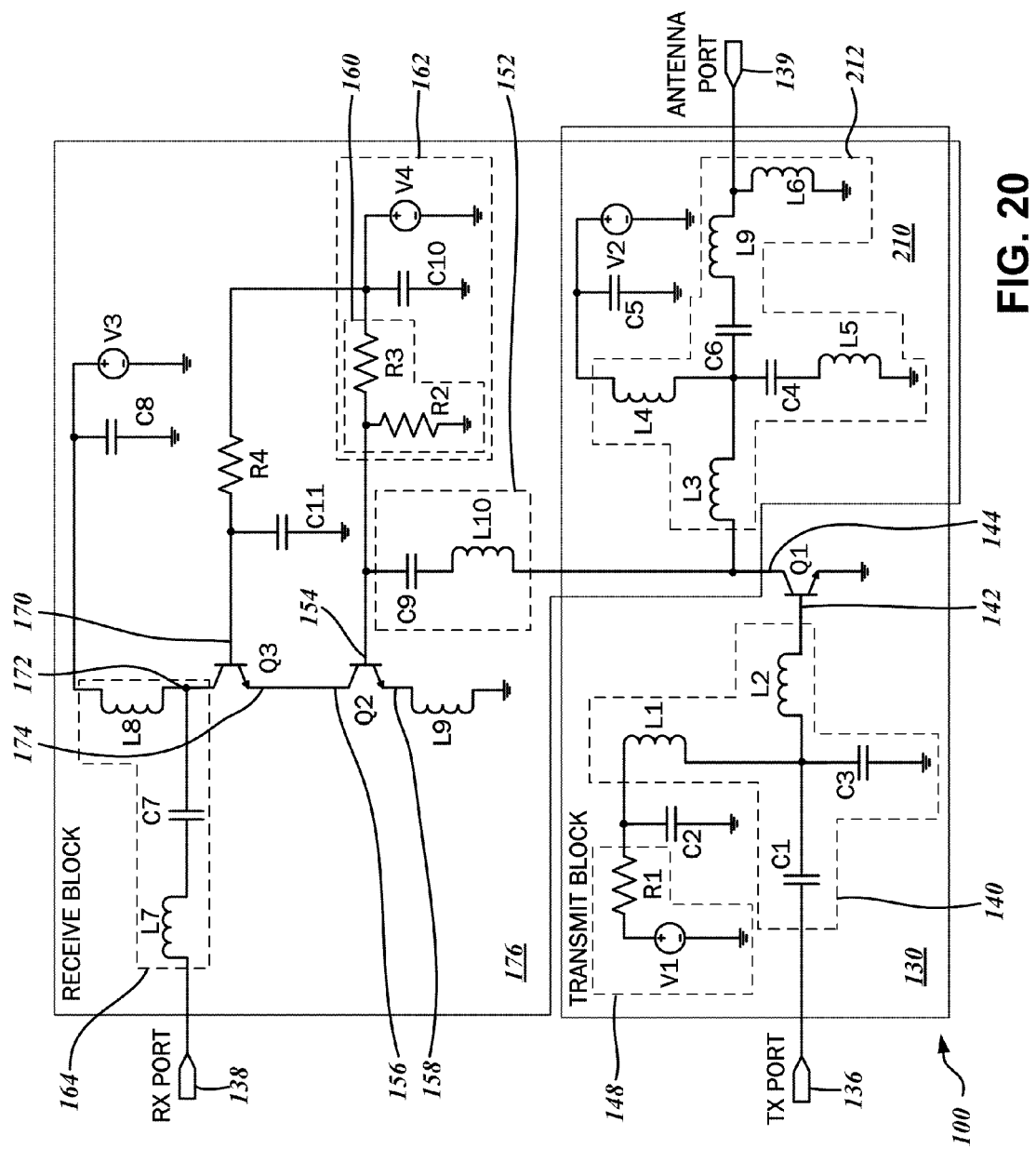
FIG. 20 is a schematic diagram of an eighth embodiment of the front end circuit with another variation of the matching circuit including a series inductor-capacitor chain.

With reference to the schematic diagram of FIG. 20, an eighth embodiment of the front end circuit 100 includes the transmit block 130, the receive block 176, and a shared transmit/receive block 210 that generally corresponds to the matching network 118. The transmit block 130 includes the TX (transmit) port 136 that is connected to the transmit line 110 from the transceiver 104, and the receive block 176 includes the RX (receive) port 138 that is connected to the receive line 112 to the transceiver 104. The shared transmit/receive block 204 includes the antenna port 139 for coupling the front end circuit 100 to the antenna 102.

The features of the transmit block 130 are substantially similar to that of the various embodiments of the front end circuit 100 described above, and includes the single-stage power amplifier 106 with the transistor Q1 in a common emitter configuration. It is understood that multi-stage amplifiers may also be utilized for higher gain applications.

The power amplifier 106 includes the power amplifier input matching network 140, which is understood to match the transmit port 136 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 130, via the collector 144 of the transistor Q1, is connected to the shared transmit and receive block 210 that generally corresponds to the matching network 118. The matching network 118 is defined at least in part by yet another embodiment of a power amplifier output matching segment 212, which impedance matches the transistor Q1 to the antenna 102 at the predefined operating frequency when active. The power amplifier output matching segment 212 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 212 is loaded at the antenna side by a predefined load while the receive block 176, including the low noise amplifier input matching segment 152 of the matching network 118, is disconnected.

The shared transmit and receive block 210 is also connected to the receive block 176, which includes the low noise amplifier 108 and other associated circuitry. More particularly, the receive block 176 includes the transistor Q2, likewise in a common-emitter configuration. The matching network 118 includes the low noise amplifier input matching segment 152 that is combined in part with the power amplifier output matching segment 202 to impedance match the low noise amplifier 108 to the antenna 102 when active. The various optimizations relating to the low noise amplifier 108 and the low noise amplifier input matching segment 152 previously discussed are applicable to this embodiment.

The matching network 118 is defined by a power amplifier output matching segment 212 that includes inductors L3, L4, L5, L6 and L9, as well as capacitors C4 and C6. The power amplifier output matching segment 212 impedance matches the transistor Q1 to the antenna 102 at the predefined operating frequency when active. The collector 144 of the transistor Q1 is connected to the inductor L3, which in turn is connected to capacitors C4, C6, and the inductor L4. The inductor L9 is connected in series with the capacitor C6 to the antenna port 139. The inductor L9 and the capacitor C6 are selected to have the same in-band reactive impedance as the other embodiments of the matching network 118. The addition of the inductor L9 is understood to be for the adjustment of the out-of-band gain shape in either transmit or receive modes.

The matching network 118 also includes the low noise amplifier input matching segment 152, which is comprised of the capacitor C9 and an inductor L10 that are exclusive thereto. The low noise amplifier input matching segment 152 is combined with the inductors L3, L4, L5, and L6 and capacitors C4 and C6, which are shared with the power amplifier output matching segment 212, to impedance match the low noise amplifier 108 to the antenna 102 while active and having a minimized noise figure. The capacitor C9 and the inductor L10 are connected in series to the collector of the transistor Q1 and a base 154 of the transistor Q2.

The low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3. The collector 172 of the transistor Q3 is connected to the low noise amplifier output matching network 164, which in turn is connected to the receive port 138. The transceiver 104 is thus impedance matched to the low noise amplifier 108. Further details relating to the receive block 176 having the cascode configuration are considered above.

Figure 21:
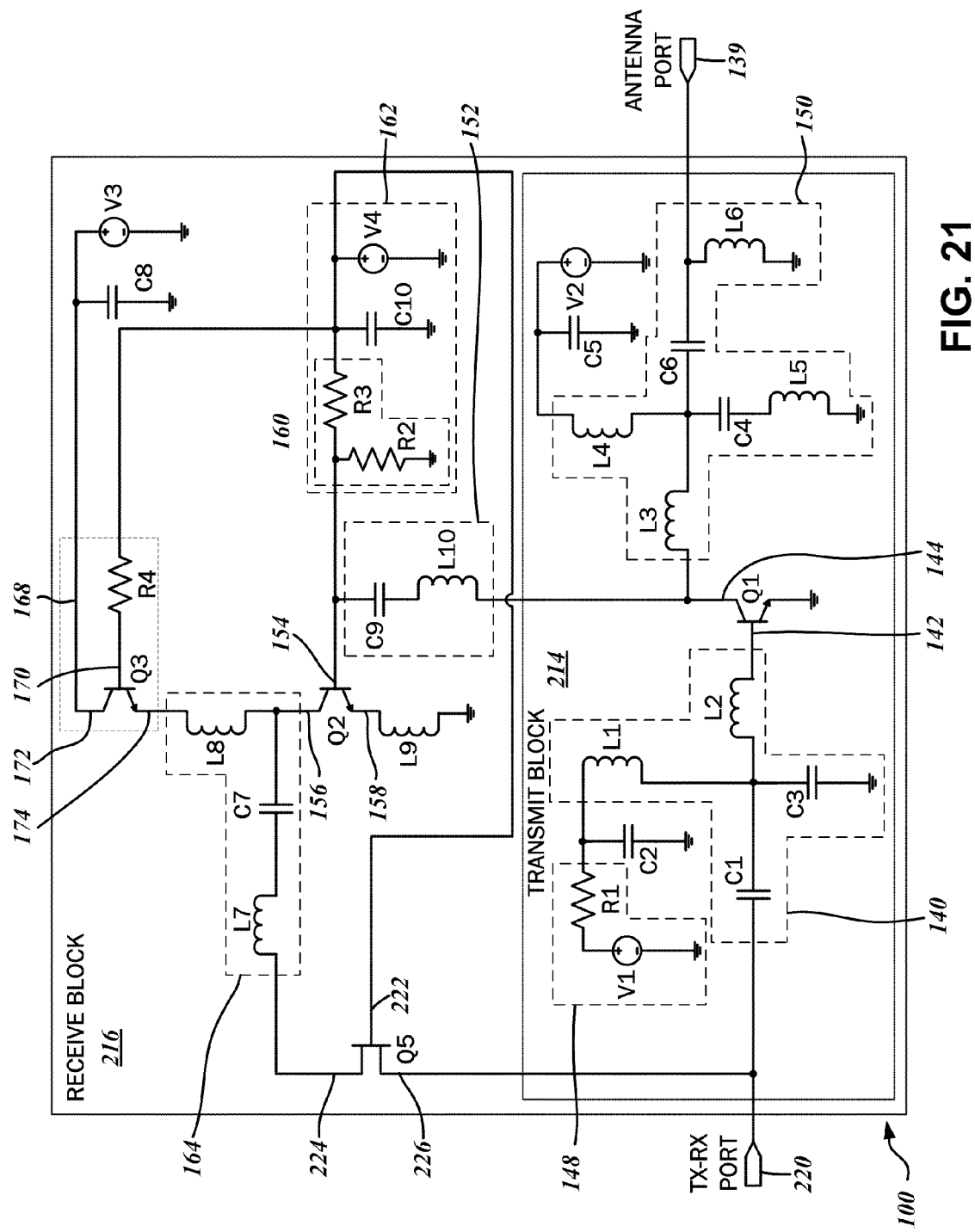
FIG. 21 is a schematic diagram of a ninth embodiment of the front end circuit configured for a single transmit-receive port transceiver and including a low noise amplifier switching transistor operating with the direct current bias switch.

FIG. 21 is a circuit schematic of a ninth embodiment of the front end circuit 100 that is suitable for use in connection with the transceiver 104 having a common transmit/receive line 116. This front end circuit 100 is generally defined by a transmit block 214 and a receive block 216, both of which share components, including a common transceiver port 220 that is connectible to the common transmit/receive line 116 and an antenna port 139 for coupling the front end circuit 100 to the antenna 102.

The components of the transmit block 214 are substantially similar to that of the various embodiments of the front end circuit 100 described above, in particular, the second embodiment shown in FIG. 13. There is a single-stage power amplifier 106 with the transistor Q1 in a common emitter configuration. It is understood that multi-stage amplifiers may also be utilized for higher gain applications.

The power amplifier 106 includes the power amplifier input matching network 140, which is understood to match the common transceiver port 220 to the base 142 of the transistor Q1 while it is being turned on and off in the predefined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 214, via the collector 144 of the transistor Q1, is connected the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 216, including the low noise amplifier input matching segment 152 of the matching network 118, is disconnected.

The receive block 216 includes the transistor Q2, likewise in a common-emitter configuration, and is connected to the matching network 118. The matching network 118 includes the low noise amplifier input matching segment 152 that is combined in part with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

The adjustable voltage source V4, which is connected to the base 154 of the transistor Q2, is also connected to the direct current bias switch 168. As described above, the variable voltage generated intermittently by the transceiver 104 on the general-purpose input/output line 114 is understood to activate and deactivate the transistor Q2. The present embodiment contemplates activating and deactivating the direct current bias switch 168 with the low noise amplifier 108 via the second control circuit 162 as in the illustrated embodiment, or independently.

The collector 156 of the transistor Q2 is connected to the low noise amplifier output matching network 164. The output of the low noise amplifier output matching network 164, in turn, is connected to a source 224 of the transistor Q5, which in one exemplary embodiment is a field effect transistor such as MOSFET. However, other types of transistor structures including bipolar technology may be readily substituted. The adjustable voltage source V4 is connected to a gate 222 of the transistor Q5, with its drain 226 being connected to the common transceiver port 220. As will be described more fully below, the transistor Q5 is operating as an RF switch.

When the transistors Q2 and Q3 are turned off by the second control circuit 162, so is the transistor Q5. In this state, the transistor Q5 is understood to have a high impedance of at least 1 k Ohm, so the power amplifier input matching network 140 is not influenced by the low noise amplifier 108.

When the transistor Q1 is turned off, and the low noise amplifier 108 including the transistors Q2, Q3, and Q5 are activated, the base 142 of the transistor is understood to have a high impedance of at least 1 k Ohm. Accordingly, the rest of the circuitry connected is likewise not influenced by the power amplifier 106. Furthermore, with the low noise amplifier 108 activated, the low noise amplifier output matching network 164 including inductors L7 and L8, the capacitor C7, and the impedance of the open transistor Q5, as well as the power amplifier input matching network 140 including the capacitors C1 and C3 and the inductors L1 and L2 are configured to match the impedance of the common transceiver port 220 at the predefined operating frequency. This impedance is typically 50 Ohms. Because the output of the low noise amplifier 108 is typically lower than required to activate the transistor Q1 of the power amplifier, conventional matching techniques are understood to be sufficient.

Figure 22:
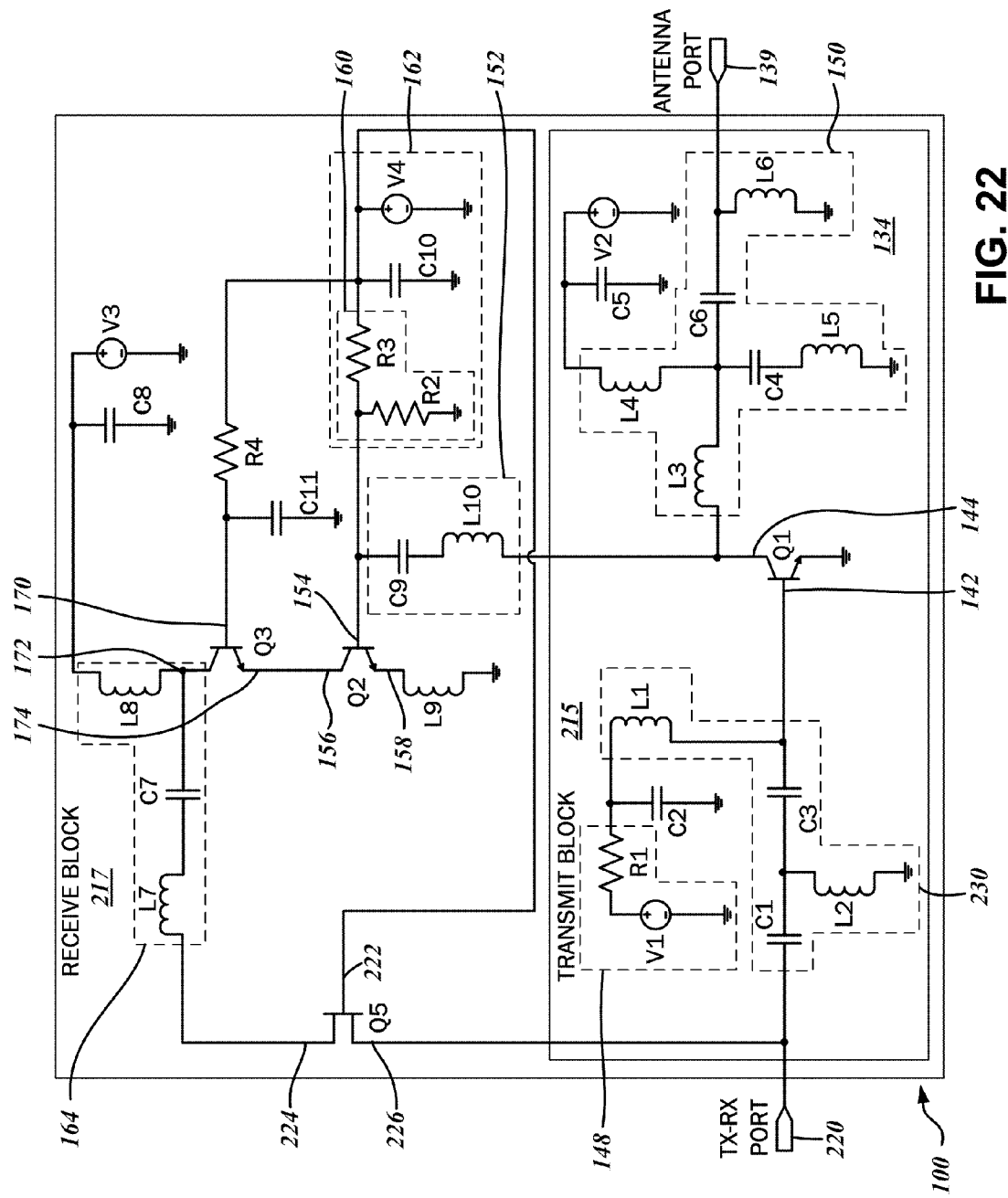
FIG. 22 is a schematic diagram of a tenth embodiment of the front end circuit configured for the single transmit-receive port transceiver and including the low noise amplifier switching transistor operating with the cascode transistor switch.

Referring to the circuit schematic of FIG. 22, there is contemplated a tenth embodiment of the front end circuit 100, which is suitable for use in connection with the transceiver 104 having a common transmit/receive line 116. This front end circuit 100 is generally defined by a transmit block 215 and a receive block 217, both of which share the components of the other, including the common transceiver port 220 that is connectible to the common transmit/receive line 116 and the antenna port 139 for coupling the front end circuit 100 to the antenna 102.

The features of the transmit block 215 are substantially similar to the embodiments of the front end circuit 100 previously described, and includes the single-stage power amplifier 106 with the transistor Q1 in a common emitter configuration. However, there are a number of variations as will be detailed more fully below. It is understood that multi-stage amplifiers may also be utilized for higher gain applications.

The power amplifier 106 includes a power amplifier input matching network 230, which is understood to match the common transceiver port 220 to the base 142 of the transistor Q1 while it is being turned on and off in the predefined operating frequency range. More particularly, the capacitor C1 is connected to the common transceiver port 220, and the inductor L2 is connected to the capacitor C1. Also connected to the capacitor C1 and the inductor L2 is the capacitor C3, which in turn is connected to the base 142 of the transistor Q1. Furthermore, the inductor L1 is connected to the base 142 of the transistor Q2, which is connected to the adjustable voltage source V1. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 215, via the collector 144 of the transistor Q1, is connected the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 216, including the low noise amplifier input matching segment 152 of the matching network 118, is disconnected.

The receive block 217 includes the transistor Q2, likewise in a common-emitter configuration. The matching network 118 includes the low noise amplifier input matching segment 152 that is combined in part with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

In further detail, the low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3.

The collector 172 of the transistor Q3 is connected to the low noise amplifier output matching network 164. The output of the low noise amplifier output matching network 164, in turn, is connected to a source 224 of the transistor Q5, which in one exemplary embodiment is a field effect transistor such as MOSFET. However, other types of transistor structures including bipolar technology may be readily substituted. The adjustable voltage source V4 is connected to a gate 222 of the transistor Q5, with its drain 226 being connected to the common transceiver port 220. As will be described more fully below, the transistor Q5 is operating as an RF switch.

When the transistors Q2 and Q3 are turned off by the second control circuit 162, so is the transistor Q5. In this state, the transistor Q5 is understood to have a high impedance of at least 1 k Ohm, so the power amplifier input matching network 140 is not influenced by the low noise amplifier 108.

When the transistor Q1 is turned off, and the low noise amplifier 108 including the transistors Q2, Q3, and Q5 are activated, the base 142 of the transistor is understood to have a high impedance of at least 1 k Ohm. Accordingly, the rest of the circuitry connected is likewise not influenced by the power amplifier 106. Furthermore, with the low noise amplifier 108 activated, the low noise amplifier output matching network 164 including inductors L7 and L8, the capacitor C7, and the impedance of the open transistor Q5, as well as the power amplifier input matching network 140 including the capacitors C1 and C3 and the inductors L1 and L2 are configured to match the impedance of the common transceiver port 220 at the predefined operating frequency. This impedance is typically 50 Ohms. Because the output of the low noise amplifier 108 is typically lower than required to activate the transistor Q1 of the power amplifier, conventional matching techniques are understood to be sufficient.

Figure 23:
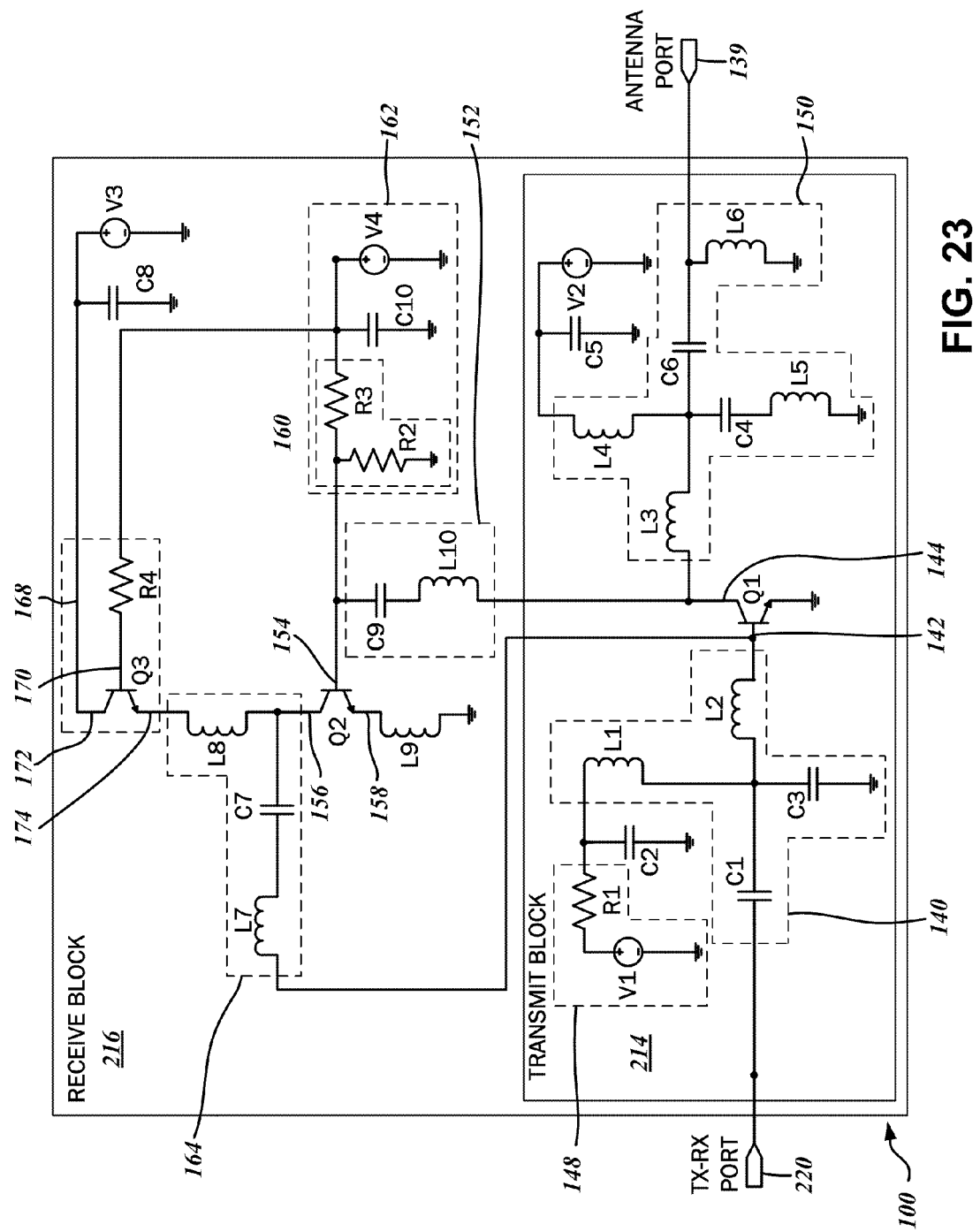
FIG. 23 is a schematic diagram of an eleventh embodiment of the front end circuit configured for the single transmit-receive port transceiver.

FIG. 23 is a circuit schematic of an eleventh embodiment of the front end circuit 100 that is suitable for use in connection with the transceiver 104 having the common transmit/receive line 116. This front end circuit 100 is generally defined by the transmit block 214 and the receive block 216, both of which share components of the other, including a common transceiver port 220 that is connectible to the common transmit/receive line 116 and an antenna port 139 for coupling the front end circuit 100 to the antenna 102.

The components of the transmit block 214 are substantially similar to that of the various embodiments of the front end circuit 100 described above, in particular, the second embodiment shown in FIG. 13. There is a single-stage power amplifier 106 with the transistor Q1 in a common emitter configuration. It is understood that multi-stage amplifiers may also be utilized for higher gain applications.

The power amplifier 106 includes the power amplifier input matching network 140, which is understood to match the common transceiver port 220 to the base 142 of the transistor Q1 while it is being turned on and off in the pre-defined operating frequency range. The power amplifier input matching network 140 may be variously configured according to gain, linearity, and wideband operation requirements. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 214, via the collector 144 of the transistor Q1, is connected the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 216, including the low noise amplifier input matching segment 152 of the matching network 118, is disconnected.

The receive block 216 includes the transistor Q2, likewise in a common-emitter configuration, and is connected to the matching network 118. The matching network 118 includes the low noise amplifier input matching segment 152 that is combined in part with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

The adjustable voltage source V4, which is connected to the base 154 of the transistor Q2, is also connected to the direct current bias switch 168. As described above, the variable voltage generated intermittently by the transceiver 104 on the general-purpose input/output line 114 is understood to activate and deactivate the transistor Q2. The present embodiment contemplates activating and deactivating the direct current bias switch 168 with the low noise amplifier 108 via the second control circuit 162 as in the illustrated embodiment, or independently.

The collector 156 of the transistor Q2 is connected to the low noise amplifier output matching network 164. The output of the low noise amplifier output matching network 164, in turn, is connected to the base 142 of the transistor Q1 and the power amplifier input matching network 140. When the transistors Q2 and Q3 are deactivated, the low noise amplifier output matching network 164 is understood not to influence the impedance at the base 142 of the transistor Q1, as such transistors have a high impedance in this state. When the transistor Q1 is deactivated, it is understood to have a high impedance of at least 1 k Ohm, so there is minimal influence on the other parts of the circuit, in particular, the low noise amplifier 108. The low noise amplifier output matching network 164 including the inductors L7 and L8, the capacitor C7, as well as the power amplifier input matching network 140 including the capacitors C1 and C3 and the inductors L1 and L2 are configured to match the impedance of the common transceiver port 220, which is typically 50 Ohms, at the pre-defined operating frequency. A variety of configurations with respect to the low noise amplifier output matching network 164 are possible depending upon the gain, noise figure, linearity, and wide-band operation requirements.

It is contemplated that in order to achieve high linear power at the common transceiver port 220 when the low noise amplifier 108 is active, the voltage swing at the base-emitter junction of the transistor Q1 is minimized. A large emitter area for the transistor Q1 is one solution, which results in low active resistance required for transmit mode operation. The power amplifier input matching network 140 thus transforms the 50 Ohm impedance of the common transceiver port 220 to a low resistance point at the base 142 of the transistor Q1. Generally, the configuration of the low noise amplifier output matching network 164 based upon synthesizing impedance transformation from the collector 156 of the transistor Q2 to a pre-defined value at the base 142 of the transistor Q1.

Figure 24:
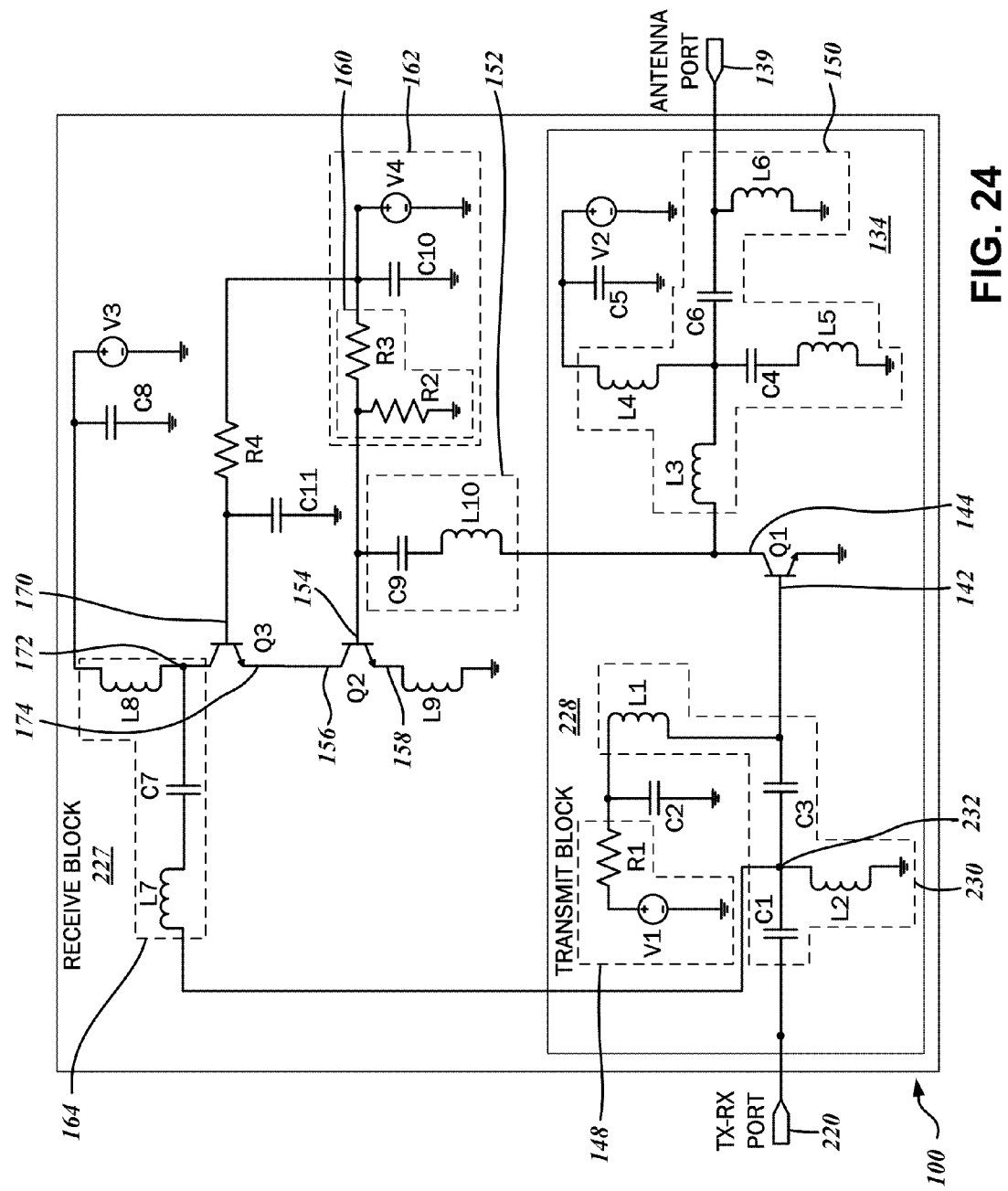
FIG. 24 is a schematic diagram of a twelfth embodiment of the front end circuit configured for the single transmit-receive port transceiver.

FIG. 24 is a circuit schematic of a twelfth embodiment of the front end circuit 100 that is suitable for use in connection with the transceiver 104 having the common transmit/receive line 116. This front end circuit 100 is generally defined by a transmit block 228 and a receive block 227, both of which share components of the other, including the common transceiver port 220 that is connectible to the common transmit/receive line 116 and the antenna port 139 for coupling the front end circuit 100 to the antenna 102.

The components of the transmit block 228 are substantially similar to that of the various embodiments of the front end circuit 100 described above. There is a single-stage power amplifier 106 with the transistor Q1 in a common emitter configuration. It is understood that multi-stage amplifiers may also be utilized for higher gain applications.

The power amplifier 106 includes the power amplifier input matching network 230, which is understood to match the common transceiver port 220 to the base 142 of the transistor Q1 while it is being turned on and off in the pre-defined operating frequency range. More particularly, the capacitor C1 is connected to the common transceiver port 220, and the inductor L2 is connected to the capacitor C1 at a common point 232. Also connected to the common point 232 is the capacitor C3, which in turn is connected to the base 142 of the transistor Q1. Furthermore, the inductor L1 is connected to the base 142 of the transistor Q2, which is connected to the adjustable voltage source V1. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 228, via the collector 144 of the transistor Q1, is connected the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 217, including the low noise amplifier input matching segment 152 of the matching network 118, is disconnected.

The receive block 227 includes the transistor Q2, likewise in a common-emitter configuration, and is connected to the matching network 118. The matching network 118 includes the low noise amplifier input matching segment 152 that is combined in part with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

In further detail, the low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3.

The collector 172 of the transistor Q3 is connected to the low noise amplifier output matching network 164. The output of the low noise amplifier output matching network 164, in turn, is connected to common point 232. When the transistors Q2 and Q3 are deactivated, the low noise amplifier output matching network 164 is configured not to influence the impedance at the base 142 of the transistor Q1. Although such transistors have high impedance when deactivated, the collector 172 of the transistor Q3 is not an open. When the transistor Q1 is deactivated, it is understood to have a high impedance of at least 1 k Ohm, so there is minimal influence on the other parts of the circuit, in particular, the low noise amplifier 108.

The low noise amplifier output matching network 164 including the inductors L7 and L8, the capacitor C7, as well as the power amplifier input matching network 140 including the capacitors C1 and C3 and the inductors L1 and L2 are configured to match the impedance of the common transceiver port 220, which is typically 50 Ohms, at the predefined operating frequency. A variety of configurations with respect to the low noise amplifier output matching network 164 are possible depending upon the gain, noise figure, linearity, and wide-band operation requirements.

One particular embodiment envisions the inductor L1 being selected such that the module of its reactive impedance is approximately 5 to 10 times the module of the base-emitter impedance of the transistor Q1 when deactivated and in the predefined operating frequency. The inductor L1 may also be selected such that its reactive impedance is approximately 3 times higher or 3 times lower than the reactive impedance of the transistor Q1 base-emitter capacitance when the transistor Q2 is deactivated. Further, the capacitance C3 may be selected to avoid resonance with the inductor L1 in the predefined operating frequency range. It is understood that a minimized value of the capacitor C3 results in a capacitive voltage divider at the base 142 of the transistor Q1 when deactivated.

Additionally, it is contemplated that the low noise amplifier output matching network 164, that is, the inductors L7 and L8 and the capacitor C7, overall impedance is configured to match the overall impedance of the series chain of the inductor L1 and the capacitor C3 in the predefined operating frequency. In this regard, the deactivated transistor Q1 has a miniscule influence on the performance characteristics of the activated low noise amplifier 108 for high power signals. Relatedly, the inductors L7 and L8, and the capacitor C7 may have values that its overall impedance is 3 to 5 times higher than an overall impedance above the common point 232.

Figure 25:
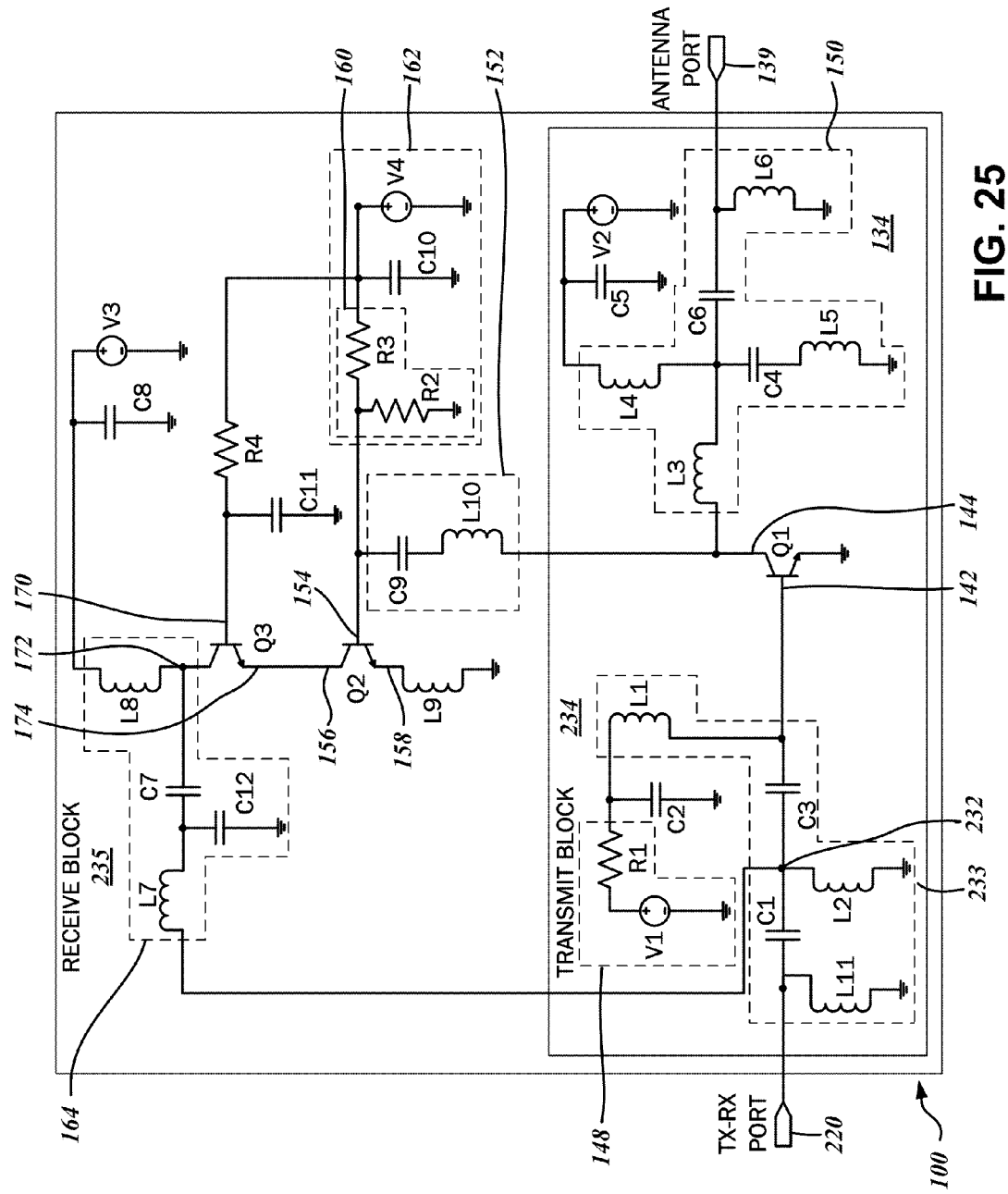
FIG. 25 is a schematic diagram of a thirteenth embodiment of the front end circuit configured for the single transmit-receive port transceiver.

FIG. 25 is a circuit schematic of a thirteenth embodiment of the front end circuit 100 that is suitable for use in connection with the transceiver 104 having the common transmit/receive line 116. This front end circuit 100 is generally defined by a transmit block 234 and a receive block 235, both of which share components of the other, including the common transceiver port 220 that is connectible to the common transmit/receive line 116 and the antenna port 139 for coupling the front end circuit 100 to the antenna 102.

The components of the transmit block 234 are substantially similar to that of the various embodiments of the front end circuit 100 described above. There is a single-stage power amplifier 106 with the transistor Q1 in a common emitter configuration. It is understood that multi-stage amplifiers may also be utilized for higher gain applications.

The power amplifier 106 includes a power amplifier input matching network 233, which is understood to match the common transceiver port 2220 to the base 142 of the transistor Q1 while it is being turned on and off in the predefined operating frequency range. More particularly, the capacitor C1 is connected to the common transceiver port 220, and the inductor L2 is connected to the capacitor C1 at a common point 232. Also connected to the common point 232 is the capacitor C3, which in turn is connected to the base 142 of the transistor Q1. Furthermore, the inductor L1 is connected to the base 142 of the transistor Q2, which is connected to the adjustable voltage source V1. The adjustable voltage source V1 sets the bias point of the transistor Q1 of the power amplifier 106 and defines the first control circuit 148 that is coupled to the general-purpose input/output line 114 of the transceiver 104. A variable voltage may be generated intermittently by the transceiver 104 on the general-purpose input/output line 114 to activate and deactivate the transistor Q1.

The transmit block 234, via the collector 144 of the transistor Q1, is connected the matching network 118. The matching network 118 is defined at least in part by the power amplifier output matching segment 150, which impedance matches the transistor Q1 to the antenna 102 at the predefined operating frequency when active. The power amplifier output matching segment 150 is configured such that the impedance at the collector 144 of the transistor Q1 is equal or below the resistive component of an output impedance or transistor load impedance required for the activated transistor Q1 that corresponds to the P1 dB at a specific bias voltage. The power amplifier output matching segment 150 is loaded at the antenna side by a predefined load while the receive block 216, including the low noise amplifier input matching segment 152 of the matching network 118, is disconnected.

The receive block 235 includes the transistor Q2, likewise in a common-emitter configuration, and is connected to the matching network 118. The matching network 118 includes the low noise amplifier input matching segment 152 that is combined in part with the power amplifier output matching segment 150 to impedance match the low noise amplifier 108 to the antenna 102 when active. The various optimizations relating to the low noise amplifier 108 and the low noise amplifier input matching segment 152 previously discussed are applicable to this embodiment.

In further detail, the low noise amplifier 108 includes the cascode transistor Q3 that is inserted between the bias supply voltage source V3 and the transistor Q2. The second control circuit 162 is understood to synchronously activate and deactivate the transistors Q2 and Q3 with the variable voltage source V4, which is generated by the transceiver 104 on the general purpose input/output line 114. The voltage source V4 is connected to the base 154 of the transistor Q2 and the base 170 of the transistor Q3.

The collector 172 of the transistor Q3 is connected to the low noise amplifier output matching network 164. The output of the low noise amplifier output matching network 164, in turn, is connected to common point 232. When the transistors Q2 and Q3 are deactivated, the low noise amplifier output matching network 164 is configured not to influence the impedance at the base 142 of the transistor Q1. Although such transistors have high impedance when deactivated, the collector 172 of the transistor Q3 is not an open. When the transistor Q1 is deactivated, it is understood to have a high impedance of at least 1 k Ohm, so there is minimal influence on the other parts of the circuit, in particular, the low noise amplifier 108.

The low noise amplifier output matching network 164 including the inductors L7 and L8, the capacitors C7 and C12, as well as the power amplifier input matching network 140 including the capacitors C1 and C3 and the inductors L1 and L2 are configured to match the impedance of the common transceiver port 220, which is typically 50 Ohms, at the predefined operating frequency. A variety of configurations with respect to the low noise amplifier output matching network 164 are possible depending upon the gain, noise figure, linearity, and wide-band operation requirements.

In the presently considered embodiment, the low noise amplifier output matching network 164 includes a capacitor C12 connected to the junction between the inductor L7 and the capacitor C7, and tied to ground. Additionally, an inductor L11 is connected to the common transceiver port 220 and tied to ground. It is contemplated that these components are used to tune in-band or out-of-band gain shapes of the power amplifier 106 and the low noise amplifier 108. Moreover, increased flexibility for impedance choices at different points in the circuit is realized. The inductor L11 is also understood to have electrostatic discharge properties, which, as indicated above, eliminate the necessity for ESD clamp circuits.

With further particularity, the inductor L11 is selected to obtain a reactive impedance higher than 50 Ohm, and typically higher than 150 Ohm in the predefined operating frequency. The resistive part of the inductor L11 is selected with a value less than 5 Ohm to provide an adequate direct current connection to ground.

The foregoing disclosure includes a variety of different configurations of the receive blocks, transmit blocks, and matching circuits. It will be appreciated by those having ordinary skill in the art that such blocks may be variously combined with others to achieve different performance characteristics.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention with more particularity than is necessary for the fundamental understanding of the present invention, the description taken with the drawings making apparent to those skilled in the art how the several forms of the present invention may be embodied in practice.

What is claimed is:

1. A front end circuit for coupling an antenna to a radio frequency (RF) transceiver including a transmit line, a receive line, a first enable line, and a second enable line, the front end comprising:
    an antenna port;
    a power amplifier with a signal output, a signal input coupled to the transmit line of the transceiver and a first control circuit coupled to the first enable line of the transceiver, a first voltage applied to the first control circuit activating and setting a bias point of the power amplifier;
    a low noise amplifier with a signal input, a signal output coupled to the receive line of the transceiver and a second control circuit coupled to the second enable line of the transceiver, a second voltage applied to the second control circuit activating and setting a bias point of the low noise amplifier;
    a matching network coupled to the antenna port, the signal output of the power amplifier and the signal input of the low noise amplifier, the signal output of the power amplifier and the signal input of the low noise amplifier being common; and
    a parallel resonant circuit connected between the low noise amplifier and the power amplifier.

2. The front end circuit of claim 1, wherein the parallel resonant circuit is activated in response to the first voltage applied to the first control circuit.

3. The front end circuit of claim 1, wherein the parallel resonant circuit is independently activated.

4. The front end circuit of claim 1, wherein the parallel resonant circuit includes a switching transistor activated in an inverse mode.

5. The front end circuit of claim 1, wherein the power amplifier, the low noise amplifier, and the matching network are fabricated on a single die of silicon substrate.

6. The front end circuit of claim 1, wherein the power amplifier, the low noise amplifier, and the matching network are fabricated on a single die of gallium arsenide (GaAs) substrate.

7. The front end circuit of claim 1, wherein the power amplifier and the low noise amplifier have transistor structures selected from the group consisting of: bipolar junction, hetero-junction bipolar, metal semiconductor field effect, metal oxide semiconductor field effect, and high electron mobility.

8. A radio frequency (RF) transceiver front end circuit with a predefined operating frequency for connecting a transceiver to an antenna, the front end comprising:
    an antenna port connectible to the antenna;
    a transmit port;
    a receive port;
    a low noise amplifier connected to the receive port and including a first low noise amplifier transistor;
    a power amplifier connected to the transmit port and including a first power amplifier transistor having a base coupled to the transmit port, a collector, and an emitter;
    a power amplifier control circuit with a first adjustable voltage source coupled to the base of the first power amplifier transistor, the power amplifier control circuit activating and setting a bias point of the first power amplifier transistor;

a matching circuit including a power amplifier output matching segment coupled to the power amplifier and the antenna port, and a low noise amplifier input matching segment coupled to the first low noise amplifier transistor and the antenna port, the power amplifier matching segment having shared components with the low noise amplifier segment; and a parallel resonant circuit including a switching transistor with a base coupled to the power amplifier control circuit, an emitter coupled to the collector of the power amplifier transistor, and a collector coupled to an intermediate point in the low noise amplifier input matching segment of the matching circuit.

9. The front end circuit of claim 8, wherein the switching transistor is activated in an inverse mode.

10. The front end circuit of claim 8, further comprising:
a direct current blocking element interposed between the collector of the power amplifier transistor and the intermediate point.

11. The front end circuit of claim 8, wherein the parallel resonant circuit resonates at the operating frequency between the collector of the first power amplifier transistor and the intermediate point.

12. The front end circuit of claim 8, wherein the power amplifier control circuit is based upon a voltage supply.

13. The front end circuit of claim 12, further comprising:
a first bias settling resistor coupling the base of the switching transistor to the power amplifier control circuit;
a second bias settling resistor coupling the collector of the switching transistor to a bias supply; and
a third bias settling resistor coupling to the emitter of the switching transistor.

14. The front end circuit of claim 13, wherein the second and third bias settling resistors have a resistance value higher than an impedance between the intermediate point and ground, and between the collector of the first power amplifier transistor and ground at the operating frequency.

15. The front-end circuit of claim 8, wherein the power amplifier control circuit has a current mirror architecture.

16. The front end circuit of claim 8, wherein:
the matching circuit includes a first network segment and a second network segment;
the power amplifier is impedance matched to the antenna with the first network segment; and
the low noise amplifier is impedance matched to the antenna with a combination of the first network segment and the second network segment.

17. The front end circuit of claim 16, wherein components of the second network segment correspond to a substantially minimized noise figure between the antenna and the low noise amplifier signal output.

18. The front end circuit of claim 16, wherein components of the second network segment correspond to a substantially minimized voltage swing at the base of the low noise amplifier transistor.

19. The front end circuit of claim 8, wherein the low noise amplifier and the power amplifier are selectively activated in a substantially exclusive relation to the other.

20. The front end circuit of claim 19 wherein a radio frequency signal generated by the transceiver to the signal input of the front end circuit is amplified and transmitted to the antenna with the power amplifier and the parallel resonant circuit being activated.

21. The front end circuit of claim 19, wherein a radio frequency signal received by the antenna to the signal input of the low noise amplifier being amplified and transmitted to the transceiver with low noise amplifier being activated and the parallel resonant circuit being deactivated.

22. The front end circuit of claim 8, wherein the low noise amplifier, the power amplifier and the parallel resonant circuit are simultaneously activated in a diagnostics mode.

23. The front end circuit of claim 8, wherein the power amplifier has a plurality of amplification stages including a plurality of interconnected power amplifier transistors.

24. The front end circuit of claim 8, wherein the low noise amplifier has a plurality of amplification stages including a plurality of interconnected low noise amplifier transistors.

25. The front end circuit of claim 8, wherein the switching transistor has a transistor structure selected from the group consisting of: bipolar junction and heterojunction bipolar.

26. The front end circuit of claim 8, wherein:
the switching transistor has a transistor structure selected from the group consisting of: metal semiconductor field effect, metal oxide semiconductor field effect, and high electron mobility;
the collector of the switching transistor corresponding to a drain;
the emitter of the switching transistor corresponding to a source; and
the base of the switching transistor corresponding to a gate.

27. The front end circuit of claim 26, wherein the switching transistor is forward biased.

* * * * *